(12) United States Patent
Shi et al.

(10) Patent No.: US 6,361,887 B1
(45) Date of Patent: Mar. 26, 2002

(54) ELECTROLUMINESCENT DEVICES HAVING NAPHTHYLANTHRACENE-BASED POLYMERS

(75) Inventors: Jianmin Shi, Webster; Shiying Zheng, Rochester, both of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/421,980

(22) Filed: Oct. 20, 1999

(51) Int. Cl.$^7$ .............................................. H05B 33/14
(52) U.S. Cl. ....................... 428/690; 428/917; 428/704; 313/504; 313/506
(58) Field of Search ................................ 428/690, 917, 428/704; 313/504, 506

(56) References Cited

U.S. PATENT DOCUMENTS

| | | | |
|---|---|---|---|
| 4,356,429 A | 10/1982 | Tang ........................... | 313/503 |
| 4,769,292 A | 9/1988 | Tang et al. .................. | 428/690 |
| 5,429,884 A | 7/1995 | Namiki et al. ............... | 428/690 |
| 5,770,070 A | 7/1998 | Inbasekaran et al. ........ | 528/394 |
| 5,776,622 A | 7/1998 | Hung et al. .................. | 428/690 |
| 5,935,721 A | 8/1999 | Shi et al. ..................... | 428/690 |

FOREIGN PATENT DOCUMENTS

WO            94/29883            12/1994

OTHER PUBLICATIONS

Burroughes et al, Light–emitting diodes based on conjugated polymers, Nature, vo. 347, Oct. 11, 1990, pp. 539–541.

Sheats et al, Organic Electroluminescent Devices, Science, vol. 273, Aug. 16, 1996, pp. 884–888.

Berggren et al, Light–emitting diodes with variable colours from polymer blends, Nature, vol. 372, Dec. 1, 1994, pp. 444–446.

Aguiar et al, Light–Emitting Polymers with Pendant Chromophoric Groups, Macromolecules 1995, 28, pp. 4598–4602, No date.

Andersson et al, Electroluminescence from Substituted Poly(thiophenes): From Blue to Near Infrared, Macromolecules 1995, 28, pp. 7525–7529, No date.

Hilberger et al, Synthesis and Characterization of a New Efficient Blue–Light–Emitting Copolymer, Macromolecules 1995, 28, pp. 4525–4529, No date.

Miyaura et al, Palladium–Catalyzed Cross–Coupling Reactions of Organoboron Compounds, Chem. Rev. 95, 1995, pp. 2457–2483, No date.

Miyaura et al, The Palladium–Catalyzed Cross–Coupling Reaction of Phenylboronic Acid with Haloarenes in the Presence of Bases, Synthetic Communications, 11(7), 1981, pp. 513–519, No date.

Ranger et al, New Well–Defined Poly(2,7–fluorene) Derivatives: Photoluminescence and Base Doping, Macromolecules, 1997, 30, pp. 7686–7691, No date.

Kim et al, Water–Soluble Photo– and Electroluminescent Alkoxy–Sulfonated Poly(p–phenylenes) Synthesized via Palladium Catalysis, Macromolecules, 1998, 31, pp. 964–974, No date.

Ng et al, Quinoxaline–based conjugated polymers containing ruthenium (II) bipyridine metal complex, Macromol. Rapid Commun, 18, 1997, pp. 1009–1016, No date.

*Primary Examiner*—Cynthia H. Kelly
*Assistant Examiner*—Ling Xu
(74) *Attorney, Agent, or Firm*—Raymond L. Owens

(57) ABSTRACT

An electroluminescent device comprises an anode, a cathode, and polymer luminescent materials disposed between the anode and cathode, the polymeric luminescent materials includes 9,10-di-(2-naphthyl)anthracene-based polymers of the following formula:

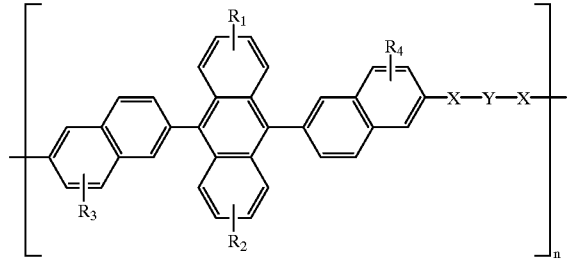

wherein:

R, $R_1$, $R_2$, $R_3$, and $R_4$ are each individually hydrogen, or alkyl, or alkoxy of from 1 to 24 carbon atoms; aryl or substituted aryl of from 6 to 28 carbon atoms; or heteroaryl or substituted heteroaryl of from 4 to 40 carbons; or F, Cl, or Br; or a cyano group; or a nitro group;

X is a linking group; and

Y includes one or more comonomer units that are a substituted or unsubstituted alkyl, alkenyl aryl, or heteroaryl or a conjugated group.

23 Claims, 3 Drawing Sheets

ELECTROLUMINESCENT DEVICES HAVING NAPHTHYLANTHRACENE-BASED POLYMERS

FIELD OF THE INVENTION

The present invention relates to electroluminescent (EL) devices. More specifically, naphthylanthracene-based polymers used as luminescent materials in polymer EL devices.

BACKGROUND OF THE INVENTION

Electroluminescent devices are opto-electronic devices where light emission is produced in response to an electrical current through the device. The physical model for EL is the radiative recombination of electrons and holes. The term light emitting diode (LED) is commonly used to describe an EL device where the current-voltage behavior is non-linear, meaning that the current through the EL device is dependent on the polarity of the voltage applied to the EL device. Both organic and inorganic materials have been used for the fabrication of LEDs. Inorganic materials such as ZnS/Sn, Ga/Bs, Ga/As have been used in semiconductor lasers, small area displays, LED lamps, etc. However, the drawbacks of inorganic materials include difficulties to process and to obtain large surface areas and efficient blue light.

Organic polymers used as light-emitting materials in EL devices offer several advantages over inorganic materials, such as simpler manufacturing, low operating voltages, the possibility of producing large area and full-color displays. Conjugated polymers such as poly(phenylvinylene) (PPV) were first introduced as EL materials by Burroughes et al in 1990 (Burroughes, J. H. *Nature* 1990, 347, 539–41). Considerable progress has been made since then to improve the stability, efficiency, and durability of polymeric LEDs (Sheats, J. R. et al *Science* 1996, 273, 884–888; Berggren, M. et al *Nature* 1994, 372, 444–6; Holmes, A. B. et al WO 94/29883 (1994); and Spreitzer, et al, *Adv. Mater.* 1998, 10(16), 1340). Polymers with wide energy bandgap to emit blue light are important materials because stable, efficient blue-light-emitting materials with high brightness are desirable for full color EL display applications. With these primary materials, it is possible to produce other colors by a downhill energy transfer process. For instance, a green or red EL emission can be obtained by doping a blue EL host material with a small amount of green or red luminescent material.

Incorporating non-conjugated spacer groups into a conjugated polymer backbone is an effective approach to break conjugation thus increasing energy bandgap in order to emit blue light. These spacer groups usually prevent the extended conjugation and contribute to the solubility and film-forming properties of the polymer. Blue-light-emitting PPV (Aguiar, M et al *Macromolecules* 1995, 28, 4598–602), polythiophene (Andersson, M. R. et al *Macromolecules* 1995, 28, 7525–9), and PPP (Hilberer, A et al *Macromolecules* 1995, 28, 4525–9) have been prepared by this approach. However, such spacer group can act as a barrier to the injection and mobility of the charge carriers which leads to high threshold voltages and operating voltages. Thus, it is desirable to develop processable new blue-light-emitting polymers with low driving voltages for full color display.

SUMMARY OF THE INVENTION

It is an object of the present invention to provide wide energy bandgap luminescent polymeric materials useful for polymer EL devices.

It is a further object of the present invention to provide wide energy bandgap luminescent polymers which emit blue light.

These objects are achieved in an electroluminescent device comprises an anode, a cathode, and polymer luminescent materials disposed between the anode and cathode, the polymeric luminescent materials includes 9,10-di-(2-naphthyl)anthracene-based polymers of formula (I).

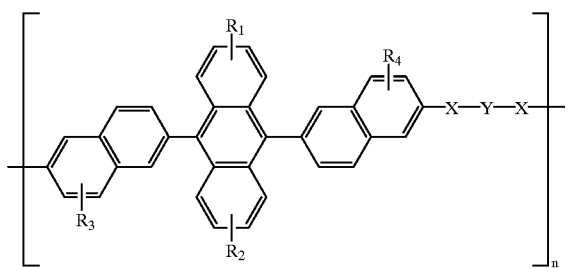

wherein:
R, $R_1$, $R_2$, $R_3$, and $R_4$ are each individually hydrogen, or alkyl, or alkoxy of from 1 to 24 carbon atoms; aryl or substituted aryl of from 6 to 28 carbon atoms; or heteroaryl or substituted heteroaryl of from 4 to 40 carbons; or F, Cl, or Br; or a cyano group; or a nitro group;

X is a linking group; and

Y includes one or more comonomer units that are a substituted or unsubstituted alkyl, alkenyl, aryl, or heteroaryl or a conjugated group.

The present invention provides polymeric luminescent materials with a number of advantages which include good solubility and better thermal stability. With the primary wide energy bandgap chromophore, 9,10-di-(2-naphthyl) anthracene, other color emitting luminescent copolymers can be easily designed and produced by introducing the narrow energy bandgap chromorphores into the polymeric chain.

DETAILED DESCRIPTION OF THE INVENTION

Figure 1:
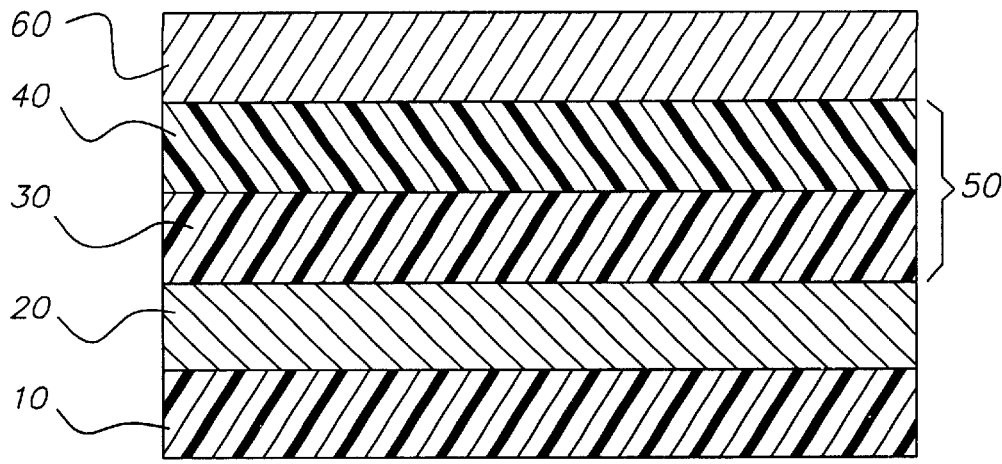
FIG. 1 illustrates in cross-section a bi-layer EL device which can use a polymer in accordance with the present invention.

The present invention provides light-emitting polymers containing 9,10-di-(2-naphthyl)anthracene with good solubility and thermal stability as shown in formula I. The chromophore 9,10-di-(2-naphthyl)anthracene has been shown to be particularly useful for the fabrication of efficient and stable EL devices as disclosed in commonly-assigned U.S. Pat. No. 5,935,721 by Shi et al. Furthermore, 9,10-di-(2-naphthyl)anthracene chromophore has a wide energy bandgap. The energy bandgap is the energy difference between the energy level of the highest occupied molecular orbital (HOMO) and the lowest unoccupied molecular orbital (LUMO). Incorporation of the second comonomer unit Y can serve several purposes:

(1) to further improve solubility of the polymer;

(2) to improve electron or hole transporting ability; and (3) to tune the emissive color of the polymer.

Therefore, the second comonomer unit Y can be the groups to improve solubility, or electron or hole transporting mobility, or emissive moiety with narrow energy bandgap. The green- or red-light-emitting polymer can be obtained through intramolecular energy downhill transfer.

The polymer shown in formula I is a polymer containing a 9,10-di(2-naphthy)anthracene, wherein:

$R_1$, $R_2$, $R_3$, and $R_4$ are each individually hydrogen, or alkyl or alkoxy containing 1 to 24 carbon atoms; aryl or substituted aryl of containing 6 to 28 carbon atoms; or heteroaryl or substituted heteroaryl containing 4 to 40 carbons; or F, Cl, or Br; or a cyano group; or a nitro group. For example, $R_1$, $R_2$, $R_3$, and $R_4$ may represent hydrogen, methyl, ethyl, propyl, isopropyl, butyl, isobutyl, tbutyl, pentyl, hexyl, ethylhexyl, heptyl, octyl, nonyl, decyl, dodecyl, hexadecyl, cyclohexyl, cyclopentyl, methoxy, ethoxy, butoxy, hexyloxy, ethylhexyloxy, methoxyethoxyethyl, methoxyethyloxyethoxyethyl, phenyl, tolyl, nathphyl, xylene, anthracene, phenanthrene, phenylmethylenephenyl, benzyl, phenoxy, pyridyl, thiophenyl. Preferably, $R_1$, $R_2$, $R_3$, and $R_4$ are hydrogen, t-butyl, phenyl, 2-ethylhexyloxy, or 4-methoxypheny.

X represents a linking group and include but not limited to the following groups:

Group I

X is a carbon-carbon bond linking group:

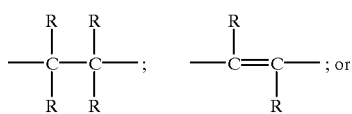

—C≡C— wherein R is hydrogen, or alkyl group containing 1 to 24 carbon atoms; aryl or substituted aryl of containing 6 to 28 carbon atoms; or heteroaryl or substituted heteroaryl containing 4 to 40 carbons; or F, Cl, or Br; or a cyano group;

Group II

X is an ether or thioether linking group:

or

Group III

X is an ester linking group:

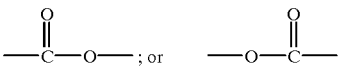

Group IV

X is an anhydride linking group:

Group V

X is a carbonate linking group:

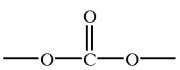

Group VI

X is a sulfone or sulfine linking group:

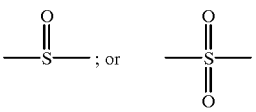

Group VII

X is an amine linking group:

wherein R is hydrogen, or alkyl group containing 1 to 24 carbon atoms; aryl or substituted aryl of containing 6 to 28 carbon atoms; or heteroaryl or substituted heteroaryl containing 4 to 40 carbons;

Group VIII

X is an amide linking group:

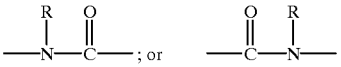

wherein R is hydrogen, or alkyl group containing 1 to 24 carbon atoms; aryl or substituted aryl of containing 6 to 28 carbon atoms; or heteroaryl or substituted heteroaryl containing 4 to 40 carbons;

Group IX

X is a urea linking group:

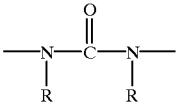

wherein R is hydrogen, or alkyl group containing 1 to 24 carbon atoms; aryl or substituted aryl of containing 6 to 28 carbon atoms; or heteroaryl or substituted heteroaryl containing 4 to 40 carbons;

Group IX

X is an aryl linking group:

wherein Ar is an aryl or substituted aryl group containing 6 to 28 carbon atoms; or heteroaryl or substituted heteroaryl containing 4 to 40 carbons; n is an integer of from 1 to 6.

Y represents one or more second comonomer unit, and is a substituted or unsubstituted alkyl, alkenyl aryl, heteroaryl or other conjugated groups. When more than one group is included the groups can be different.

Alkyl groups contain 1 to 28 carbon atoms;

Substituted or unsubstituted aryl groups contain 6–28 carbon atoms which include phenyl, biphenyl, naphthyl, anthracene, fluorene, phenanthrene, spirophenyl, perylene, or pyrene groups;

Substituted or unsubstituted heteroaryl groups contain 4–40 carbon atoms which include pyridine, thiophene, pyrrole, bithiophene, furan, benzofuran, benzimidazole, benzoxazole, quinoxaline, phenylquinoline, dipheyloxadizaole, or carbazole;

All the substituents mentioned above include alkyl or alkoxy groups containing 1 to 24 carbon atoms, aryl or substituted aryl containing 6 to 28 carbon atoms; or heteroaryl or substituted heteroaryl containing 4 to 28 carbons; or F, Cl, or Br; or a cyano group; or a nitro group.

Y can be divided into the following groups.

Group I
Y are alkyl groups of formula (II)

$$—R—\qquad(II)$$

wherein:
R contains 1 to 24 carbon atoms, may also contains N, S, F, Cl, or Br, or Si atoms.

The following molecular structures constitute specific examples of alkyl groups

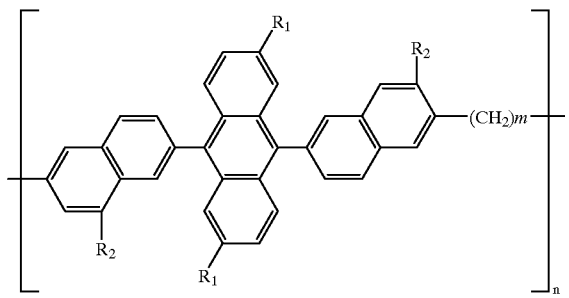

polymer 1 $R_1$=2-ethylhexyloxy, $R_2$=H, m=6
polymer 2 $R_1$=n-hexyl, $R_2$=n-hexyloxy, m=4
polymer 3 $R_1$=t-butyl, $R_2$=n-hexyloxy, m=6

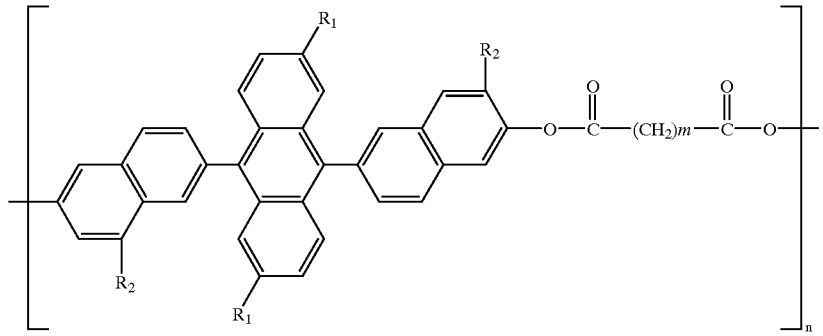

polymer 4 $R_1$=2-ethylhexyloxy, $R_2$=H, m=6
polymer 5 $R_1$=n-hexyl, $R_2$=n-hexyloxy, m=4
polymer 6 $R_1$=t-butyl, $R_2$=n-hexyloxy, m=6
polymer 7 $R_1$=$R_2$=n-hexyl, m=8
polymer 8 $R_1$=$R_2$=H, m=12

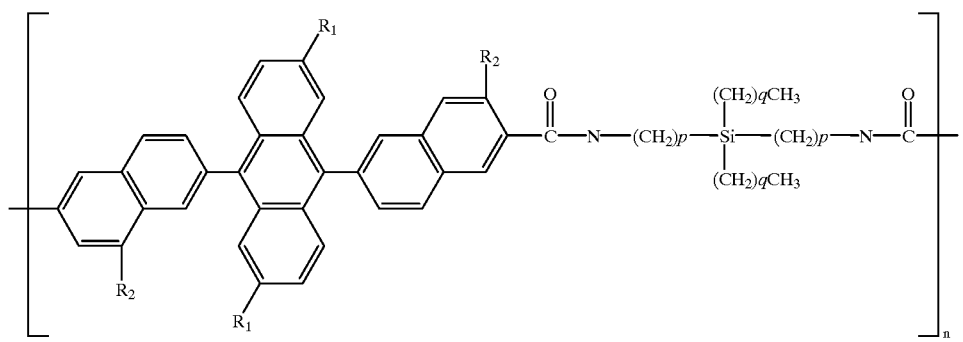

polymer 9 R₁=H, R₂=2-ethylhexyloxy, p=4, q=3
polymer 10 R₁=n-hexyl, R₂=t-butyl, p=4, q=3
polymer 11 R₁=n-hexyl, R₂=t-butyl, p=4, q=5 polymer 20 R₁=2-ethylhexyloxy, R₂=H, p=4, q=3
polymer 21 R₁=t-butyl, R₂=2-ethylhexyl, p=4, q=5

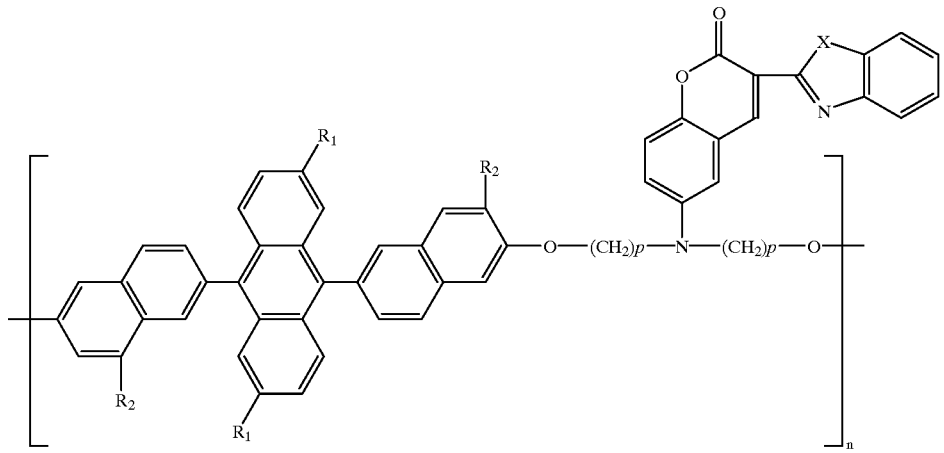

polymer 12 R₁=H, R₂=2-ethylhexyloxy, X=O, p=6
polymer 13 R₁=n-hexyl R₂=2-ethylhexyloxy, X=O, p=4
polymer 14 R₁=2-ethylhexyl, R₂=t-butyl, X=S, p=4
polymer 15 R₁=n-hexyoxy, R₂=t-butyl, X=S, p=4

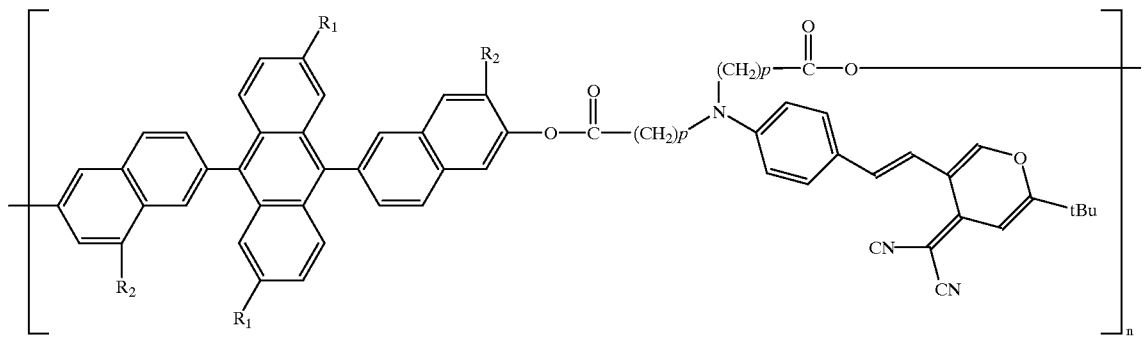

polymer 16 R₁=H, R₂=2-ethylhexyloxy, p=6
polymer 17 R₁=n-hexyl, R₂=2-ethylhexyloxy, p=4
polymer 18 R₁=2-ethylhexyl, R₂=t-butyl, p=4
polymer 19 R₁=2-ethylhexyloxy R₂=H, p=4

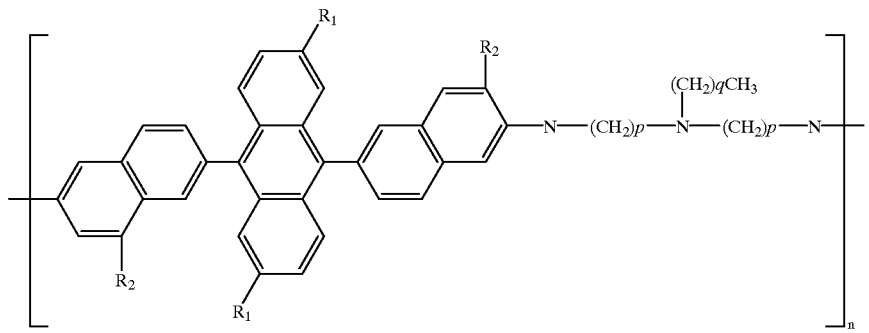

polymer 22 R₁=n-hexyl, R₂=2-ethylhexyloxy, p=4, q=5

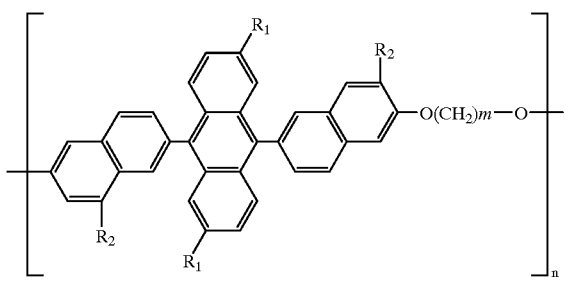

polymer 23 R₁=2-ethylhexyloxy, R₂=H, m=8
polymer 24 R₁=t-butyl, R₂=2-ethylhexyl, m=4
polymer 25 R₁=n-hexyl, R₂=2-ethylhexyloxy, m=2

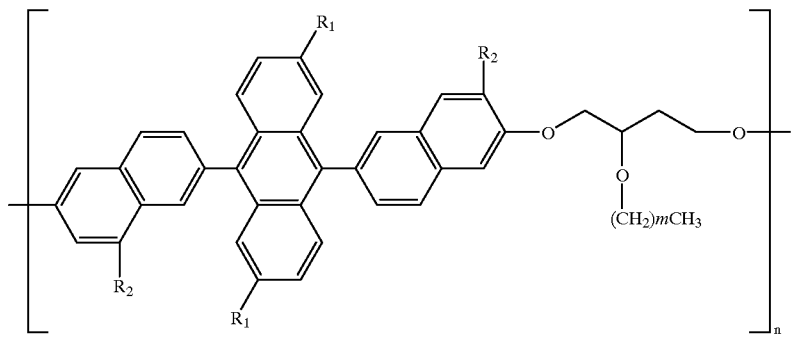

polymer 26 R₁=R₂=H, m=11
polymer 27 R₁=t-butyl, R₂=2-ethylhexyl, m=7
polymer 28 R₁=t-butyl, R₂=H, m=11
polymer 29 R₁=n-hexyl, R₂=2-ethylhexyloxy, m=5 polymer 30 R₁=2-ethylhexyloxy, R₂=H, m=11

Group II

Y are two aryl groups connected by a linking group Z of formula (III):

$$—(Ar_1)—Z—(Ar_2)—  \qquad (III)$$

wherein:

$Ar_1$ and $Ar_2$ are substituted or unsubstituted aromatic groups containing 6–28 carbon atoms, Z is a divalent linking groups containing 0 to 12 carbon atoms, can contain N, Si, O, Cl, F, Br, or S atoms.

The following molecular structures constitute specific examples of above mentioned groups with formula III:

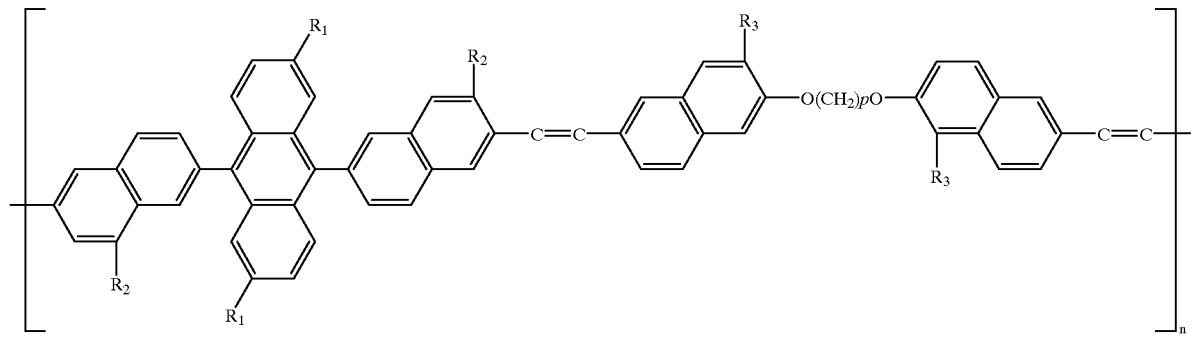

polymer 31 R₁=2-ethylhexyloxy, R₂=R₃=H, p=6
polymer 32 R₁=R₃=H, R₂=2-ethylhexyloxy, p=12
polymer 33 R₁=n-hexyl, R₂=R₃=H, p=12
polymer 34 R₁=t-butyl, R₂=R₃=n-hexyl, p=6

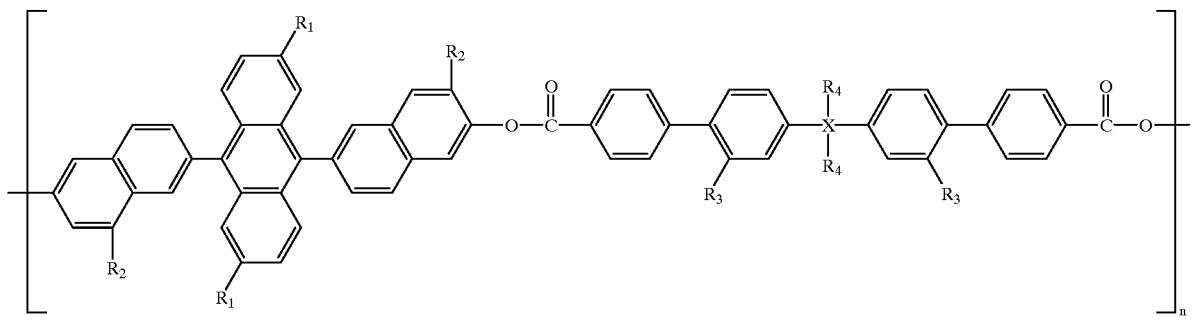

polymer 35 R₁=2-ethylhexyloxy, R₂=R₃=H, R₄=CH₃, X=C
polymer 36 R₁=2-ethylhexyloxy, R₂=R₃=H, R₄=CF₃, X=C
polymer 37 R₁=t-butyl, R₂=2-ethylhexyloxy, R₃=H, R₄=CF₃, X=C
polymer 38 R₁=n-hexyl, R₂=n-hexyloxy, R₃=H, R₄=CF₃, X=C
polymer 39 R₁=t-butyl, R₂=2-ethylhexyloxy, R₃=H, R₄=CF₃, X=Si
polymer 40 R₁=H, R₂=2-ethylhexyloxy, R₃=H, R₄=CF₃, X=Si polymer 41 R₁=2-ethylhexyloxy, R₂=R₃=H, R₄=CH₃, X=C
polymer 42 R₁=2-ethylhexyloxy, R₂=R₃=H, R₄=CF₃, X=C
polymer 43 R₁=t-butyl, R₂=2-ethylhexyloxy, R₃=H, R₄=CF₃, X=Si
polymer 44 R₁=R₂=R₃=H, R₄=CH₃, X=C

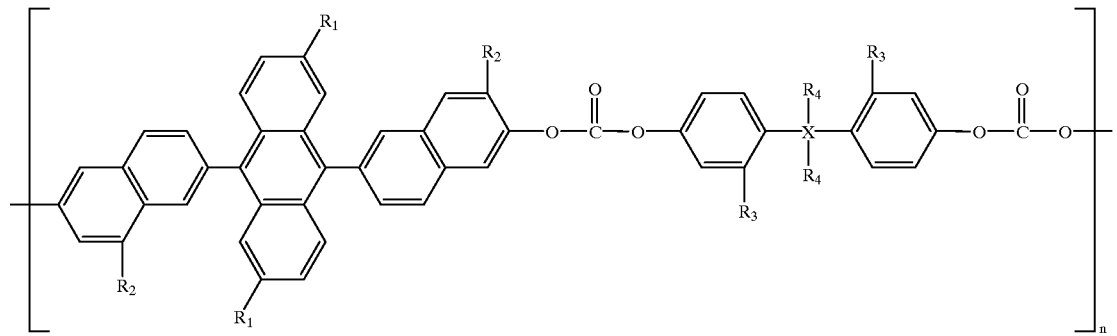

polymer 45 R₁=H, R₂=2-ethylhexyloxy, R₃=H, R₄=CF₃, X=Si

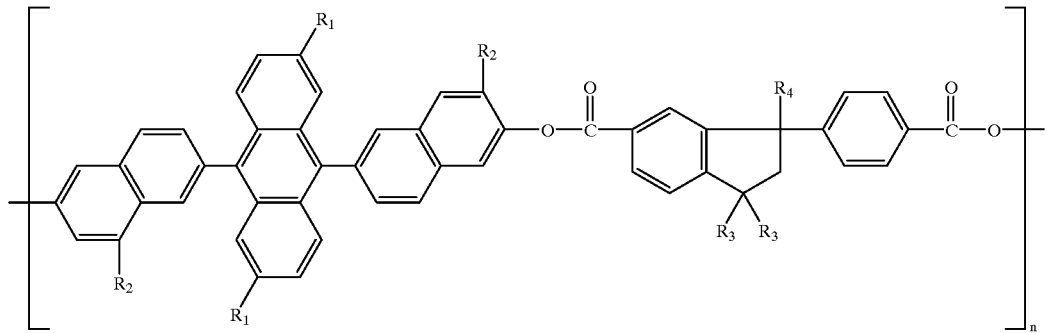

polymer 46 R$_1$=2-ethylhexyloxy, R$_2$=H, R$_3$=R$_4$=CH$_3$
polymer 47 R$_1$=R$_2$=H, R$_3$=R$_4$=CH$_3$
polymer 48 R$_1$=H, R$_2$=2-ethylhexyloxy, R$_3$=n-butyl, R$_4$=CF$_3$

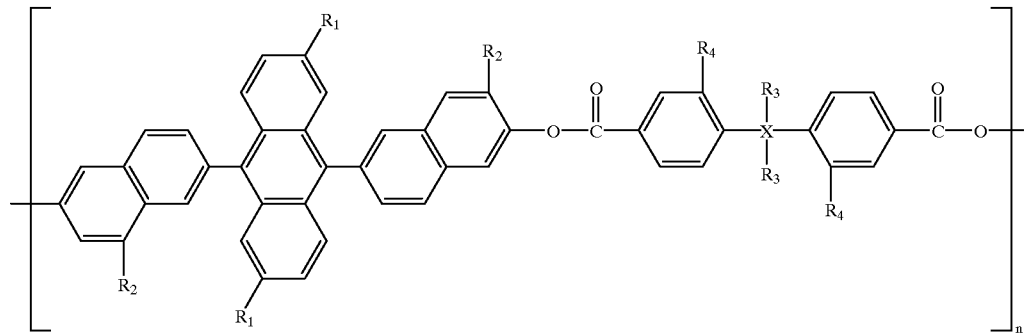

polymer 49 R$_1$=2-ethylhexyloxy, R$_2$=H, R$_3$=CH$_3$, R$_4$=H, X=C
polymer 50 R$_1$=t-butyl, R$_2$=n-hexyloxy, R$_3$=CH$_3$, R$_4$=H, X=C
polymer 51 R$_1$=t-butyl, R$_2$=n-hexyloxy, R$_3$=n-butyl, R$_4$=H, X=Si
polymer 52 R$_1$=R$_2$=R$_4$=H, R$_3$=CF$_3$, X=C
polymer 53 R=H, R$_2$=2-ethylhexyloxy, R$_3$=CH$_3$, R$_4$=n-butyl, X=Si

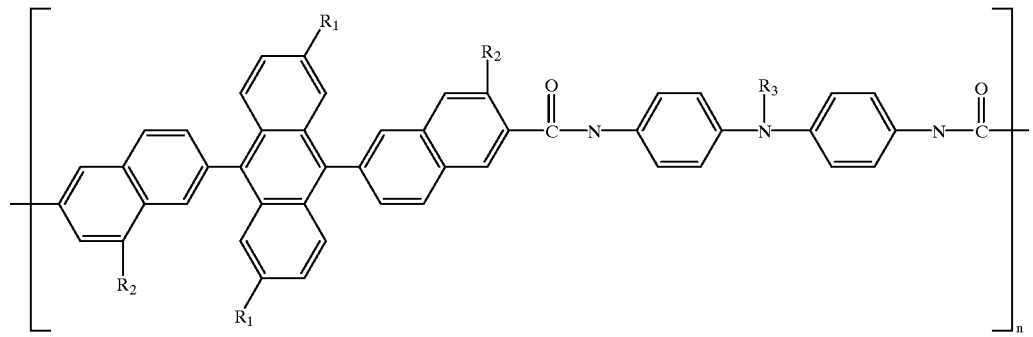

polymer 54 R$_1$2-ethylhexyloxy, R$_2$=n-butyl, R$_3$=phenyl
polymer 55 R$_1$=t-butyl, R$_2$=n-hexyloxy, R$_3$=phenyl polymer 56 R$_1$=2-ethylhexyloxy, R$_2$=H, R$_3$=n-butyl
polymer 57 R$_1$=n-hexyl, R$_2$=2-ethylhexyloxy, R$_3$=phenyl

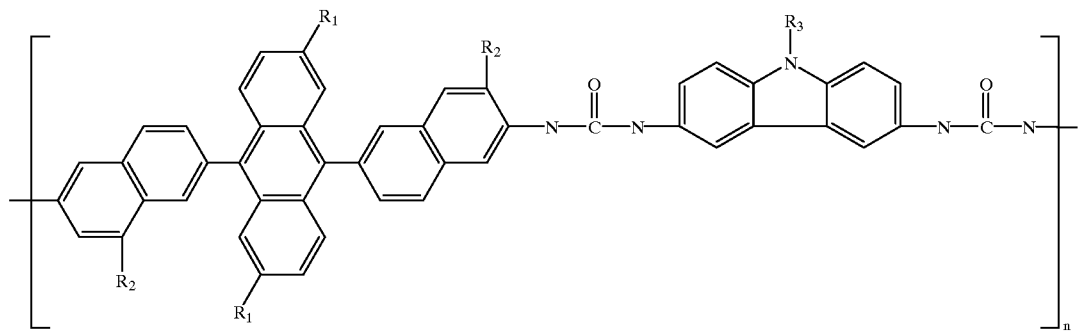

polymer 58 R₁=2-ethylhexyloxy, R₂=H, R₃=n-hexyl
polymer 59 R₁=2-ethylhexyloxy, R₂=H, R₃=n-hexyl
polymer 60 R₁=2-ethylhexyloxy, R₂=H, R₃=n-hexyl
polymer 61 R₁=t-butyl, R₂=H, R₃=2-ethylhexyl
polymer 62 R₁=H, R₂=n-hexyloxy, R₃=n-hexyl
polymer 63 R₁=2-ethylhexyloxy, R₂=H, R₃=4-methyloxyphenyl polymer 68 R₁=2-ethylhexyloxy, R₂=H, R₃=R₄=n-hexyl
polymer 69 R₁=n-hexyl, R₂=H, R₃=R₄=n-hexyl
polymer 70 R₁=t-butyl, R₂=n-hexyl, R₃=R₄=4-methyloxyphenyl

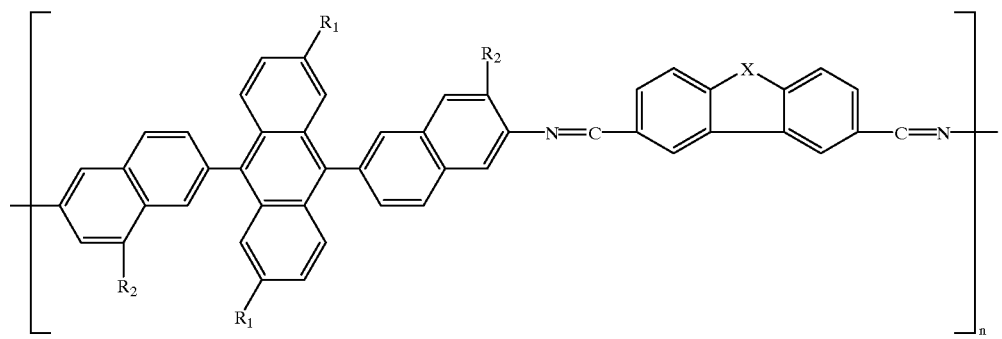

polymer 64 R₁=2-ethylhexyloxy, R₂=H, X=O
polymer 65 R₁=2-ethylhexyloxy, R₂=H, X=S
polymer 66 R₁=t-butyl, R₂=n-hexyloxy, X=O
polymer 67 R₁=2-ethylhexyloxy, R₂=n-hexyl, X=O

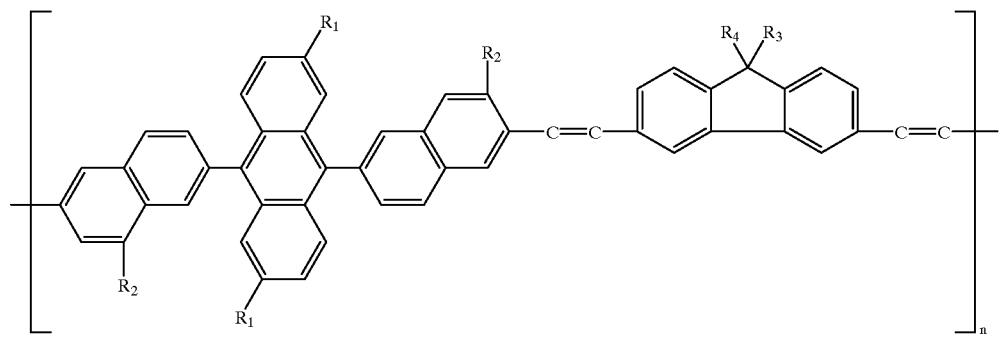

polymer 71 R₁=R₂=n-hexyloxy, R₃=R₄=n-hexyl

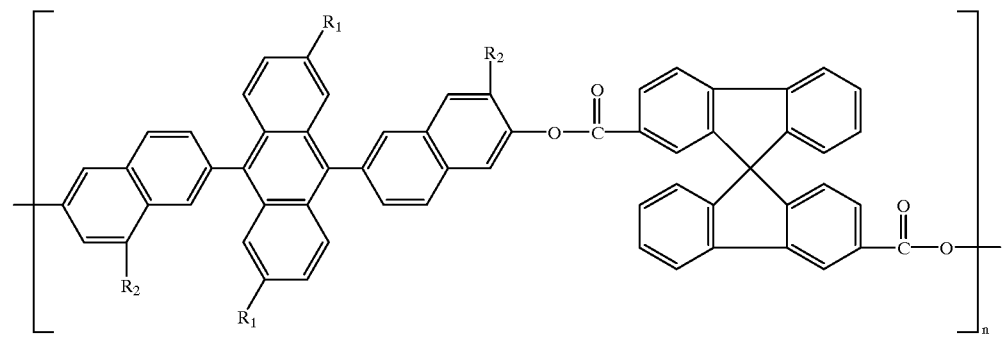

polymer 72 R₁=2-ethylhexyloxy, R₂=H
polymer 73 R₁=t-butyl, R₂=n-hexyloxy
polymer 74 R₁=R₂=n-hexyl
polymer 75 R₁=2-ethylhexyloxy, R₂=t-butyl Group III
Y are aromatic hydrocarbons of formula (IV):

$$-(Ar)-  \quad (IV)$$

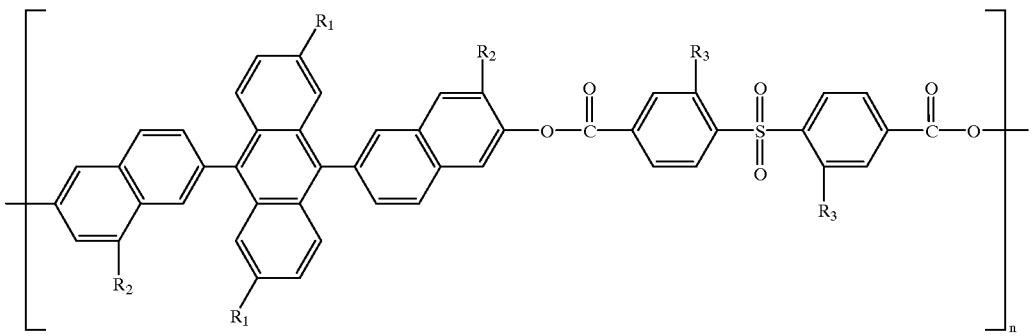

polymer 76 R₁=2-ethylhexyloxy, R₂=R₃=H
polymer 77 R₁=R₂=n-hexyl, R₃=H
polymer 78 R₁=t-butyl, R₂=n-hexyloxy, R₃=H
polymer 79 R₁=t-butyl, R₂=R₃=n-hexyloxy wherein:

Ar is substituted or unsubstituted aryl groups with 6 to 28 carbon atoms.

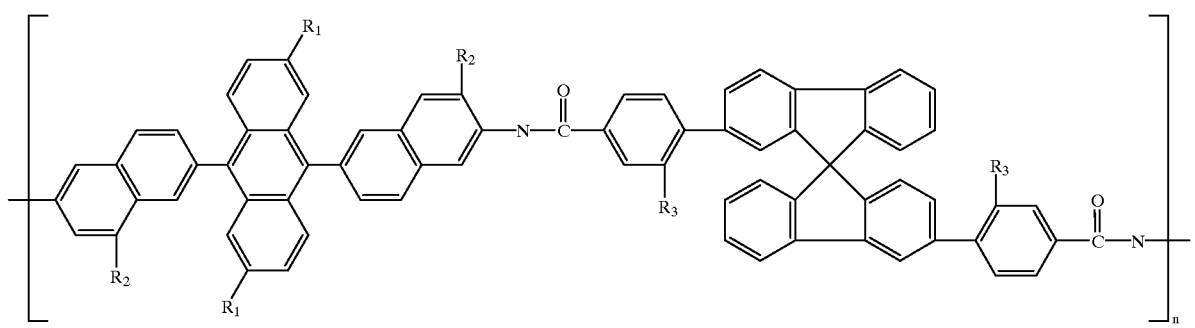

polymer 80 R₁=2-ethylhexyloxy, R₂=R₃=H
polymer 81 R₁=t-butyl, R₂=n-hexyl, R₃=n-hexyloxy The following molecular structures constitute specific examples of above mentioned groups with formula IV:

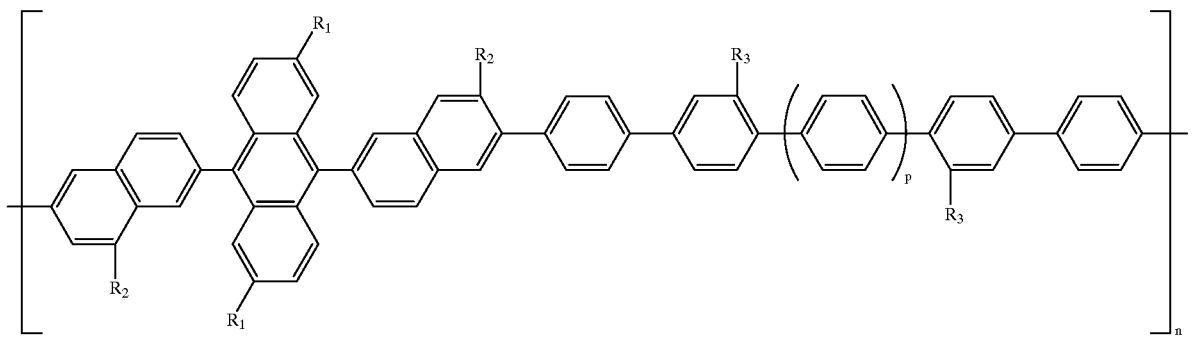

polymer 82 R₁=t-butyl, R₂=n-hexyloxy, R₃=H
polymer 83 R₁=2-ethylhexyloxy, R₂=H, R₃=n-hexyloxy polymer 84 R₁=2-ethylhexyloxy, R₂=R₃=H, p=0
polymer 85 R₁=R₂=n-hexyl, R₃=H, p=1 polymer 86 R₁=t-butyl, R₂=n-hexyloxy, R₃=H, p=2
polymer 87 R₁=t-butyl, R₂=R₃=n-hexyloxy, p=1 polymer 96 R₁=t-butyl, R₂=n-hexyloxy, R₃=R₄=H
polymer 97 R₁=2-ethylhexyl, R₂=R₄=H, R₃=n-hexyloxy

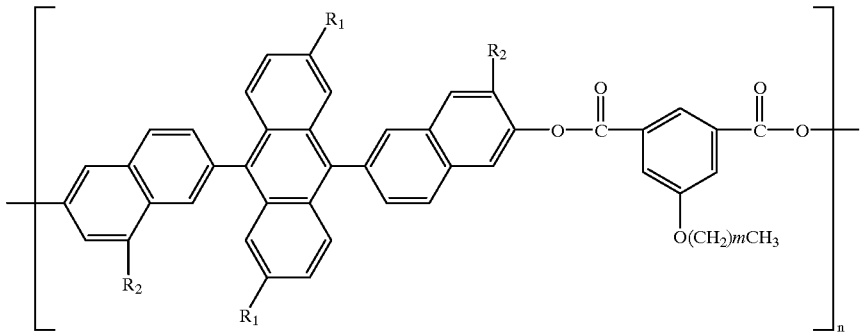

polymer 88 R₁=2-ethylhexyloxy, R₂=H, m=5
polymer 89 R₁=n-hexyl, R₂=H, m=17
polymer 90 R₁=t-butyl, R₂=n-hexyloxy, m=7
polymer 91 R₁=t-butyl, R₂=R₃=n-hexyloxy, m=9 polymer 98 R₁=2-ethylhexyloxy, R₂=R₃=n-hexyloxy, R₄=H
polymer 99 R₁=n-hexyl, R₂=R₃=n-hexyloxy, R₃=R₄=H

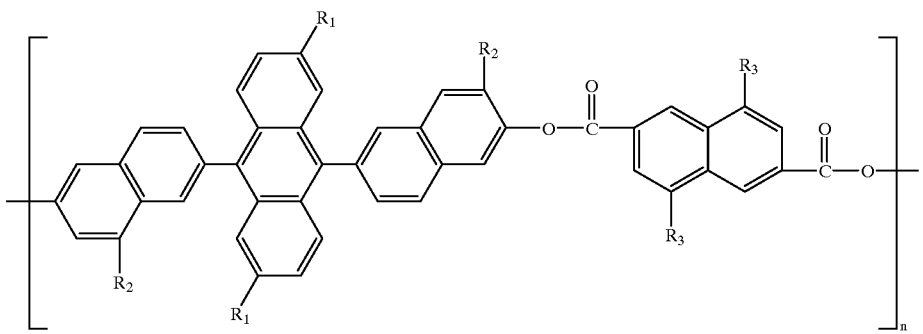

polymer 92 R₁=2-ethylhexyloxy, R₂=R₃=H
polymer 93 R₁=R₂=n-hexyl, R₃=H
polymer 94 R₁=t-butyl, R₂=R₃=n-hexyloxy
polymer 95 R₁=t-butyl, R₂=n-hexyloxy, R₃=H

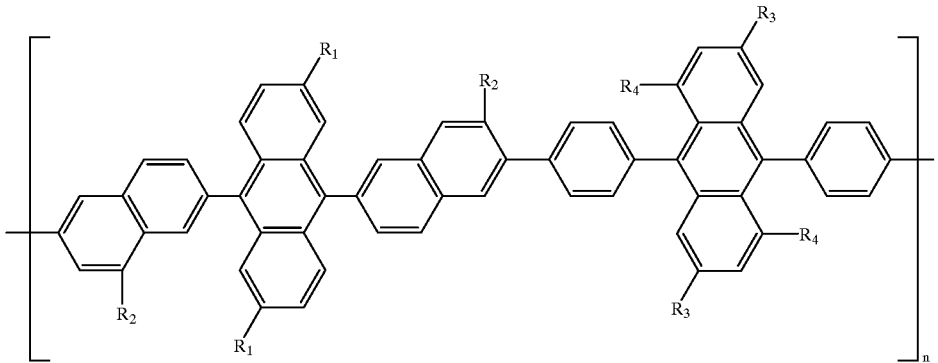

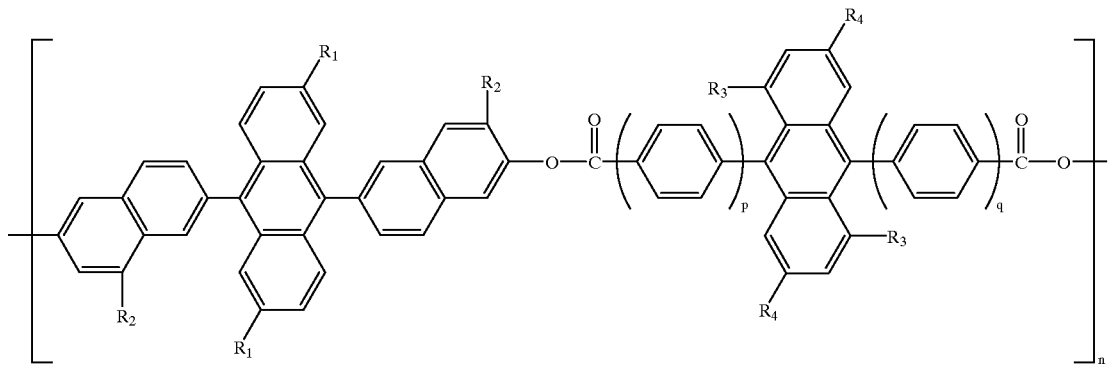

polymer 100 R₁=t-butyl, R₂=n-hexyloxy, R₃=R₄=H, p=q=1 polymer 101 R₁=2-ethylhexyl, R₂=R₄=H, R₃=n-hexyloxy, p=q=1 polymer 102 R₁=2-ethylhexyloxy, R₂=R₃=n-hexyloxy, R₄=H, p=q=2 polymer 103 R₁=n-hexyl, R₂=R₃=n-hexyloxy, R₄=H, p=q=2 polymer 104 R₁=2-ethylhexyloxy, R₂=R₃=H, R₄=n-hexyl, p=q=2 polymer 105 R₁=n-hexyl, R₂=R₄=n-hexyloxy, R₃=H, p=q=2 polymer 107 R₁=2-ethylhexyl, R₂=R₄=H, R₃=n-hexyloxy polymer 108 R₁=2-ethylhexyloxy, R₂=R₃=n-hexyloxy, R₄=H

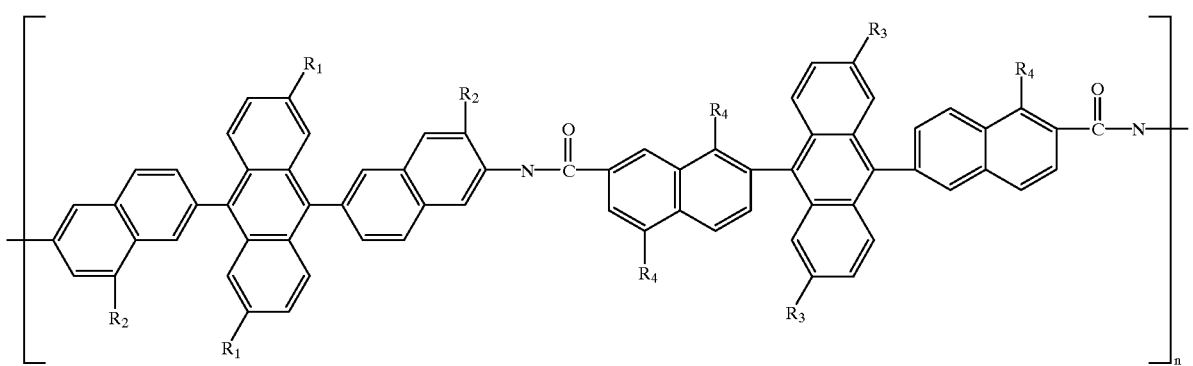

polymer 106 R₁=t-butyl, R₂=n-hexyloxy, R₃=R₄=H polymer 109 R₁=n-hexyl, R₂=R₃=n-hexyloxy, R₃=R₄=H

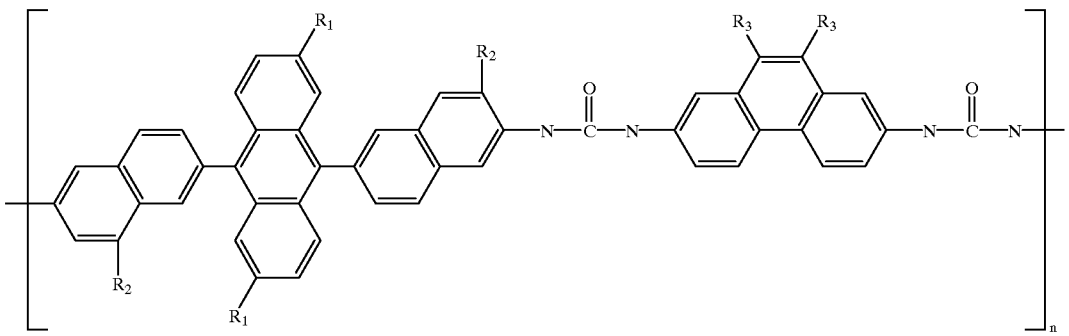

polymer 110 R₁=2-ethylhexyloxy, R₂=R₃=H
polymer 111 R₁=R₂=n-hexyl, R₃=H
polymer 112 R₁=t-butyl, R₂=R₃=n-hexyloxy
polymer 113 R₁=2-ethylhexyloxy, R₂=H, R₃=n-hexyloxy

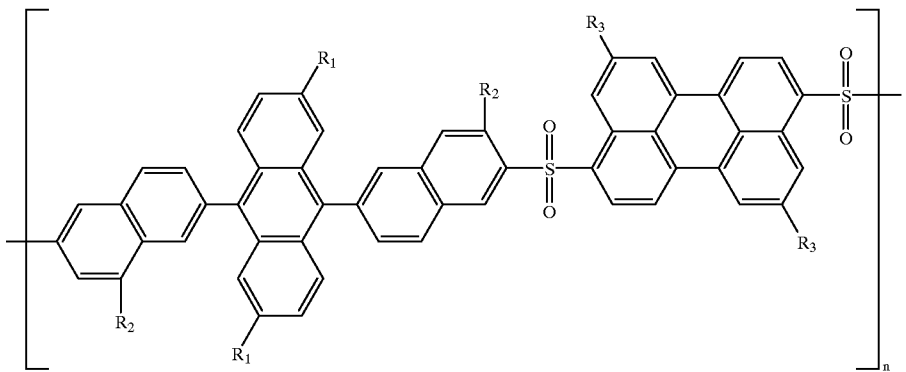

polymer 114 R₁=2-ethylhexyloxy, R₂=R₃=H
polymer 115 R₁=2-ethylhexyloxy, R₂=n-hexyl, R₃=H
polymer 116 R₁=t-butyl, R₂=R₃=n-hexyl

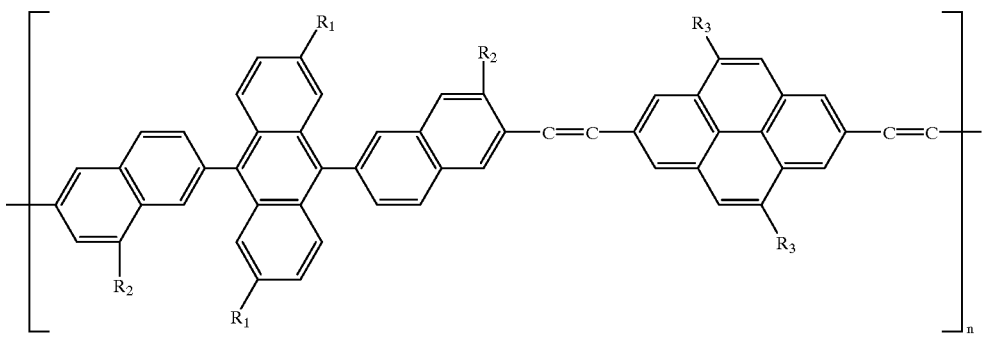

polymer 117 R₁=2-ethylhexyloxy, R₂=R₃=H
polymer 118 R₁=2-ethylhexyloxy, R₂=n-hexyl, R₃=H
polymer 119 R₁=t-butyl, R₂=R₃=n-hexyl
polymer 120 R₁=2-ethylhexyloxy, R₂=H, R₃=n-hexyl

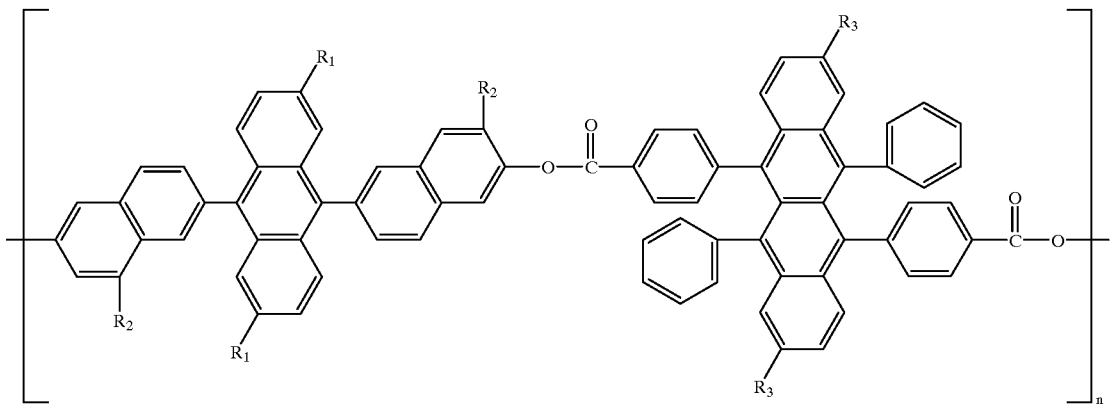

polymer 121 R₁=2-ethylhexyloxy, R₂=n-hexyl, R₃=H
polymer 122 R₁=R₂=R₃=n-hexyl
polymer 123 R₁=R₃=2-ethylhexyloxy, R₂=H polymer 128 R₁=2-ethylhexyloxy, R₂=R₃=R₄=R₅=H
polymer 129 R₁=2-ethylhexyloxy, R₂=n-hexyl, R₃=R₄=R₅=H

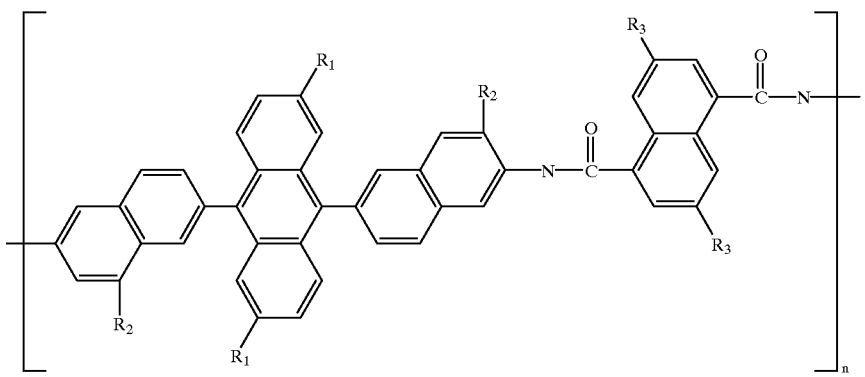

polymer 124 R₁=2-ethylhexyloxy, R₂=n-hexyl, R₃=H
polymer 125 R₁=R₂=R₃=n-hexyl
polymer 126 R₁=R₃=2-ethylhexyloxy, R₂=H
polymer 127 R₁=2-ethylhexyloxy, R₂=R₃=H polymer 130 R₁=t-butyl, R₂=n-hexyl, R₃=R₅=H, R₄=n-hexyloxy
polymer 131 R₁=2-ethylhexyloxy, R₂=R₄=R₅=H, R₃=CN
polymer 132 R₁=2-ethylhexyloxy, R₂=n-hexyl, R₃=CN, R₄=R₅=H Group IV Y are aromatic hydrocarbons linked by a double bond of formula (V)

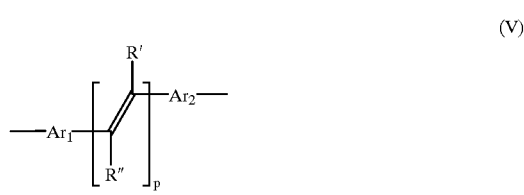

wherein:

$Ar_1$ and $Ar_2$ are substituted or unsubstituted aryl groups with 6 to 28 carbon atoms;

$R'$ and $R''$ are hydrogen, or alkyl group containing 1 to 12 carbon atoms, or Cl, Br, F, or a cyano group; and p is an integer from 1 to 3.

The following molecular structures constitute specific examples of above mentioned groups with formula IV:

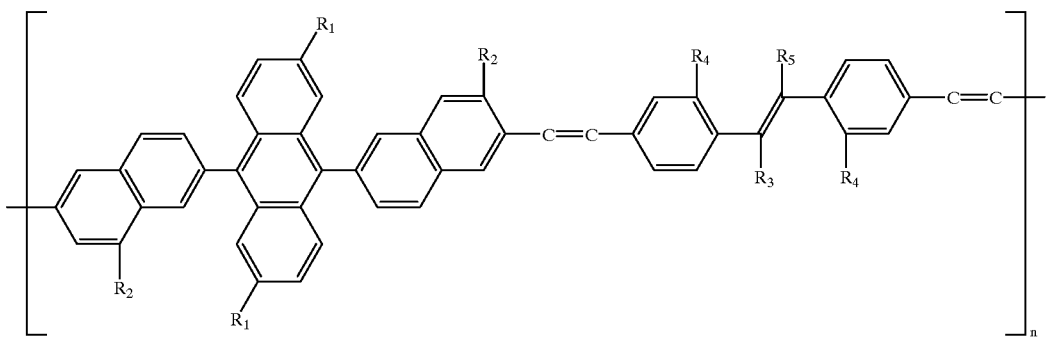

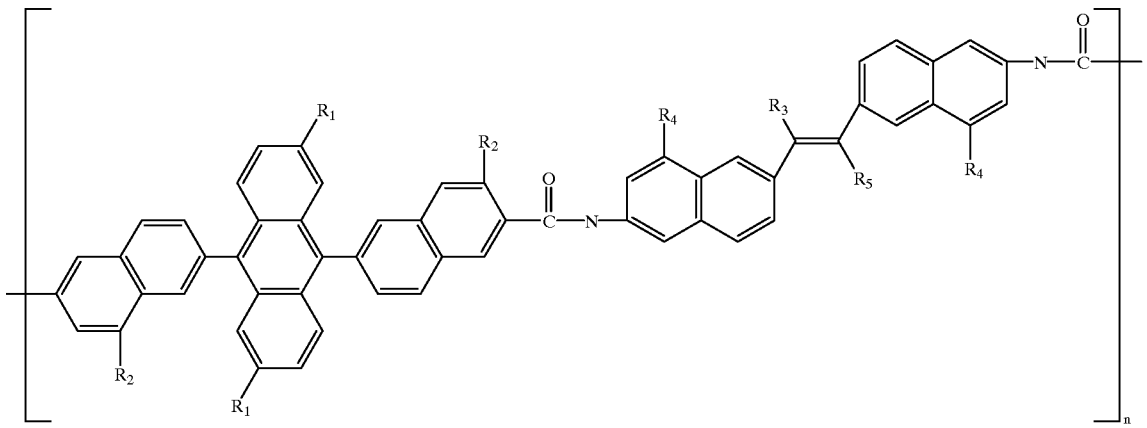

polymer 133 R₁=2-ethylhexyloxy, R₂=R₃=R₄=R₅=H
polymer 134 R₁=2-ethylhexyloxy, R₂=n-hexyl, R₃=R₄=R₅=H
polymer 135 R₁=t-butyl, R₂=n-hexyl, R₃=R₅=H, R₄=n-hexyloxy
polymer 136 R₁=2-ethylhexyloxy, R₂=R₄=R₅=H, R₃=CN
polymer 137 R₁=2-ethylhexyloxy, R₂=n-hexyl, R₃=CN, R₄=R₅=H

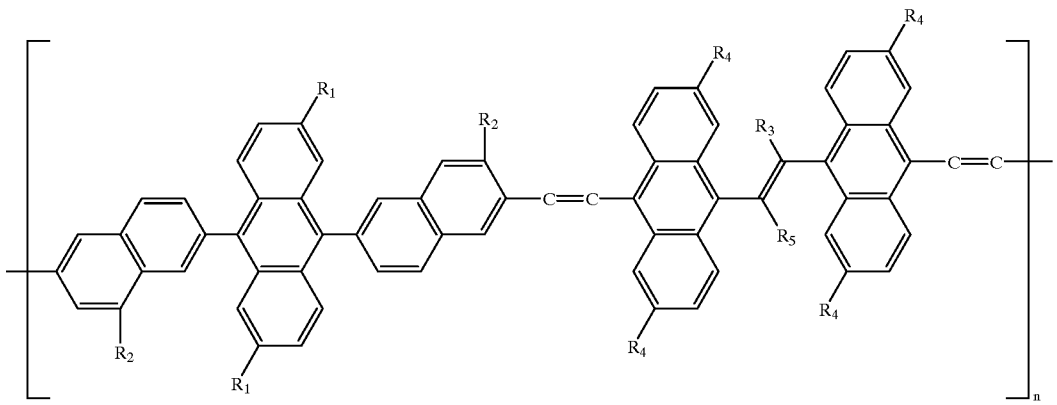

polymer 138 R₁=2-ethylhexyloxy, R₂=R₃=R₄=R₅=H
polymer 139 R₁=2-ethylhexyloxy, R₂=n-hexyl, R₃=R₄=R₅=H
polymer 140 R₁=t-butyl, R₂=n-hexyl, R₃=R₅=H, R₄=n-hexyloxy
polymer 141 R₁=2-ethylhexyloxy, R₂=R₄=R₅=H, R₃=CN
polymer 142 R₁=2-ethylhexyloxy, R₂=n-hexyl, R₃=CN, R₄=R₅=H

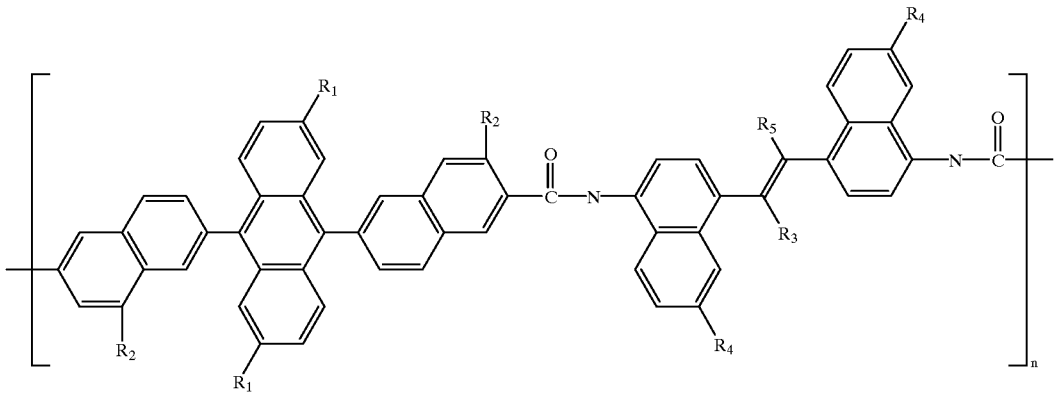

polymer 143 R₁=2-ethylhexyloxy, R₂=R₃=R₄=R₅=H
polymer 144 R₁=2-ethylhexyloxy, R₂=n-hexyl, R₃=R₄=R₅=H
polymer 145 R₁=t-butyl, R₂=n-hexyl, R₃=R₅=H, R₄=n-hexyloxy
polymer 146 R₁=2-ethylhexyloxy, R₂=R₄=R₅=H, R₃=CN
polymer 147 R₁=2-ethylhexyloxy, R₂=n-hexyl, R₃=CN, R₄=R₅=H polymer 148 R₁=2-ethylhexyloxy, R₂=R₃=R₄=R₅=H, p=q=r=1
polymer 149 R₁=2-ethylhexyloxy, R₂=n-hexyl, R₃=R₄=R₅=H, p=q=r=1
polymer 150 R₁=t-butyl, R₂=n-hexyl, R₃=R₅=H, R₄=n-hexyloxy, p=q=2, r=1
polymer 151 R₁=2-ethylhexyloxy, R₂=R₄=R₅=H, R₃=CN, p=q=r=1

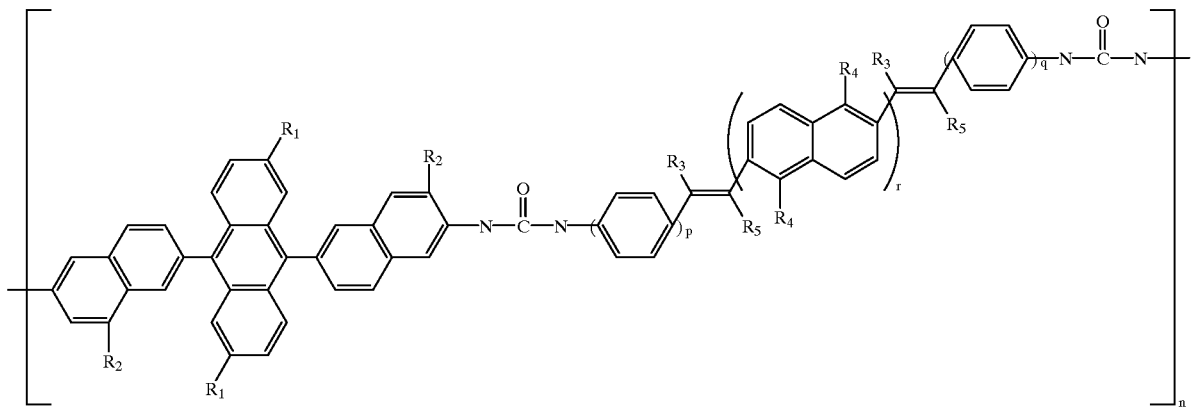

polymer 152 R₁=2-ethylhexyloxy, R₂=n-hexyl, R₃=CN, R₄=R₅=H, p=q=r=2

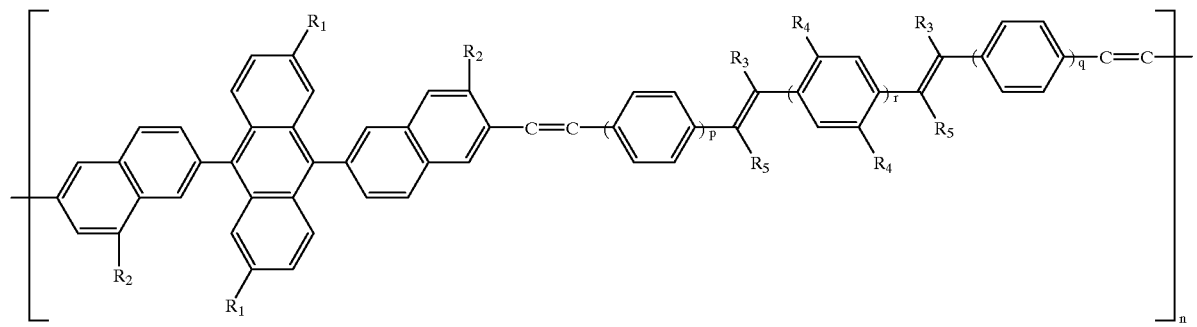

polymer 153 R$_1$=2-ethylhexyloxy, R$_2$=R$_3$=R$_4$=R$_5$=H, p=q=r=1 polymer 154 R$_1$=2-ethylhexyloxy, R$_2$=n-hexyl, R$_3$=R$_4$=R$_5$=H, p=q=r=1 polymer 155 R$_1$=t-butyl, R$_2$=n-hexyl, R$_3$=R$_5$=H, R$_4$=n-hexyloxy, p=q=2, r=1 polymer 156 R$_1$=2-ethylhexyloxy, R$_2$=R$_4$=R$_5$=H, R$_3$=CN, p=q=r=1 polymer 157 R$_1$=2-ethylhexyloxy, R$_2$=n-hexyl, R$_3$=CN, R$_4$=R$_5$=H, p=q=r=2 polymer 162 R$_1$=2-ethylhexyloxy, R$_2$=R$_3$=H, R$_4$=n-hexyl, p=1 polymer 163 R$_1$=t-butyl, R$_2$=n-hexyl, R$_3$=H, R$_4$=2-ethylhexyl, p=2 polymer 164 R$_1$=2-ethylhexyloxy, R$_2$=H, R$_3$=n-hexyl, R$_4$=2-ethylhexyl, p=2 polymer 165 R$_1$=2-ethylhexyloxy, R$_2$=R$_3$=n-hexyl, R$_4$=2-ethylhexyl, p=3

Group V

Y are heteroaromatics of formula (VI)

$$-(\text{W})-\qquad\qquad (\text{VI})$$

wherein:

W is substituted or unsubstituted heteroaryl groups with 4–40 carbon atoms, and at least one or more N, S, or O atoms.

The following molecular structures constitute specific examples of above mentioned groups with formula VI:

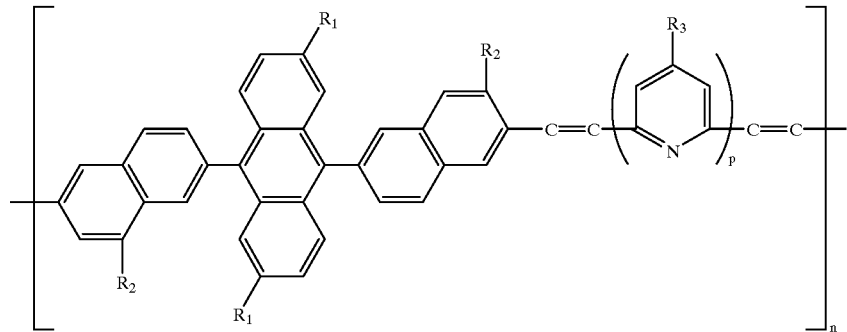

polymer 158 R$_1$=2-ethylhexyloxy, R$_2$=R$_3$=H, p=1
polymer 159 R$_1$=2-ethylhexyloxy, R$_2$=R$_3$=H, p=2
polymer 160 R$_1$=2-ethylhexyloxy, R$_2$=H, R$_3$=n-hexyl, p=1
polymer 161 R$_1$=t-butyl, R$_2$=n-hexyloxy, R$_3$=H, p=1

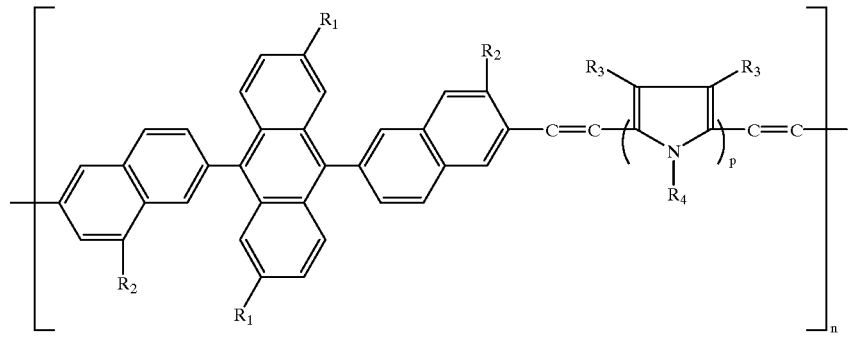

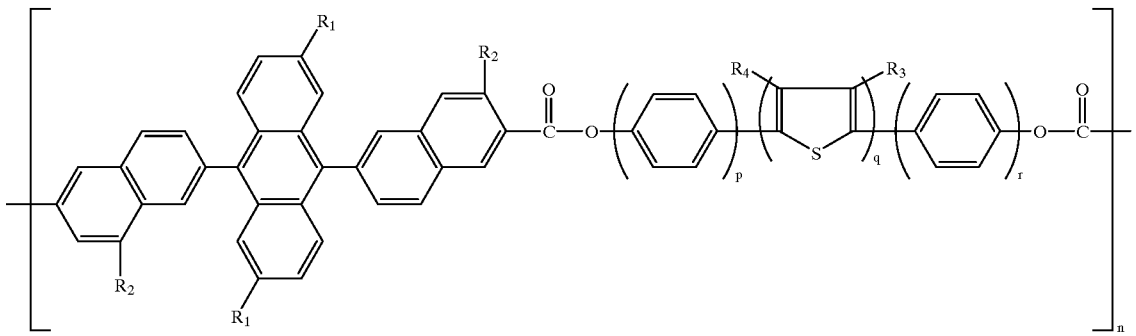

polymer 166 R₁=2-ethylhexyloxy, R₂=R₃=R₄=H, p=r=0, q=1
polymer 167 R₁=t-butyl, R₂=n-hexyl, R₃=R₄=2-ethylhexyl, p=r=1, q=2
polymer 168 R₁=R₄=2-ethylhexyloxy, R₂=R₃=H, p=r=q=1
polymer 169 R₁=R₂=2-ethylhexyloxy, R₃=R₄=H, p=r=1, q=2
polymer 170 R₁=t-butyl, R₂=R₃=2-ethylhexyloxy, R₄=H, p=r=1, q=2 polymer 174 R₁=2-ethylhexyloxy, R₂=n-hexyl, p=q=2, X=O
polymer 175 R₁=2-ethylhexyloxy, R₂=n-hexyl, p=q=2, X=S
polymer 176 R₁=2-ethylhexyloxy, R₂=n-hexyl, p=q=2, X=N-hexyl

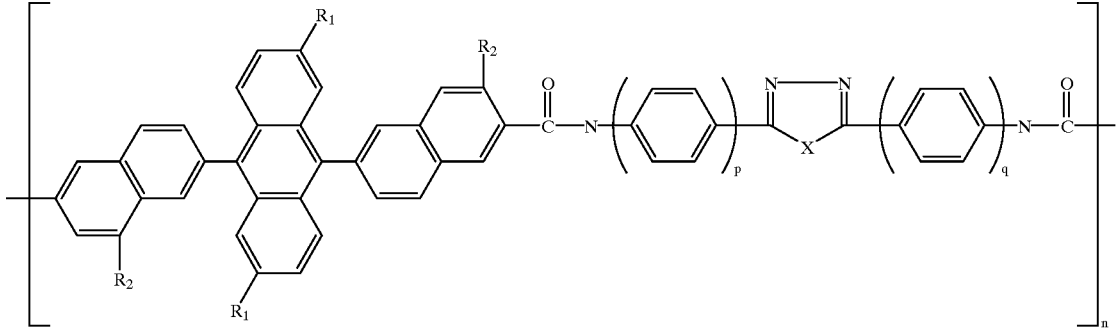

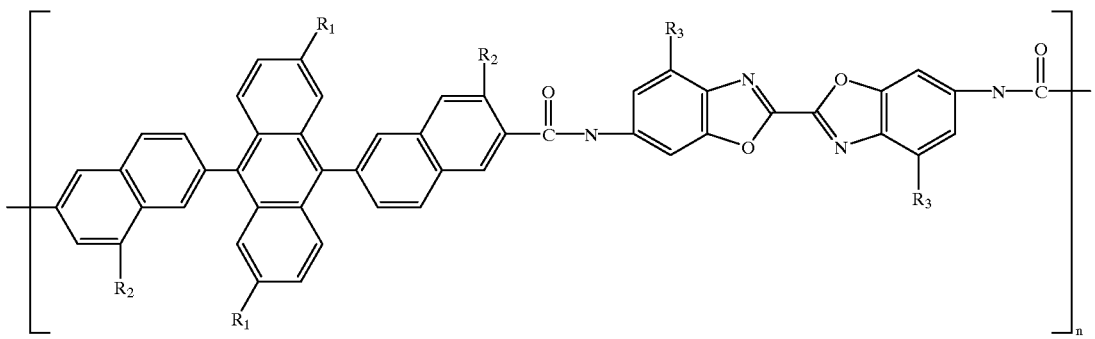

polymer 171 R₁=2-ethylhexyloxy, R₂=H, p=q=1, X=O
polymer 172 R₁=2-ethylhexyloxy, R₂=H, p=q=1, X=S
polymer 173 R₁=2-ethylhexyloxy, R₂=H, p=q=1, X=n-hexyl polymer 177 R₁=2-ethylhexyloxy, R₂=R₃=H
polymer 178 R₁=2-ethylhexyloxy, R₂=H, R₃=phenyl
polymer 179 R₁=t-butyl, R₂=R₃=n-hexyl
polymer 180 R₁=2-ethylhexyloxy, R₂=H, R₃=n-hexyloxy polymer 181 R₁=2-ethylhexyloxy, R₂=n-hexyloxy, R₃=H

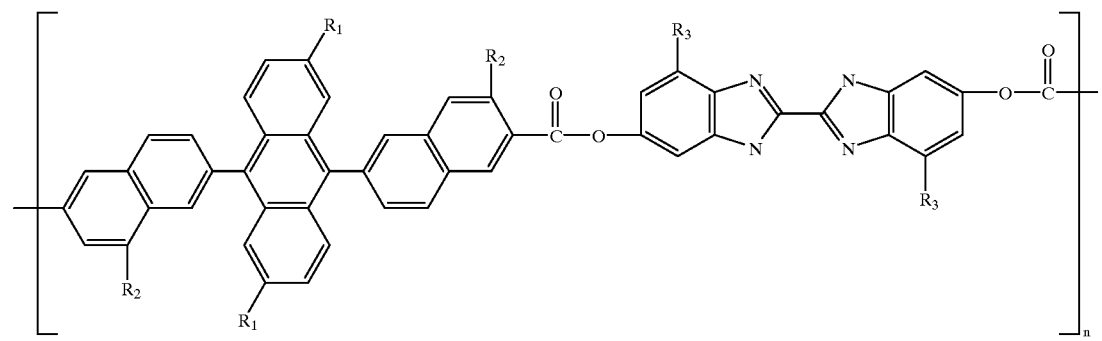

polymer 182 R₁=2-ethylhexyloxy, R₂=R₃=H
polymer 183 R₁=2-ethylhexyloxy, R₂=H, R₃=phenyl
polymer 184 R₁=t-butyl, R₂=R₃=n-hexyl
polymer 185 R₁=2-ethylhexyloxy, R₂=H, R₃=n-hexyloxy
polymer 186 R₁=2-ethylhexyloxy, R₂=n-hexyloxy, R₃=H

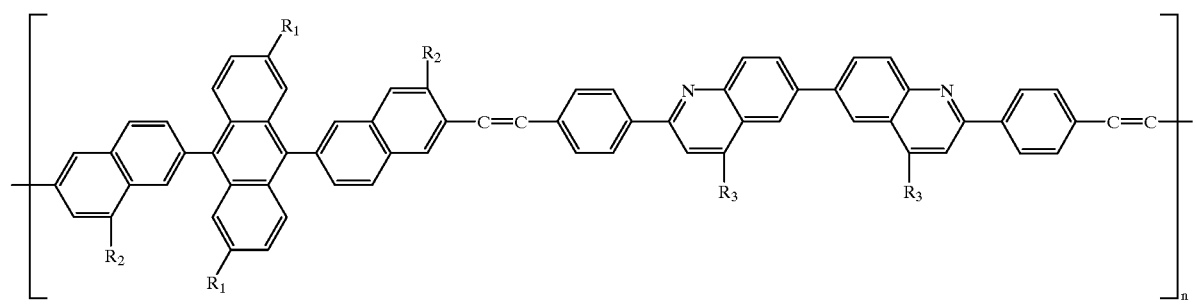

polymer 187 R₁=2-ethylhexyloxy, R₂=R₃=H
polymer 188 R₁=2-ethylhexyloxy, R₂=H, R₃=phenyl
polymer 189 R₁=t-butyl, R₂=R₃=n-hexyl
polymer 190 R₁=2-ethylhexyloxy, R₂=H, R₃=n-hexyl

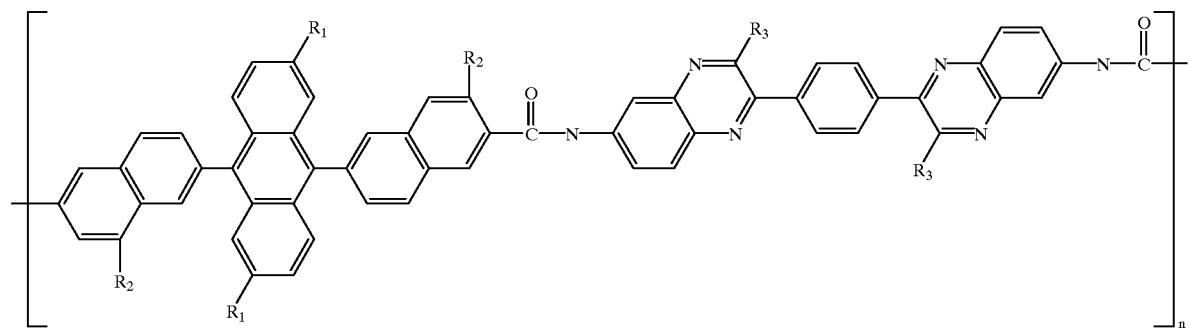

polymer 191 R₁=2-ethylhexyloxy, R₂=R₃=H
polymer 192 R₁=2-ethylhexyloxy, R₂=H, R₃=phenyl
polymer 193 R₁=t-butyl, R₂=R₃=n-hexyl polymer 194 R₁=2-ethylhexyloxy, R₂=H, R₃=n-hexyl

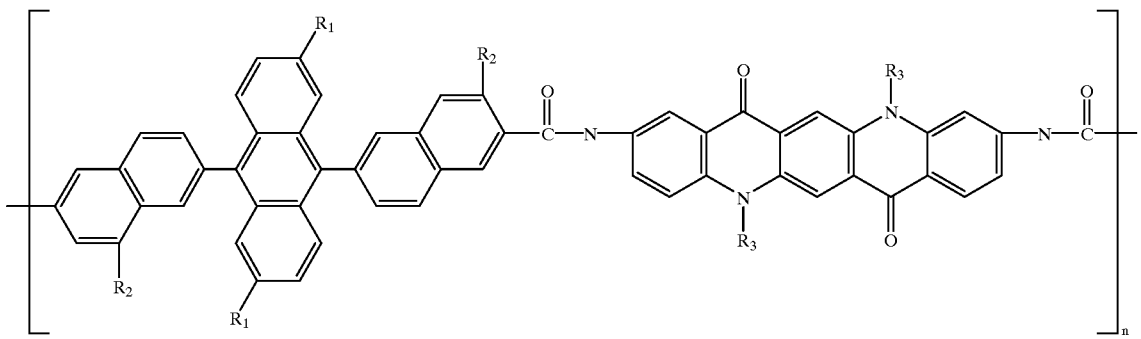

polymer 195 R₁=2-ethylhexyloxy, R₂=H, R₃=methyl
polymer 196 R₁=2-ethylhexyloxy, R₂=H, R₃=phenyl
polymer 197 R₁=t-butyl, R₂=R₃=n-hexyl
polymer 198 R₁=2-ethylhexyloxy, R₂=H, R₃=n-hexyl In formula (I), Y can be one or the combination of more than one of the above groups. The specific molecular structures can be the combination of any of the above drawn structures.

The polymerization method and the molecular weights of the resulting polymers used in the present invention are not necessary to be particularly restricted. The molecular weights of polymers are at least 1000, and preferably at least 3000. The polymers may be prepared by condensation polymerizations, preferably by cross-coupling reactions such as Pd-catalyzed Suzuki coupling (Miyaura, N. et al *Chem. Rev.* 1995, 95, 2457), or by condensation reaction between di-(acid chloride)s with di-amines, di-alcohols or di-phenols in the presence of bases.

Suzuki coupling reaction was first reported by Miyaura et al on the coupling of aromatic boronic acid derivatives with aromatic halides Miyaura et al *Synthetic Comm.* 1981, 11(7), 513). Since then, this reaction has been widely used to prepared polymers for various applications (Ranger, M. et al *Macromolecules* 1997, 30, 7686–7691 Kim, S. et al *Macromolecules* 1998, 31, 964–974; and Ng, P. K *Macromol. Rapid Commun.* 1997, 18, 1009–1016). A modified process was reported by Inbasekaran et al to prepare conjugated polymers for EL devices (Inbasekaran, M. et al U.S. Pat. No. 5,777,070 (1998)). According to the present invention, the above mentioned polymers were prepared by Suzuki coupling reaction of an aromatic diboronic acid ester with an aromatic dibromide. The aromatic diboronic acid esters were prepared from the corresponding dihalide treated with nBuLi and trimethylborate followed by esterification with a di-alcohol. The synthetic schemes for polymers and monomers are illustrated in Schemes 1–6.

FIG. 1 illustrates the basic structure used to construct organic EL devices. It is a bi-layer structure comprising a hole transport layer 30 and an electron transport layer 40. The electron transport layer is also the emissive layer from which electroluminescence originates. Together they form the EL medium 50. The anode is adjacent to the hole transport layer and the cathode 60 is adjacent to the electron transport layer. The substrate is layer 10. This figure is for illustration only and the individual layer thickness is not scaled according to the actual thickness.

Figure 2:
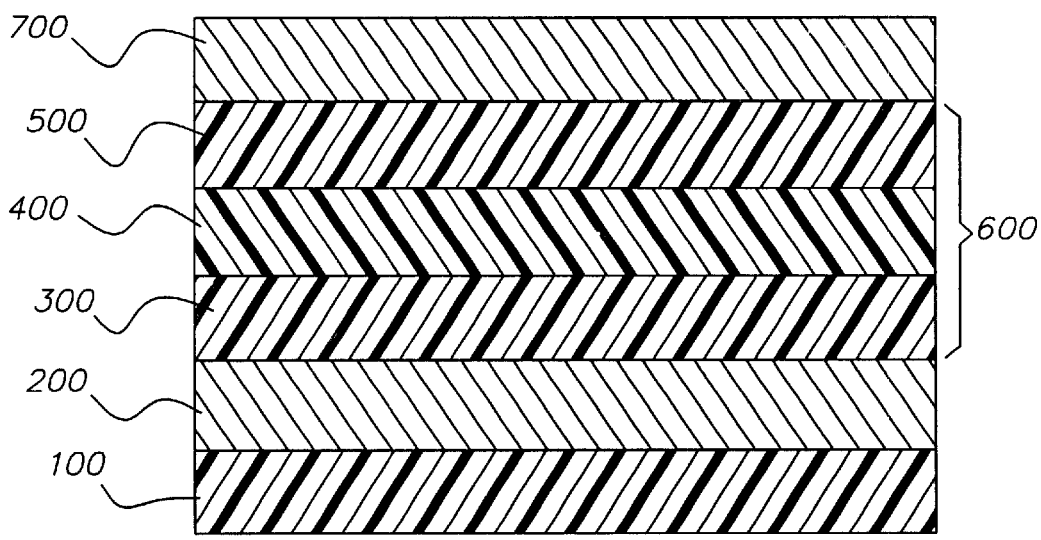
FIG. 2 illustrates a cross-section of a modified bi-layer EL device which can use a polymer in accordance with the present invention.

FIG. 2 illustrates an alternative construction of the EL device. It is a modified bi-layer structure. The EL medium contains an emissive layer between the hole transport layer and the electron transport layer. This emissive layer is the layer where electroluminescence originates. Thus, layer 300 is the hole transport layer, layer 400 is the emissive layer, layer 500 is the electron transport layer, and together they form the electroluminescent medium 600. Layer 200 is the anode and layer 700 is the cathode. The substrate is layer 100. This figure is for illustration only and the individual layer thickness is not scaled according to the actual thickness.

The bi-layer EL devices are the basic structure providing high luminous efficiency and low operating voltage. Alternative EL device structures have been demonstrated to provide improved device performance. These alternative structures include features in addition to the basic bi-layer structure such as the following structure (a) hole injection layer as disclosed in U.S. Pat. No. 4,356,429; (b) cathode modification with alkaline or alkaline halides as disclosed in U.S. Pat. No. 5,776,622; (c) anode modification with plasma-deposited fluorocarbons as disclosed in commonly-assigned U.S. patent application Ser. No. 09/191,705; and (d) doped emitter layer inserted between the hole transport and electron transport layer as disclosed in U.S. Pat. No. 4,769,292.

Figure 3:
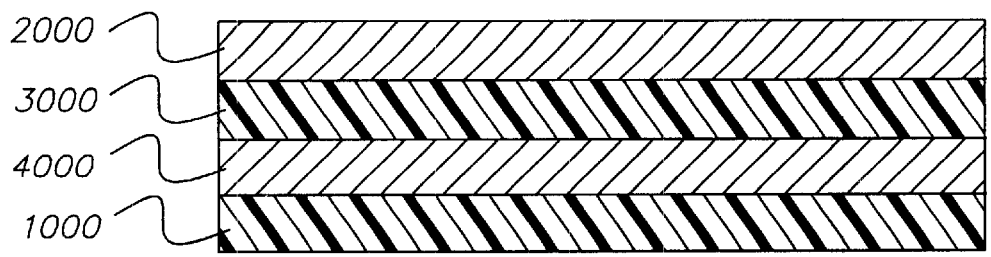
FIG. 3 illustrates a cross-section of a single-layer EL device which can use a polymer in accordance with the present invention.

FIG. 3 illustrates another alternative construction of an EL device. It is a single-layer structure comprising an emitting layer 3000, sandwiched between an anode 2000 and cathode 4000. The emitting layer 3000 also acts as a charge carrier layer. Thus, single layer 3000 is the electroluminescent medium. The substrate is layer 1000. This figure is for illustration only and the individual layer thickness is not scaled according to the actual thickness.

A preferred EL device structure of this invention is a single-layer structure comprising an anode, a cathode, and single layer of electroluminescent medium. This electroluminescent layer is the emissive layer, and is also capable of transporting electrons as well as holes. The principle function of this layer is to provide efficient emissive centers for electroluminescence. This layer can comprise one of the above mentioned polymers or the blend of two or more polymers, or polymers doped with one or more fluorescent dyes (FD). The fluorescent dye is usually present in an amount on the order of a few molar percent or less of the host polymer and it is sufficient to cause the EL emission to be predominantly that of the fluorescent dye. Using this method, highly efficient EL devices can be constructed. Simultaneously, the color of the EL devices can be tuned using fluorescent dyes of different emission wavelengths. By using a mixture of fluorescent dyes, EL color characteristics of the combined spectra of the individual fluorescent dyes are produced. This dopant scheme has been described in considerable detail for EL devices in U.S. Pat. No. 4,769,292. An important criterion for choosing a fluorescent dye as a dopant capable of modifying the hue of light emission when present in a host material is a comparison of their bandgap. For efficient energy transfer from the host to the dopant molecule, a necessary condition is that the energy bandgap of the dopant is smaller than that of the host polymer. Preferred fluorescent dyes used as the dopant in the emissive layer include but are not limited to coumarins, stilbenes, distrylstibenes, anthracene derivatives, tetracene, perlenes, rhodamines, and arylamines.

The molecular structures of the preferred fluorescent dyes for the emissive layer in the EL device are listed as follows:

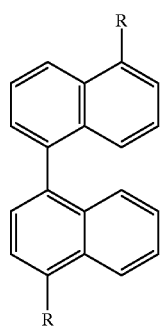

FD 1 R=H
FD 2 R=$CO_2$Pr-i

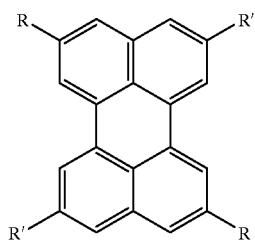

FD 3 R=H, R'=t-Bu
FD 4 R=R'=t-Bu

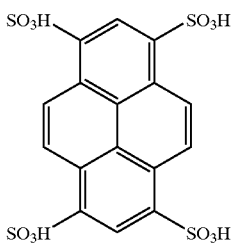

FD 5

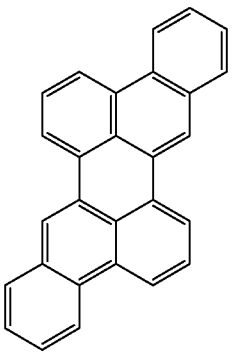

FD 6

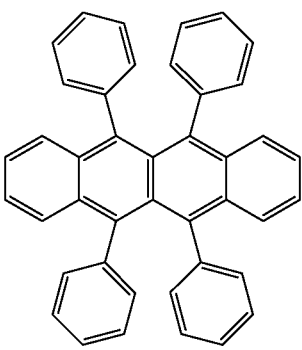

FD 7

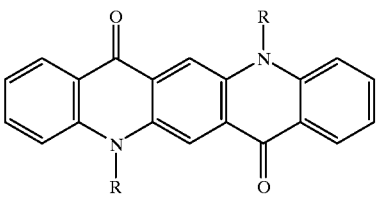

FD 8 R=H
FD 9 R=Me
FD10 R=Pr-i
FD11 R=2-ethylhexyl

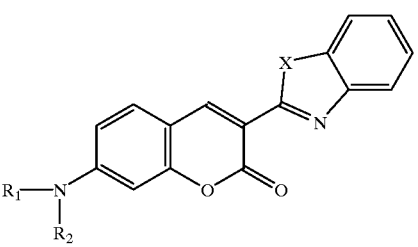

FD 12 $R_1$=$R_2$=Me, X=O
FD 13 $R_1$=$R_2$=hexyl, X=O
FD 14 $R_1$=$R_2$=phenyl, X=O
FD 15 $R_1$=$R_2$=Me, X=S
FD 16 $R_1$=$R_2$=hexyl, X=S
FD 17 $R_1$=$R_2$=phenyl, X=S

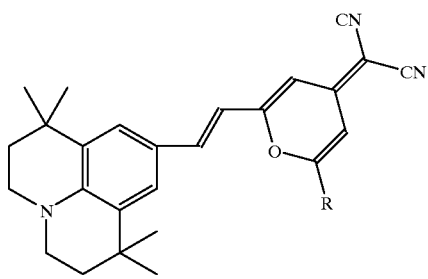

FD 18 R=n-hexyl

FD 19 R=phenyl

The above mentioned polymers can be deposited as high quality transparent thin films by spin-coating or inkjet printing the polymer solutions. Preferably, the spin-coating technique is used to form layer 3000, and preferably, only one polymer is deposited as single layer of electroluminescent medium.

Preferred materials for use in forming the anode modified with fluorocarbons are disclosed in commonly-assigned U.S. patent application Ser. No. 09/191,705.

Preferred materials for use in forming the cathode of the EL devices of this invention are Mg, Li, or alloys of these materials as disclosed in U.S. Pat. Nos. 5,429,884 and 5,776,622.

EXAMPLES

The invention and its advantages are further illustrated by the following specific examples:

Synthesis of Monomers

Monomers to be used in the present invention are not necessary to be particularly restricted. Any monomers can be used as long as the polymer formed is a polymer which satisfies the general formula (I). Typical monomer and polymer synthesis is illustrated in Schemes 1–6.

Scheme 1

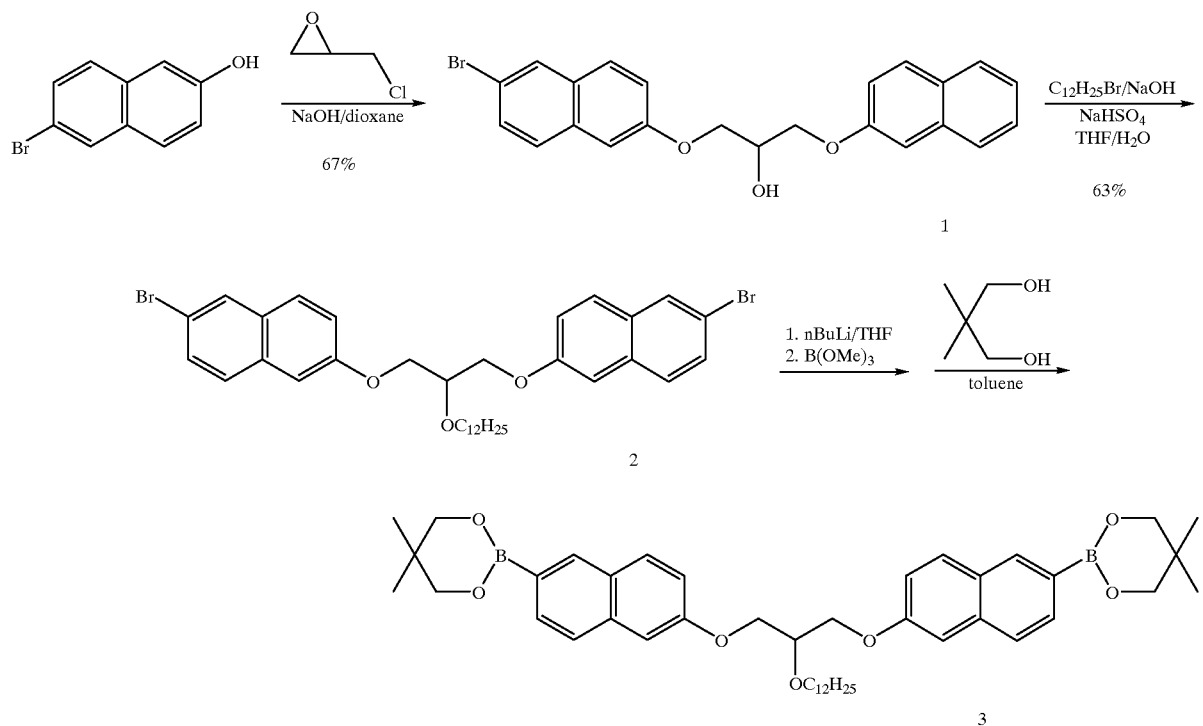

Scheme 2
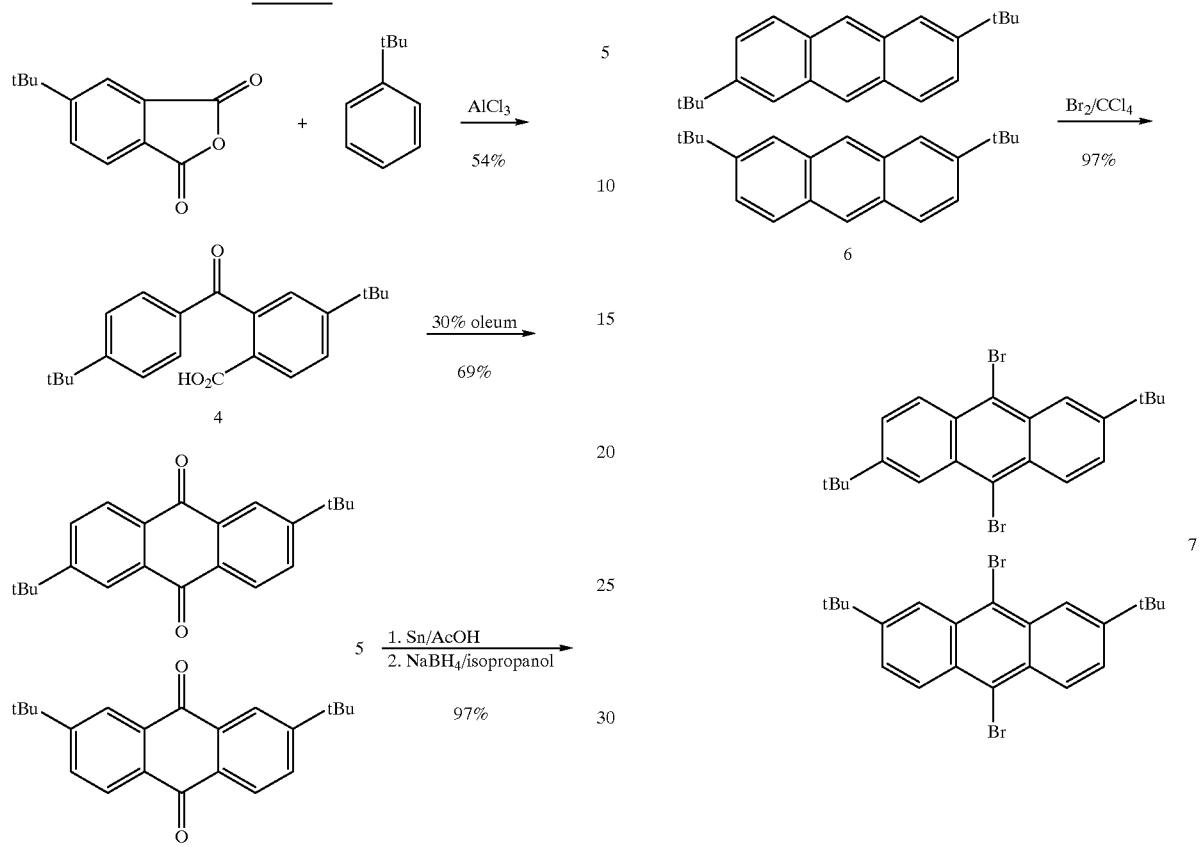
Scheme 3
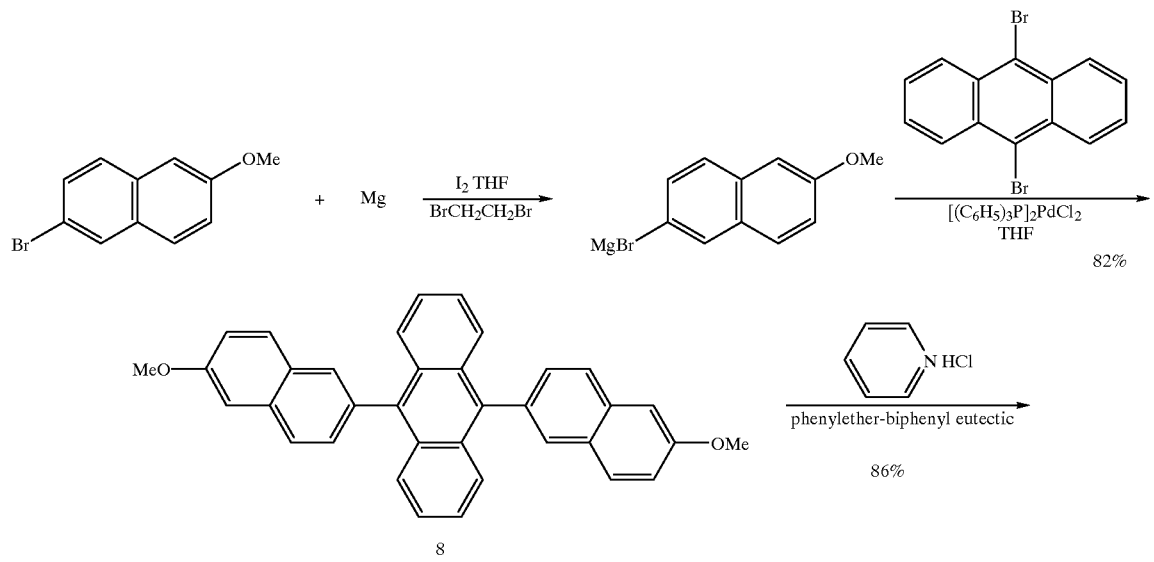

-continued
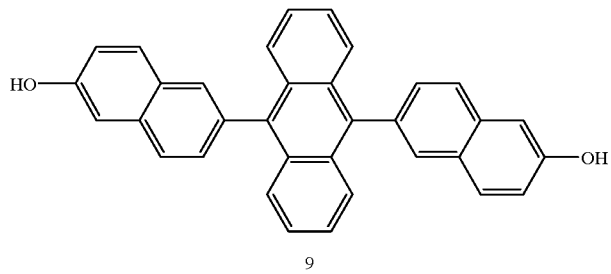
9
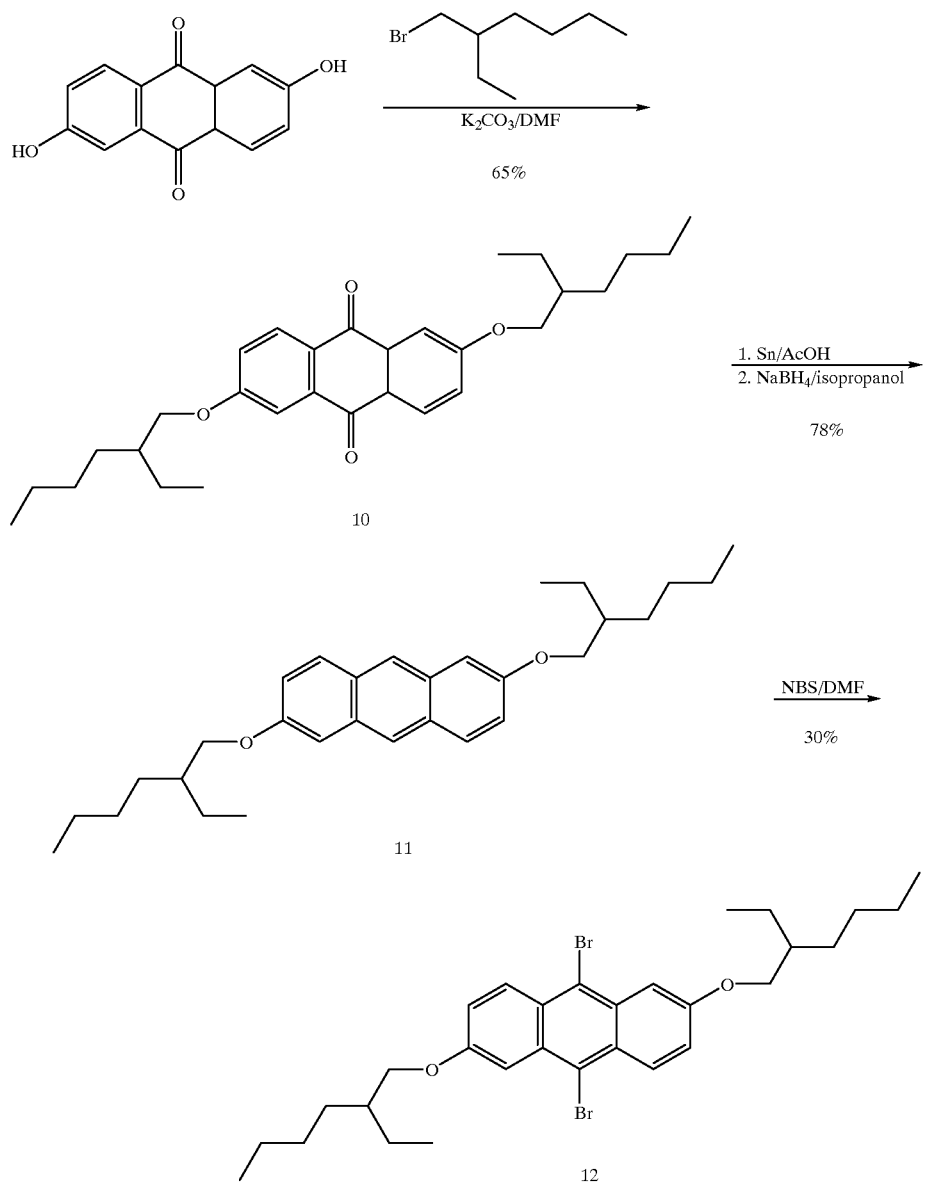

Scheme 5

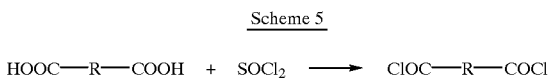

Scheme 6

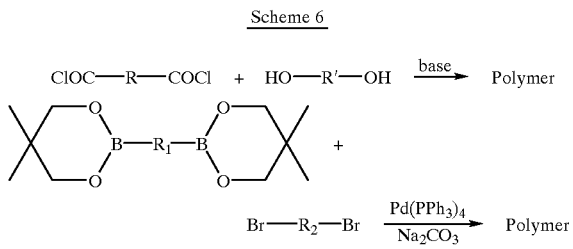

Example 1

Synthesis of 1,3-di(2-(6-bromonaphthoxy))-2-propanol (Compound 1)

6-Bromo-2-hydroxy-naphthalene (66.7 g, 0.299 mol) and NaOH (7.4 g, 0.185 mol) were suspended in 500 mL of dioxane and heated for half hour until the reaction became homogeneous. Epichlorohydrin (11.5 g, 0.124 mol) was added dropwise and the reaction was heated at reflux for 20 h. The brown reaction mixture was poured into 1 L of water and the gray precipitated was filtered, washed with water and methanol, and dried under vacuum. The crude product was then recrystallized from acetone to give 41.3 g of pure product (67% yield). $^1$NMR (CDCl$_3$) δ(ppm): 4.28–4.35 (m, 5H), 4.50–4.55 (m, 1H), 7.15 (d, J=2.2 Hz, 2H), 7.18 (dd, J$_1$=8.9 Hz, J$_2$=2.4 Hz, 2H), 7.48 (dd, J$_1$=8.7 Hz, J$_2$=1.8 Hz, 2H), 7.56 (d, J=8.8 Hz, 2H), 7.64 (d, J=8.9 Hz, 2H), 7.91 (d, J=1.1 Hz, 2H); $^{13}$C NMR(CDCl$_3$): 66.07, 67.87, 105.32, 115.04, 118.36, 126.84, 127.04, 127.70, 127.76, 128.24, 131.32, 155.40; M.p. 148–150° C.; FD-MS: m/z 500 (M$^+$).

Example 2

Synthesis of 1,3-di(2-(6-bromonaphthoxy))-2-dodecyloxy-propane (Compound 2)

To a 500 mL round-bottomed flask were added 1,3-di(2-(6-bromonaphthoxy))-2-propanol compound 1 (30.0 g, 0.060 mol), NaOH (7.2 g, 0.18 mol), NaHSO$_4$ (20.4 g, 0.060 mol), 1-bromododecane (44.9 g, 0.18 mol), water 30 mL, and THF 160 mL. The reaction was heated under reflux for two days. After cooling to room temperature, 250 mL of water was added, and the reaction was extracted with ether (6×200 mL). The organic phase was combined, dried over MgSO$_4$, and concentrated. The crude product was purified by column chromatography on silica gel using CH$_2$Cl$_2$/hexane (15/85) as eluent to give pure product as white powder 25.2 g (63% yield). $^1$H NMR (CDCl$_3$) δ(ppm): 0.87 (t, J=6.9 Hz, 3H), 1.25–1.39 (m, 18H), 1.60–1.70 (m, 2H), 3.73 (t, J=6.6 Hz, 2H), 4.13–4.18 (m, 1H), 4.26–4.37 (m, 4H), 7.16 (d, J=2.2 Hz, 2H), 7.19 (dd, J1=8.9 Hz, J2=1.8 Hz, 2H), 7.48 (dd, J=8.8 Hz, J$_2$=1.8 Hz, 2H), 7.57 (d, J=8.8 Hz, 2H), 7.63 (d, J=8.9 Hz, 2H), 7.91 (d, J=1.4 Hz, 2H); $^{13}$C NMR (CDCl$_3$): 14.10, 22.67, 26.05, 29.33, 29.44, 29.61, 29.65, 30.03, 31.90, 67.76, 71.16, 76.40, 106.95, 117.22, 119.85, 128.35, 128.51, 129.64, 130.13, 132.94, 156.92. M.p. 99–101° C.; FD-MS: m/z 668 (M$^+$).

Example 3

Synthesis of bis -2,2-dimethyltrimethylene diboronate (Compound 3)

Step 1: synthesis of diboronic acid: Bisbroinide compound 2 (12.0 g, 0.018 mol) was dissolved in 150 ml of anhydrous THF and cooled to –78° C. To this solution was added slowly nBuLi solution (33.8 mL, 1.6 M in hexane, 0.054 mol) to keep temperature lower than –60° C. The mixture was stirred at –78° C. for 1 h and trimethyl borate (8.1 mL, 0.072 mol) was added slowly. The reaction mixture was slowly warmed up to room temperature and stirred at room temperature overnight. The reaction was quenched with dilute HCl solution and stirred under nitrogen for 1 h. The reaction mixture was then extracted with ether 5 times and dried over MgSO$_4$. Solvent was evaporated and the crude product was used for preparation of diboranate without purification.

Step 2: Synthesis of bis-2,2-dimethyltrimethylene diboranate. The crude diboronic acid and 2,2-dimethylporpane-1,3-diol (neopentyl glycol) (3.8 g, 0.037 mol) were dissolved in toluene and heated under vigorous reflux under a Dean-Stark trap. After the completion of the reaction, toluene was evaporated and the crude product was recrystallized from hexane as off-white needle-like crystals, 7.7 g (57% yield). $^1$H NMR (CDCl$_3$) δ(ppm): 0.85 (t, J=6.9 Hz, 3H), 1.02 (s, 12H), 1.24–1.34 (m, 18H), 1.58–1.65 (m, 2H), 3.71 (t, J=6.6 Hz, 2H), 3.79 (s, 8H), 4.11–4.16 (m, 1H), 4.24–4.36 (m, 4H), 7.17 (s, 2H), 7.14 (d, J=8.5Hz, 2H), 7.67 (dd, J=8.2 Hz, 2H), 7.75 (d, J=8.8 Hz, 2H), 7.8 (d, J=8.3 Hz, 2H), 7.91 (s, 2H); $^{13}$C NMR (CDCl$_3$): 14.11, 21.93, 22.68, 26.07, 29.35, 29.47, 29.63, 29.66, 30.06, 31.92, 67.83, 71.15, 72.37, 76.47, 106.77, 118.61, 125.77, 128.62, 130.26, 130.66, 134.80, 136.13, 157.38. M.p. 59–61° C.; FD-MS: m/z 726 (M$^+$).

Example 4

Synthesis of 4-t-butyl-2-benzoylbenzoic acid (Compound 4)

4-t-Butyl-phthalic anhydride (36.0 g, 176 mmol) and t-butyl benzene were placed under nitrogen in a 3-neck round-bottom flask equipped with a condenser. The condenser was attached to a water-gas trap for HCl released during the reaction. AlCl$_3$ (56.0 g, 420 mmol) was added in portions during which time the mixture turned dark brown. Stirring became difficult in the thick mixture. The reaction was heated at 70° C. for 1 h and then cooled to room temperature. Ice was added slowly to the flask followed by concentrated HCl solution. A large clump of solid stuck to the bottom of the flask. This was washed multiple times with water and then dissolved in CH$_2$Cl$_2$, washed with water, dried over Na$_2$SO$_4$ and concentrated to give an oily solid. Hexane was added and after sonication, a blue-white solid was collected by filtration. Drying gave product as white solid 32.0 g (54% yield). $^1$H NMR (CDCl$_3$) δ(ppm): 1.33 (s, 18 H), 7.30 (d, J=8.0 Hz, 1H), 7.43 (d, J=8.3 Hz, 2H), 7.63–7.70 (m, 3H), 8.08 (s, 1H); $^{13}$C NMR (CDCl$_3$): 30.98, 34.92, 125.36, 125.41, 127.78, 127.84, 128.02, 129.51, 129.60, 129.81, 134.56, 139.83, 152.94, 156.80, 170.80, 196.89.

Example 5

Synthesis of 2,6/2,7-di-t-butyl-anthraquinone (Compound 5)

4-t-Butyl-2-benzoylbenzoic acid 4 (32.0 g, 95 mmol) was placed into a round-bottom flask and oleum (30%, 290 mL) was then added. The reaction mixture turned black and the reaction temperature was increased to 120° C. and stirred for 3 h. The mixture was then poured into ice. The aqueous mixture was extracted using CH$_2$Cl$_2$ (5×), dried over Na$_2$SO$_4$ and concentrated to give a dark solid. This solid was passed through a silica gel column using CH$_2$Cl$_2$ as eluent. After concentrating, the yellow-brown solid was recrystallized from hexane to give product as yellow crystals 21.0 g (69% yield). $^1$H NMR (CDCl$_3$) δ(ppm): 1.42 (s, 18H), 7.80 (d, J=8.2 Hz, 1H), 7.81 (d, J=8.2 Hz), 8.20 (d, J=8.2 Hz, 1H),), 8.22 (d, J=8.2 Hz, 1H), 8.31 (s, 2H); $^{13}$C NMR (CDCl$_3$): 31.01, 35.58, 123.83, 123.90, 127.17, 127.28, 131.08, 131.15, 131.34, 131.42, 133.40, 133.49, 157.94, 158.05, 182.76, 183.28,183.78

Example 6

Synthesis of 2,6/2,7-di-t-butyl-anthracene (Compound 6)

2,6-Di-t-butyl-anthraquinone 5 (10.0 g, 313 mmol), tin (18.0 g, 151 mmol), and 50 mL of glacial acetic acid were added to a round-bottom flask and heated to reflux. During heating, the anthraquinone 5 went into solution and a new solid started to precipitate out. After 3 h, TLC showed all starting material 5 disappeared. After cooling to room temperature, the mixture was poured into ice and stirred for 30 minutes. CH$_2$Cl$_2$ was added and after separation, the aqueous layer was extracted with CH$_2$Cl$_2$ (3×). The combined organic layers were dried over Na$_2$SO$_4$ and concentrated to yield a sticky, oily solid. This was used without further purification in the subsequent reaction.

The oily solid was dissolved in 110 ml of isopropyl alcohol and of NaBH$_4$ (13.0 g, 333 mmol) was added in portions. The reaction was refluxed overnight. TLC indicated the completion of the reaction. After cooling to room temperature and the reaction was neutralized with HCl (6 M) solution during which time a solid precipitated out of solution. Additional water was added and the product was collected by vacuum filtration, washed thoroughly with water and dried in an oven to give 8.8 g product (97% yield).). $^1$H NMR (CDCl$_3$) δ(ppm): 1.43 (s, 18H), 7.48–7.53 (m, 2H), 7.85–7.91 (m, 2H), 8.26–8.30 (m, 2H); $^{13}$C NMR (CDCl$_3$): 30.98, 34.89, 122.17, 122.25, 124.51, 124.70, 124.91, 125.36, 125.80, 127.71, 127.77, 130.05, 130.45, 131.55, 131.96, 147.23, 147.43.

Example 7

Synthesis of 2,6/2,7-di-t-butyl-9,10-dibromoanthracene (Compound 7)

2,6-Di-t-butyl-anthracene 6 (4.0 g, 13.8 mmol) was dissolved in 150 ml, CCl$_4$ and then bromine (1.42 mL; 27.6 mmol) was added dropwise. After stirring at room temperature overnight, TLC indicated the completion of the reaction. The reaction mixture was poured into water and a concentrated solution of sodium thiosulfate was added. After stirring for 60 minutes, the layers were separated, the aqueous layer was extracted with CH$_2$Cl$_2$ (3×) and the combined organic layer was dried over Na$_2$SO$_4$ and concentrated to give a yellow solid. This solid was recrystallized from EtOH to give pure product 6.0 g (97% yield). $^1$H NMR (CDCl$_3$) δ(ppm): 1.48 (s, 18H), 7.69–7.71(m, 2H), 8.45–8.51 (m, 4H); $^{13}$C NMR (CDCl$_3$): 30.88, 35.28 122.59, 122.93, 126.87, 128.00, 128.08, 129.88, 130.64, 149.77; M.p. 150–152° C.; FD-MS: m/z 368 (M$^+$).

Example 8

Synthesis of di-(2-(6-methoxynaphthyl)anthracene (Compound 8)

Magnesium turnings (5.55 g, 231 mmol), 30 mL THF, and two crystals of iodine were placed into a round-bottomed flask under nitrogen. The flask was heated to 50° C. and dibromoethane was used to help initiate the Grignard reaction. 2-Bromo-6-methoxy naphthalene (50.0 g, 211 mmol) in 400 mL of THF was added dropwise over 90 minutes during which time heat was increased to allow for gentle reflux. After addition, the reaction mixture was allowed to reflux for an additional 2 hours.

9,10-Dibromoanthracene (23.63 g, 70.3 mmol), 300 mL of THF and a catalytic amount of dichlorobis (triphenylphosphine)palladium (II) were all placed under nitrogen in a round bottomed flask. The Grignard reagent prepared above was then added via a double-end needle transfer while still warm. After the addition, the reaction mixture was allowed to reflux overnight. After cooling to room temperature, the precipitated solid was collected by vacuum filtration and washed with ether, THF, and water. The collected solid was placed into a beaker and HCl (6M) was added followed by ethanol. This mixture is stirred for 60 minutes and the solid is again collected by vacuum filtration. The product was washed until the washings are neutral. After drying, the solid is refluxed gently in CH$_2$Cl$_2$ for 60 minutes. The pure product was filtered and dried to give 85.2 g solid (82% yield) (AA8790-34). $^1$H NMR (CDCl$_3$) δ(ppm): 3.97 (s, 6H), 7.29 (dd, J$_1$=8.9 Hz, J$_2$=2.4 Hz, 2H), 7.40 (d, J=6.9 Hz 2H), 7.41 (d, J=6.9 Hz, 2H), 7.53 (d, J=2.2 Hz, 2H), 7.57 (d, J=8.0 Hz, 2H), 7.64 (d, J=6.8 Hz, 2H), 7.65 (d, J=6.8 Hz, 2H), 7.94 (d, J=9 Hz, 2H), 7.97 (s, 2H), 8.10 (d, J=8.4 Hz, 2H);. FD-MS: m/z 490 (M$^+$).

Example 9

Synthesis of synthesis of di-(2-(6-hydroxynaphthyl) anthracene (Compound 9)

Starting material (35.0 g, 71.4 mmol), pyridine hydrochloride (72.0 g, 682 mmol), and 105 mL of phenyl ether-biphenyl eutectic were placed under nitrogen in a round bottomed flask equipped with a condenser. The reaction was refluxed for 2 days and then cooled slightly. Hexane was added to prevent the mixture from solidifying and the mixture was stirred for 30 minutes. The solid was collected by vacuum filtration. The solid product was added to an Erlenmeyer with ethanol and heated at 70° C. for 2 hours. After cooling, the solid was collected by filtration and dried in an oven to give pure product 28.5 g (86% yield). The product was sublimed prior to polymerization. Elemental analysis: calcd. for C$_{34}$H$_{22}$O$_2$: C 88.30%, H, 4.80%; found: C 88.02%, H 4.91%.

Example 10

Synthesis of 2,6-di(2-ethylhexyloxy)anthraquinone (Compound 10)

2,6-Dihydroxyanthraquinone (100.0 g, 0.42 mol) and 2-ethylhexyl bromide (165.0 g, 0.86 mol) were dissolved in 1 L of DMF. To this solution was added anhydrous K$_2$CO$_3$ (120.0 g, 0.87 mol). The reaction was heated at 90° C. overnight. Most of DMF was removed and 500 mL of water was added. The reaction was extracted with ether (3×400 mL), washed with brine (1×200 mL), and dried over MgSO$_4$. Solvent was removed and the crude product was recrystallized from methanol to give yellow powdery product 125.2 g (65% yield). $^1$H NMR (CDCl$_3$) δ(ppm): 0.92–0.98 (m, 12H, CH$_3$), 1.34–1.54 (m, 16H), 1.75–1.81 (m, 2H, CH(CH$_3$)), 4.02 (d, J=5.5 Hz, 4H, OCH$_2$), 7.19 (d, J=8.4 Hz, 2H), 7.70 (s, 2H), 8.19 (d, J=8.5 Hz, 2H); $^{13}$C NMR (CDCl$_3$): 11.12, 14.06, 23.04, 23.88, 29.08, 30.51, 39.34, 71.34, 110.64, 120.84, 127.00, 129.62, 135.88, 164.29, 182.27. M.p. 49–51° C.; FD-MS: m/z 464 (M+).

Example 11

Synthesis of 2,6-di(2-ethylhexyloxy)anthracene (Compound 11)

To a 1 L round bottom flask was added tin (80.0 g, 0.67 mol), 2,6-di(2-ethylhexyloxy)anthraquinone 10 (75.0 g, 0.16 mol), and 375 mL of acetic acid. The reaction was refluxed for 2 h during which the reaction became a slurry. The reaction was cooled to room temperature and the top layer was decanted. The solid was washed with $CH_2Cl_2$. The combined organic phase was washed with water, saturated $NaHCO_3$ solution, and brine and dried over $MgSO_4$. Solvent was removed to yield 72.0 g of yellow solid. The yellow solid was dissolved in 200 mL of isopropanol and added dropwise to a solution of $NaBH_4$ (6.5 g, 0.17 mol) in 300 ml of isopropanol. The reaction was heated at reflux overnight. After cooled to room temperature, the reaction was quenched with dilute HCl solution and then poured into water. The yellow precipitate was collected by filtration, washed with water and ethanol and dried to give pure product was yellow powder 55.2 g (78% yield in two steps). $^1$H NMR ($CDCl_3$) δ(ppm): 0.92–1.62 (m, 14H, alkyl), 1.79–1.87 (m, 1 H, alkyl), 3.99 (d, J=5.7 Hz, 2H, $OCH_2$), 7.14 (d, J=9.4 Hz 2H), 7.17 (s, 2H, 1 and 5 of anthracene), 8.17 (s, 2H, 9 and 10 of anthracene); $^{13}$C NMR ($CDCl_3$): 11.19, 14.10, 23.10, 24.07, 29.18, 30.72, 39.44, 70.48, 104.58, 120.85, 124.09, 128.71, 129.06, 131.30, 156.22. M.p. 60–62° C.; FD-MS: m/z 436 (M+).

Example 12

Synthesis of 9,10-dibromo-2,6-di(2-ethylhexyloxy) anthracene (Compound 12)

2,6-Di(2-ethylhexyloxy)anthracene 11 (13.50 g, 0.031 mol) was added to 150 mL of DMF and cooled down to 0° C. To this suspension was added NBS (11.60 g, 0.065 mol) in 60 mL of DMF. Upon the addition of NBS, the reaction became clear and turned to dark green color. The reaction was stirred at room temperature under nitrogen overnight. The reaction was poured into 200 mL of water, and extracted with methylene chloride (3×300 mL). The combined organic phase was washed thoroughly with water (3×100 mL) and brine (1×100 mL), and dried over $MgSO_4$. After removal of the solvent, the dark brown residue was washed with hexane to collect greenish yellow crystals. The crude crystals were recrystallized from acetone to give flake like greenish yellow fluorescent product. The filtrates were combined and purified by chromatography on silica gel with hexane as eluent. Total yield: 5.5 g (30% yield). $^1$H NMR ($CDCl_3$) δ(ppm): 0.93–1.70 (m, 14H, alkyl), 1.81–1.89 (m, 1 H, alkyl), 3.12 (d, J=5.4 Hz, 2H, $OCH_2$), 7.34 (d, J=9.2 Hz, 2H), 8.00 (d, J=9.2 Hz, 2H), 8.71 (s, 2H, 1 and 5 of anthracene); $^{13}$C NMR ($CDCl_3$): 11.12, 14.10, 23.08, 23.93, 29.15, 30.52, 39.88, 72.76, 107.74, 117.02, 125.27, 129.51, 129.75, 130.12 152.87. M.p. 103–105° C.; FD-MS: m/z 590 (M+).

Synthesis of Polymers

Example 13

Synthesis of Polymer 26

2,2-Dimethyltrimethylene diboronate 3 (1.50 g, 2.0 mmol), 9,10-dibromoanthracene (0.68 g, 2.0 mmol), and Aliquat® 336 (0.11 g, 0.25 mmol) were dissolved in 8.6 mL of toluene. To this solution was added 2 M $Na_2CO_3$ aqueous solution (3.3 mL, 6.6 mmol). The reaction mixture was bubbled with dry nitrogen for 15 min and catalyst tetrakis (triphenylphosphine)palladium (71 mg, 3 mol %) was added. The reaction was heated under vigorous reflux for 24 h, and small amount of phenylboronic acid was added for end-capping of bromo group. The reaction was heated for 13 h and bromobenzene was added to end-cap boronate group. The reaction was heated for another 6 h and then poured into 200 mL of methanol. The precipitated polymer was washed with methanol, diluted HCl solution, and dried to give light yellow powdery polymer. The polymer was then extracted with acetone with a Sohxlet setup overnight to removed oligomer and residual catalyst. Polymer was re-precipitated from THF into methanol three times to give final polymer 1.00 g (71% yield).

Example 14

Synthesis of Polymer 28

The procedure used to prepare polymer 26 was followed. 2,2-Dimethyltrimethylene diboronate 3 (1.50 g, 2.0 mmol), 9,10-dibromo-2,6/2,7-di(t-butyl)anthracene 7 (0.91 g, 2.0 mmol), and Aliquat® 336 (0.11 g, 0.25 mmol) were dissolved in 8.6 mL of toluene. To this solution were added 2 M $Na_2CO_3$ aqueous solution (3.3 mL, 6.6 mmol) and palladium catalyst (71 mg, 3 mol %). After polymerization and purification 1.15 g of off-white polymer was obtained.

Example 15

Synthesis of Polymer 30

The procedure used to prepare polymer 26 was followed. 2,2-Dimethyltrimethylene diboronate 3 (1.50 g, 2.0 mmol), 9,10-dibromo-2,6-di(2-ethylhexyloxyl)anthracene 12 (1.21 g, 2.0 mmol), and Aliquat® 336 (0.11 g, 0.25 mmol) were dissolved in 8.6 ml of toluene. To this solution were added 2 M $Na_2CO_3$ aqueous solution (3.3 mL, 6.6 mmol) and palladium catalyst (71 mg, 3 mol %). After polymerization and purification polymer was obtained as greenish yellow solid.

Example 16

Synthesis of Polymer 47

Di-naphthanol 9 0.72 g (1.6 mmol) was dissolved in 12 mL of anhydrous pyridine and the mixture was cooled to 0° C. in an ice bath and stirred for 30 minutes. Di-acid chloride of 3-(4-carboxyphenyl)-2,3-dihydro-1,1,3-trimethyl-1H-Indene-5-carboxylic acid (0.56 g, 1.6 mmol) was added as solid and the reaction was stirred at room temperature for 3 hours, during which time the reaction became very viscous and formed gel like solid. The reaction was poured into 100 mL of 10% HCl aqueous solution and the precipitated polymer was filtered, washed with water and methanol. The polymer was re-dissolved in 70:30 (v/v) of methylene chloride and hexafluoroisopropanol (HFIP) mixed solvent and precipitated into ethanol. The off-white polymer was collected and dried, yield 1.00 g (86%).

Example 17

Synthesis of Polymer 8

The procedure used to prepare polymer 47 was followed. Di-naphthanol 9 (1.15 g, 2.5 mmol) reacted with dodecanedioyl dichloride (0.66 g, 2.5 mmol) in 16 mL of anhydrous pyridine to give 1.5 g of polymer as off-white solid (92% yield).

Example 18

Synthesis of Polymer 89

The procedure used to prepare polymer 47 was followed. Di-naphthanol 9 (0.99 g, 2.1 mmol) reacted with 5-(octadecyloxy)isophthaloyl dichloride (1.02 g, 2.1 mmol) in 16 mL of anhydrous pyridine to give 1.6 g of polymer as off-white solid (87% yield).

Example 19

Synthesis of Polymer 52

Di-naphthanol 9 (0.66 g, 1.4 mmol) was dissolved in 12 mL of anhydrous NMP and triethyamine (0.32 g, 3.2 mmol) was added. The mixture was cooled to 0° C. and stirred for 30 minutes. 4,4-(Hexafluoroisopropylidene)bis(benzoyl chloride) (0.61 g, 1.4 mmol) was added as solid. The reaction became viscous and was stirred at room temperature overnight. The mixture was poured into 150 mL of water. The precipitated polymer was filtered and re-dissolved in 3/7 HFIP/methylene chloride and precipitated into methanol. After two more precipitation, the polymer was collected and dried as off-white solid, yield 1.00 g (88%).

Example 20

Synthesis of Polymer 44

The procedure used to prepare polymer 52 was followed. Di-naphthanol 9 (1.00 g, 2.2 mmol) reacted with bisphenol A bis(chloroformate) (0.78 g, 2.2 mmol) in 20 mL of anhydrous NMP in the presence of triethylamine (0.48 g, 0.47 mmol) to give 1.3 g of polymer as off-white solid (90% yield).

EL Device Fabrication and Performance

Example 21

An EL device satisfying the requirements of the invention was constructed in the following manner. The organic EL medium has single layer of polymer thin film.

(a) An indium-tin-oxide (ITO) coated glass substrate was sequentially ultra-sonicated in a commercial detergent, rinsed with deionized water, degreased in toluene vapor and exposed to ultraviolet light and ozone for a few minutes.

(b) A polymer solution (30 mg in 30 mL of solvent) was filtered through a 2 μm PTFE filter. The polymer solution was then spin-coated onto ITO under a controlled spinning speed. The thickness of the polymer film was between 500–700 Angstroms.

(c) On top of the polymer film was deposited a cathode layer 2000 Angstroms thick consisting of a 10:1 atomic ratio of Mg and Ag.

The above sequence completed the deposition of the EL device. The device was then hermetically packaged in a dry glove box for protection against ambient environment.

The blue light output from EL device was about 50 cd/m² at about 10 V.

Figure 6:
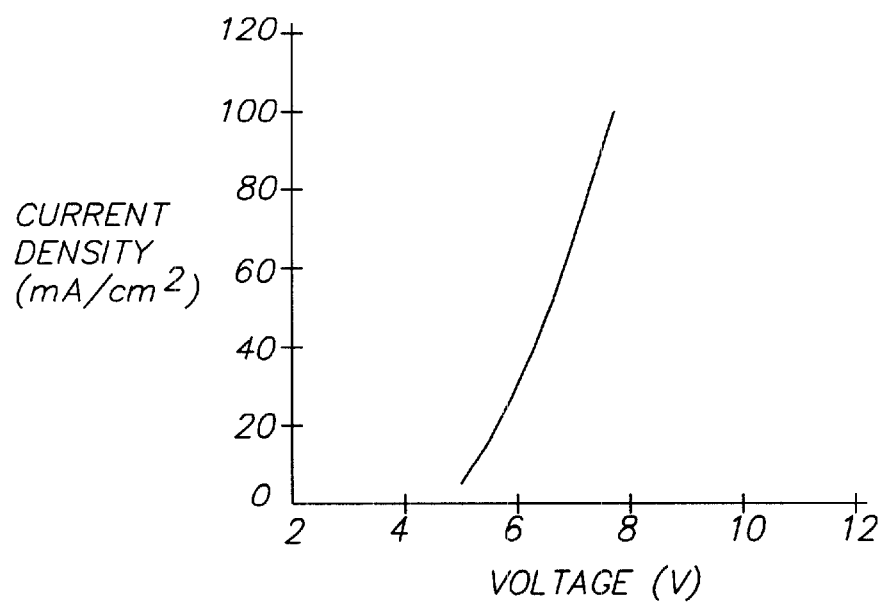
FIG. 6 illustrates the voltage-current density and luminance characteristics of a single-layer EL device fabricated from polymer 28.
Figure 4:
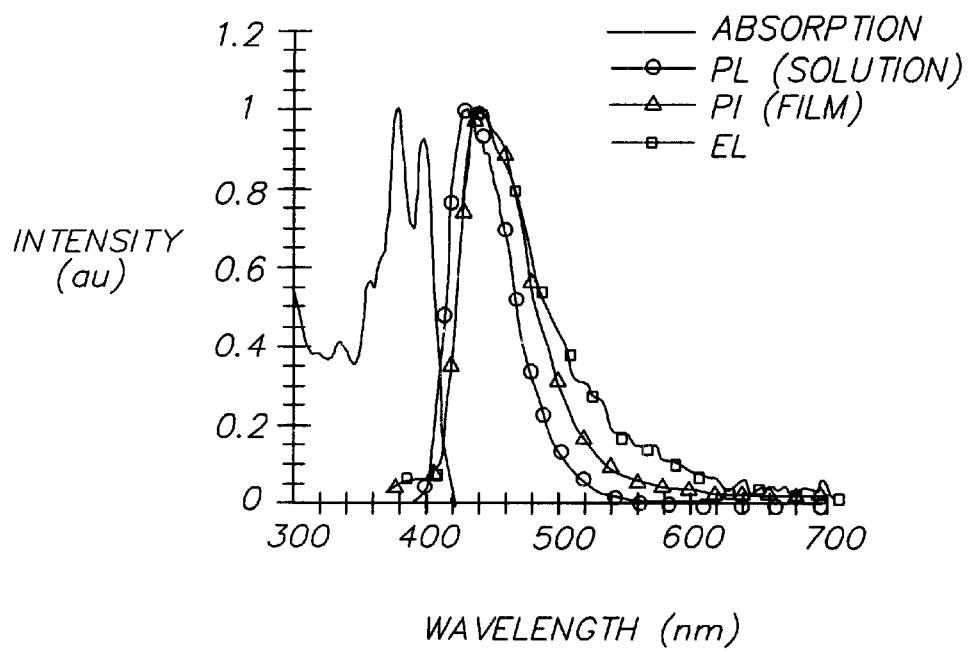
FIG. 4 illustrates the absorption and photoluminescence spectra of polymer 26 and eletroluminescence spectrum of single-layer EL device fabricated from polymer 26.
Figure 5:
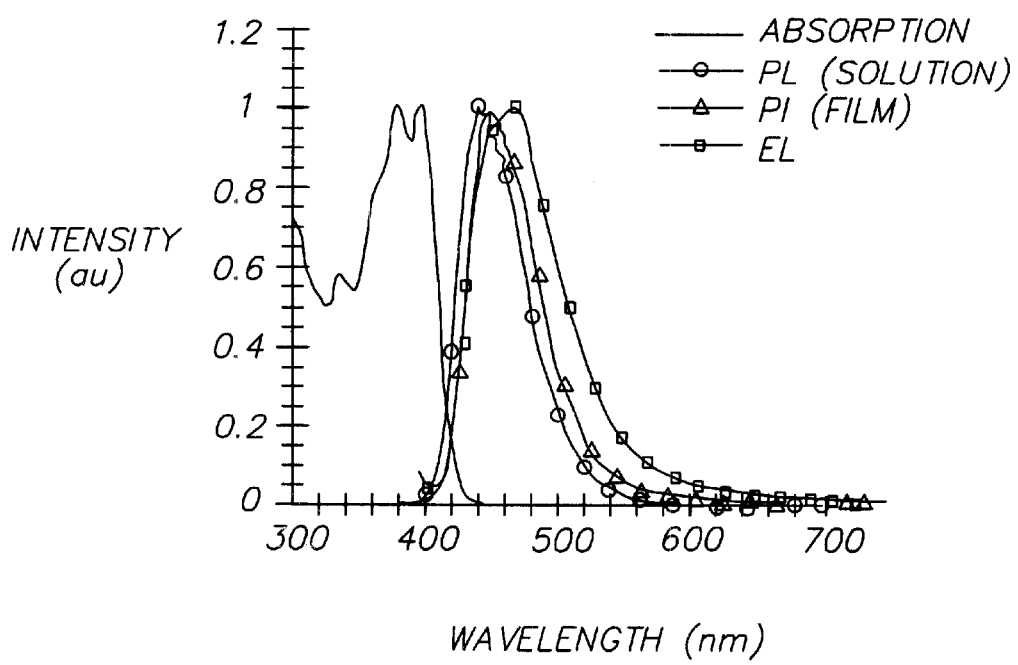
FIG. 5 illustrates the absorption and photoluminescence spectra of polymer 28 and eletroluminescence spectrum of single-layer EL device fabricated from polymer 28.

Table 1 summarizes the characterization of the polymers prepared in the present invention. Polymers have reasonable molecular weights and show high onset thermal decomposition temperature $T_d$. UV and photoluminescence (PL) spectra were obtained from dilute solutions and solid thin films of the polymers and EL spectra were obtained from ITO/polymer/Mg:Ag EL devices. The fabrication of EL devices was illustrated in example 21. FIGS. 4 and 5 show the UV, PL and El spectra of polymers 26 and 28 respectively. The voltage-current characteristics of the EL device of polymer 28 is shown in FIG. 6.

TABLE 1

Characterization of polymers according to Examples.

| Polymer | $M_w$ | $T_d$ (° C.) | $T_g$ (° C.) | UV ($\lambda_{max}$nm) | PL ($\lambda_{max}$nm) | EL ($\lambda_{max}$nm) |
|---|---|---|---|---|---|---|
| 26 | 9,680 [a] | 353 | 86 | 379 | 441 | 468 |
| 28 | 10,000 [a] | 412 | 112 | 379 | 449 | 468 |
| 30 | 17,600 [a] | 390 | 46 | 416 | 464 [d] | — |
| 8 | 10,800 [b] | 400 | 98 | 378 | 449 | — |
| 44 | 9,270 [b] | 425 | 137 | 378 | 448 | — |
| 47 | 27,400 [b] | 428 | NO [c] | 378 | 448 | — |
| 52 | 23,900 [b] | 500 | 232 | 378 | 448 | — |
| 89 | 52,800 [b] | 415 | 135 | 379 | 448 | — |

[a] weight average molecular weight, determined by size exclusion chromatography in THF using polystyrene standard.
[b] weight average molecular weight, determined by size exclusion chromatography in 20/80 dichloroacetic acid/dichloromethane containing 0.01M tetrabutylammonium acetate using polystyrene standard.
[c] not observed
[d] excited at 400 nm, the rest of polymer films were excited at 370 nm; both UV and PL are measured in dilute toluene solution.

The invention has been described in detail with particular reference to certain preferred embodiments thereof but it will be understood that variations and modifications can be effected within the spirit and scope of the invention.

PARTS LIST

10 substrate
30 hole transport layer
40 electron transport layer
50 electroluminescent medium
60 cathode
100 substrate
200 anode
300 hole transport layer
400 emissive layer
500 electron transport layer
600 electroluminescent medium
700 cathode
1000 substrate
2000 anode
3000 emitting layer
4000 cathode

What is claimed is:

1. An electroluminescent device comprises an anode, a cathode, and a polymeric luminescent material disposed between the anode and cathode, the polymeric luminescent material including a 9,10-di-(2-naphthyl)anthracene-based polymer of the following formula:

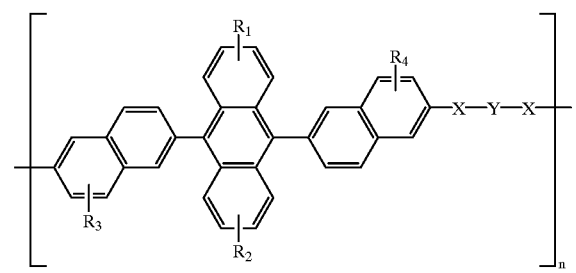

wherein:
  $R_1$, $R_2$, $R_3$, and $R_4$ are each individually hydrogen, or alkyl, or alkoxy of from 1 to 24 carbon atoms; aryl or substituted aryl of from 6 to 28 carbon atoms; or heteroaryl or substituted heteroaryl of from 4 to 40 carbons; or F, Cl, or Br; or a cyano group; or a nitro group;

X is a linking group;

n is greater than 1; and

Y includes one or more comonomer units that are a substituted or unsubstituted alkyl, alkenyl, aryl, or heteroaryl or a conjugated group.

2. The electroluminescent device of claim 1, wherein Y is alkyl which includes from 1 to 24 carbon atoms.

3. The electroluminescent device of claim 1, wherein Y contains at least one selected from the group consisting of N, S, F, Cl, Br and Si.

4. The electroluminescent device of claim 1, wherein the polymeric luminescent material has one of the following structures:

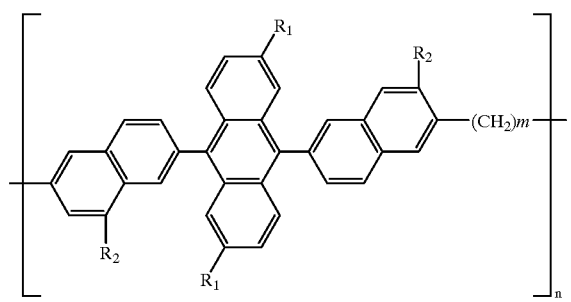

$R_1$=2-ethylhexyloxy, $R_2$=H, m=6
$R_1$=n-hexyl, $R_2$=n-hexyloxy, m=4
$R_1$=t-butyl, $R_2$=n-hexyloxy, m=6
n is greater than 1;

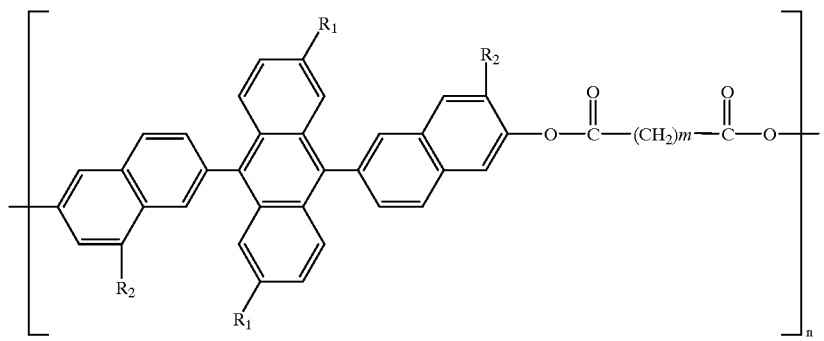

$R_1$=2-ethylhexyloxy, $R_2$=H, m=6
$R_1$=n-hexyl, $R_2$=n-hexyloxy, m=4
$R_1$=t-butyl, $R_2$=n-hexyloxy, m=6
$R_1$=$R_2$=n-hexyl, m=8
$R_1$=$R_2$=H, m=12;
n is greater than 1;

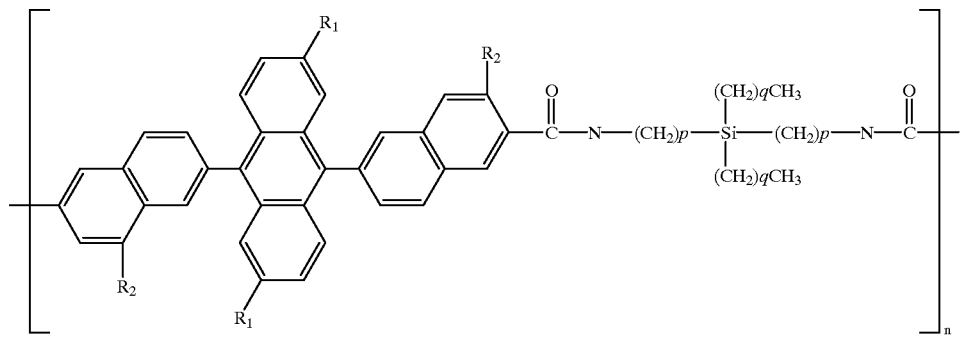

$R_1$=H, $R_2$=2-ethylhexyloxy, p=4, q=3
$R_1$=n-hexyl, $R_2$=t-butyl, p=4, q=3
$R_1$=n-hexyl, $R_2$=t-butyl, p=4, q=5;
n is greater than 1;

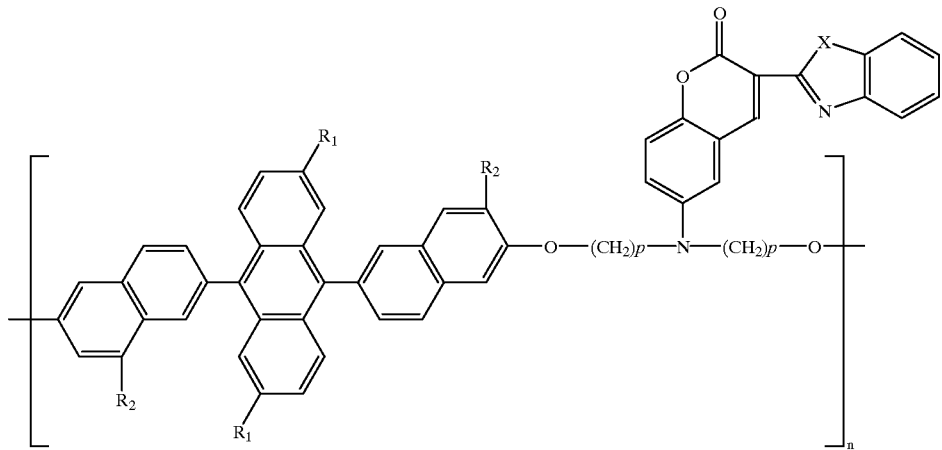
R$_1$=H, R$_2$=2-ethylhexyloxy, X=O, p=6
R$_1$=n-hexyl, R$_2$=2-ethylhexyloxy, X=O, p=4
R$_1$=2-ethylhexyl, R$_2$=t-butyl, X=S, p=4
R$_1$=n-hexyoxy, R$_2$=t-butyl, X=S, p=4;
n is greater than 1;
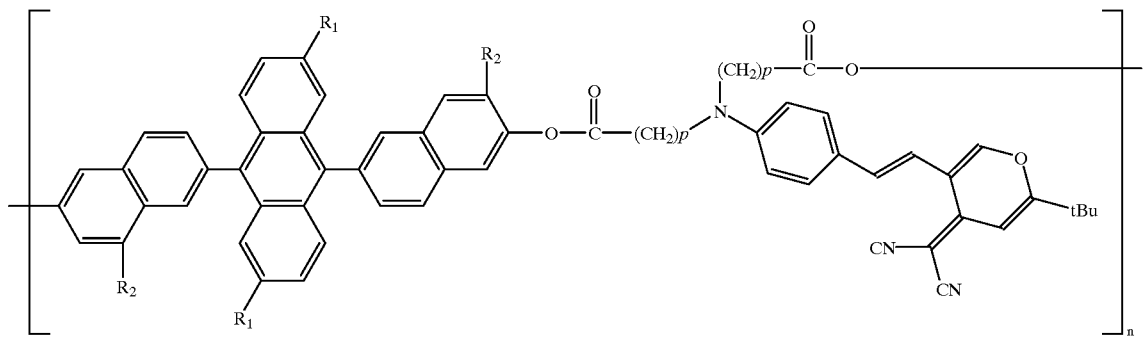
R$_1$=H, R$_2$=2-ethylhexyloxy, p=6
R$_1$=n-hexyl, R$_2$=2-ethylhexyloxy, p=4
R$_1$=2-ethylhexyl, R$_2$=t-butyl, p=4
R$_1$=2-ethylhexyloxy, R$_2$=H, p=4;
n is greater than 1;
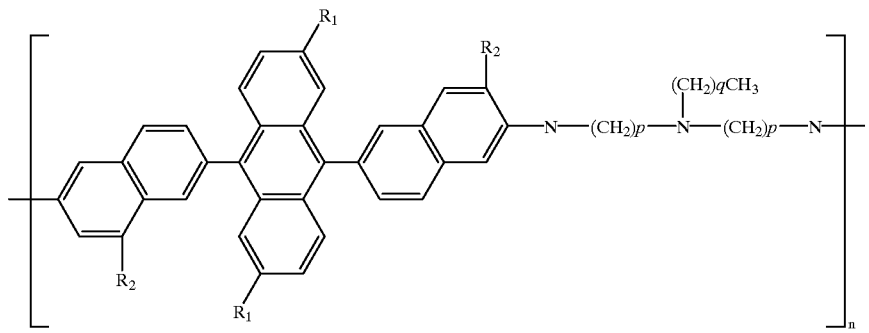

$R_1$=2-ethylhexyloxy, $R_2$=H, p=4, q=3
$R_1$=t-butyl, $R_2$=2-ethylhexyl, p=4, q=5
$R_1$=n-hexyl, $R_2$=2-ethylhexyloxy, p=4, q=5;
n is greater than 1;

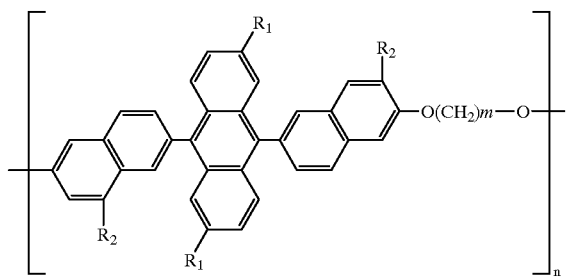

$R_1$=2-ethylhexyloxy, $R_2$=H, m=8
$R_1$=t-butyl, $R_2$=2-ethylhexyl, m=4
$R_1$=n-hexyl, $R_2$=2-ethylhexyloxy, m=2;
n is greater than 1; or

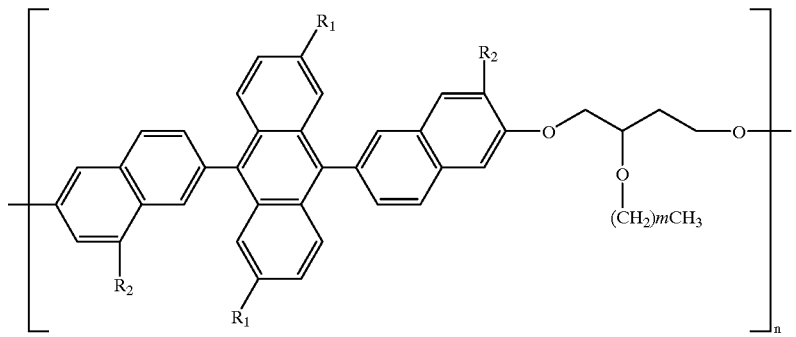

$R_1$=$R_2$=H, m=11
$R_1$=t-butyl, $R_2$=2-ethylhexyl, m=7
$R_1$=t-butyl, $R_2$=H, m=11
$R_1$=n-hexyl, $R_2$=2-ethylhexyloxy, m=5
$R_1$=2-ethylhexyloxy, $R_2$=H, m=11 n is greater than 1.

5. The electroluminescent device of claim 1, wherein Y is
—(Ar$_1$)—Z—(Ar$_2$)—
wherein:
$Ar_1$ and $Ar_2$ are substituted or unsubstituted aromatic groups containing 6 to 28 carbon atoms,
Z is a divalent linking groups containing 0 to 12 carbon atoms.

6. The electroluminescent device of claim 5 wherein Z contains N, Si, O, Cl, F, Br, or S atoms.

7. An electroluminescent device comprises an anode, a cathode, and a polymeric luminescent material disposed between the anode and cathode, the polymeric luminescent material including a 9,10-di-(2-naphthyl)anthracene-based polymer having one of the following formulas:

$R_1$=2-ethylhexyloxy, $R_2$=$R_3$=H, p=6
$R_1$=$R_3$=H, $R_2$=2-ethylhexyloxy, p=12
$R_1$=n-hexyl, $R_2$=$R_3$=H, p=12
$R_1$=t-butyl, $R_2$=$R_3$=n-hexyl, p=6;

n is greater than 1;

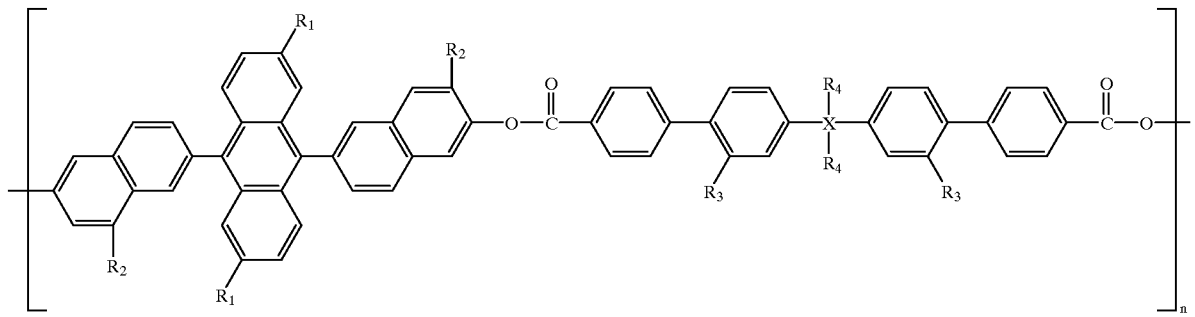

R$_1$=2-ethylhexyloxy, R$_2$=R$_3$=H, R$_4$=CH$_3$, X=C
R$_1$=2-ethylhexyloxy, R$_2$=R$_3$=H, R$_4$=CF$_3$, X=C
R$_1$=t-butyl, R$_2$=2-ethylhexyloxy, R$_4$=CF$_3$, R$_3$=H, X=C
R$_1$=n-hexyl, R$_2$=n-hexyloxy, R$_3$=H, R$_4$=CF$_3$, X=C
R$_1$=t-butyl, R$_2$=2-ethylhexyloxy, R$_3$=H, R$_4$=CF$_3$, X=Si
R$_1$=H, R$_2$=2-ethylhexyloxy, R$_3$=H, R$_4$=CF$_3$, X=Si;
n is greater than 1;

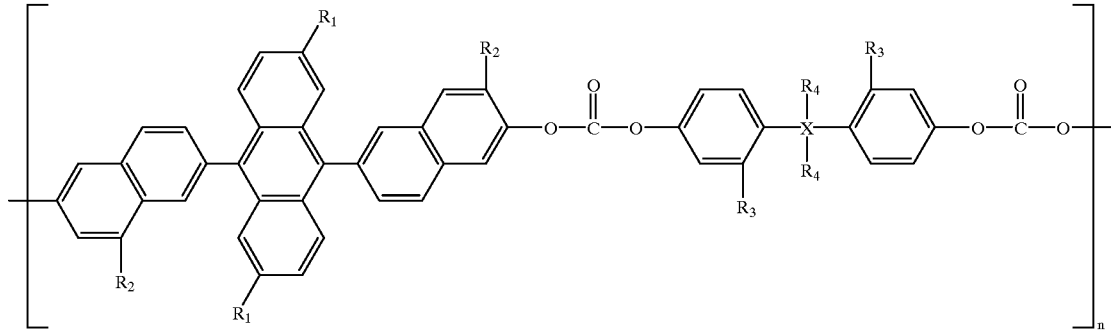

R$_1$=2-ethylhexyloxy, R$_2$=R$_3$=H, R$_4$=CH$_3$, X=C
R$_1$=2-ethylhexyloxy, R$_2$=R$_3$=H, R$_4$=CF$_3$, X=C
R$_1$=t-butyl, R$_2$=2-ethylhexyloxy, R$_3$=H, R$_4$=CF$_3$, X=Si
R$_1$=R$_2$=R$_3$=H, R$_4$=CH$_3$, X=C
polyR$_1$=H, R$_2$=2-ethylhexyloxy, R$_3$=H, R$_4$=CF$_3$, X=Si;
n is greater than 1;

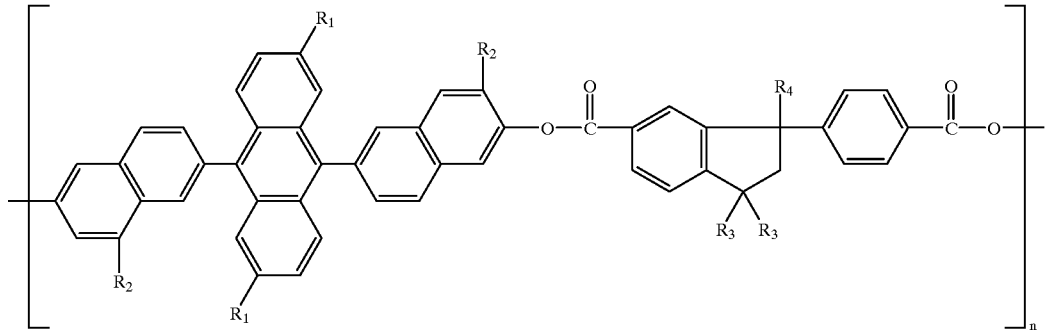

R$_1$=2-ethylhexyloxy, R$_2$=H, R$_3$=R$_4$=CH$_3$
R$_1$=R$_2$=H, R$_3$=R$_4$=CH$_3$

63

$R_1$=H, $R_2$=2-ethylhexyloxy, $R_3$=n-butyl, $R_4$=$CH_3$;
n is greater than 1;

64

$R_1$=2-ethylhexyloxy, $R_2$=H, $R_3$=n-hexyl
$R_1$=2-ethylhexyloxy, $R_2$=H, $R_3$=n-hexyl

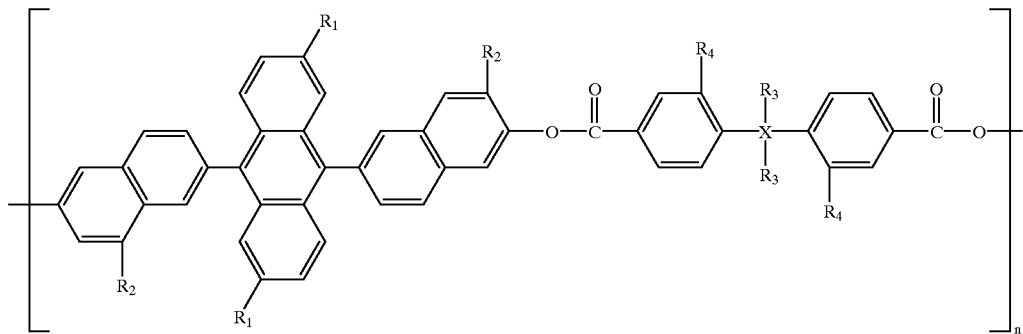

$R_1$=2-ethylhexyloxy, $R_2$=H, $R_3$=$CH_3$, $R_4$=H, X=C
$R_1$=t-butyl, $R_2$=n-hexyloxy, $R_3$=$CH_3$, $R_4$=H, X=C
$R_1$=t-butyl, $R_2$=n-hexyloxy, $R_3$=n-butyl, $R_4$=H, X=Si
$R_1$=$R_2$=$R_4$=H, $R_3$=$CF_3$, X=C
$R_1$=H, $R_2$=2-ethylhexyloxy, $R_3$=$CH_3$, $R_4$=n-butyl, X=Si;
n is greater than 1;

$R_1$=2-ethylhexyloxy, $R_2$=H, $R_3$=n-hexyl
$R_1$=t-butyl, $R_2$=H, $R_3$=2-ethylhexyl
$R_1$=H, $R_2$=n-hexyloxy, $R_3$=n-hexyl
$R_1$=2-ethylhexyloxy, $R_2$=H, $R_3$=4-methyloxyphenyl;
n is greater than 1;

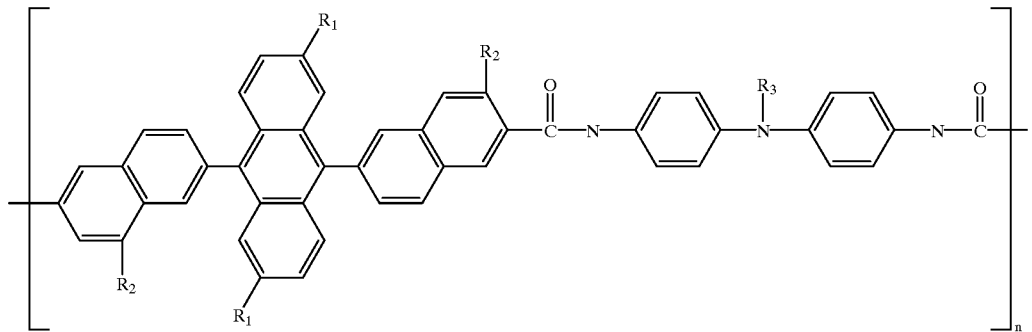

$R_1$=2-ethylhexyloxy, $R_2$=n-butyl, $R_3$=phenyl
$R_1$=t-butyl, $R_2$=n-hexyloxy, $R_3$=phenyl
poly$R_1$=2-ethylhexyloxy, $R_2$=H, $R_3$=n-butyl
$R_1$=n-hexyl, $R_2$=2-ethylhexyloxy, $R_3$=phenyl;
n is greater than 1;

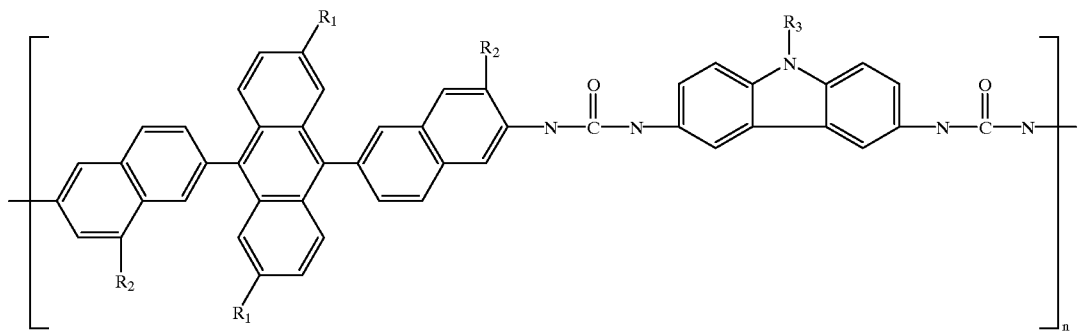

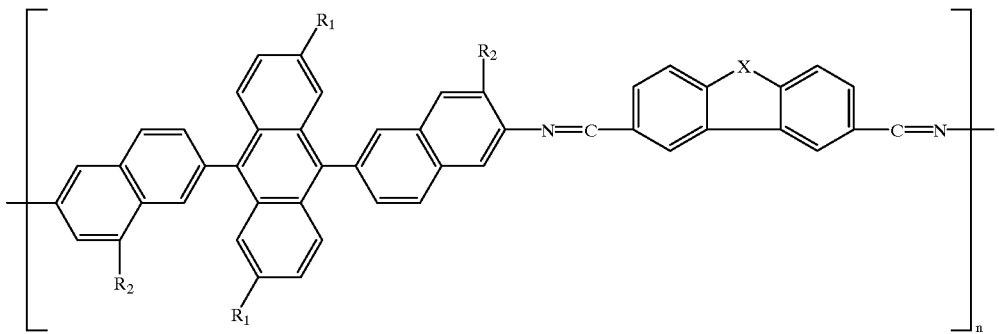

R₁=2-ethylhexyloxy, R₂=H, X=O
R₁=2-ethylhexyloxy, R₂=H, X=S
R₁=t-butyl, R₂=n-hexyloxy, X=O
R₁=2-ethylhexyloxy, R₂=n-hexyl, X=O;
n is greater than 1;

R₁=2-ethylhexyloxy, R₂=H
R₁=t-butyl, R₂=n-hexyloxy
R₁=R₂=n-hexyl
R₁=2-ethylhexyloxy, R₂=t-butyl;
n is greater than 1;

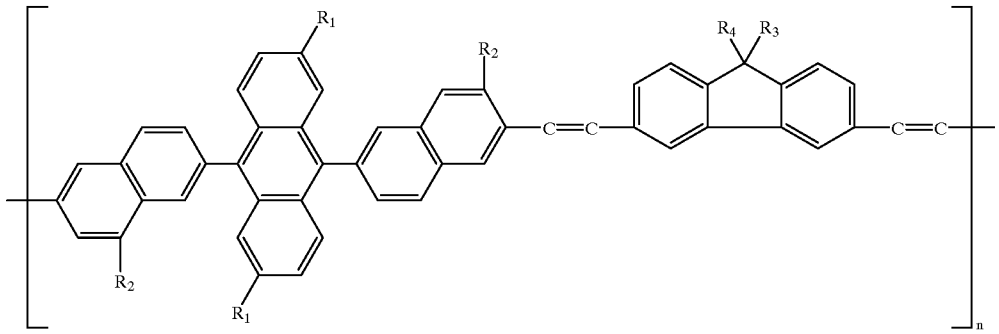

R₁=2-ethylhexyloxy, R₂=H, R₃=R₄=n-hexyl
R₁=n-hexyl, R₂=H, R₃=R₄=n-hexyl
R₁=t-butyl, R₂=n-hexyl, R₃=R₄=4-methyloxyphenyl
R₁=R₂=n-hexyloxy, R₃=R₄=n-hexyl;
n is greater than 1;

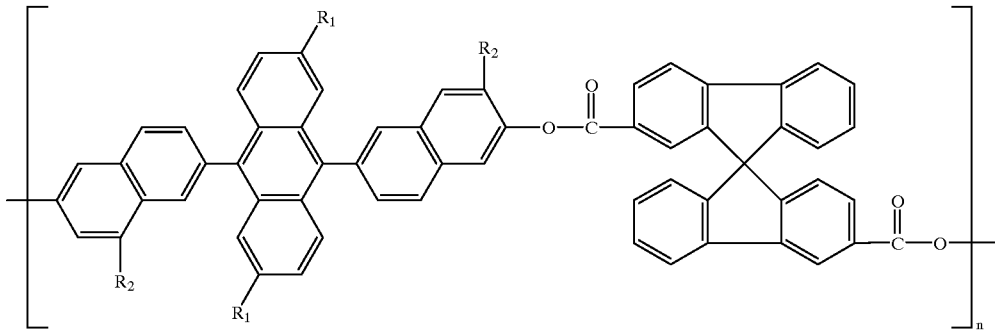

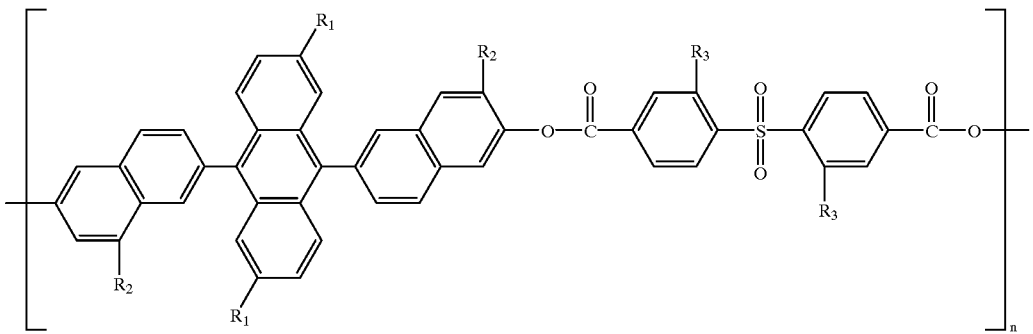

R$_1$=2-ethylhexyloxy, R$_2$=R$_3$=H
R$_1$=R$_2$=n-hexyl, R$_3$=H
R$_1$=t-butyl, R$_2$=n-hexyloxy, R$_3$=H
R$_1$=t-butyl, R$_2$=R$_3$=n-hexyloxy;
n is greater than 1; or

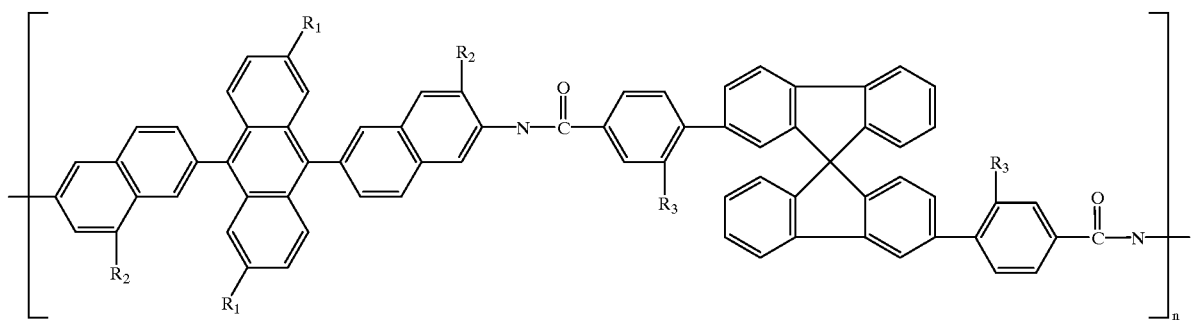

R$_1$=2-ethylhexyloxy, R$_2$=R$_3$=H
R$_1$=t-butyl, R$_2$=n-hexyl, R$_3$=n-hexyloxy
R$_1$=t-butyl, R$_2$=n-hexyloxy, R$_3$=H
R$_1$=2-ethylhexyloxy, R$_2$=H, R$_3$=n-hexyloxy
n is greater than 1.

8. The electroluminescent device of claim 1, wherein Y is an aryl hydrocarbon:

─(Ar)─ wherein:
Ar is substituted or unsubstituted aryl groups with 6 to 28 carbon atoms.

9. An electroluminescent device comprises an anode, a cathode, and polymeric luminescent material disposed between the anode and cathode, the polymeric luminescent material including a 9,10-di-(2-naphthyl)anthracene-based polymer having one of the following formulas:

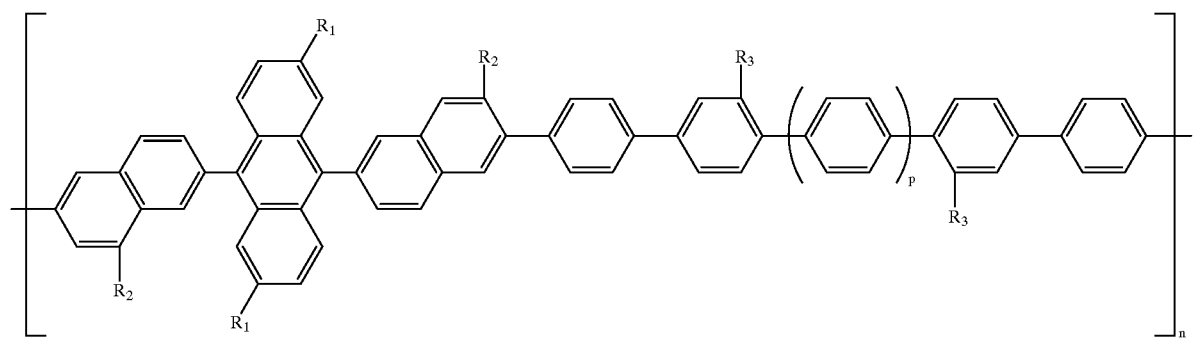

R$_1$=2-ethylhexyloxy, R$_2$=R$_3$=H, p=0
R$_1$=R$_2$=n-hexyl, R$_3$=H, p=1
R$_1$=t-butyl, R$_2$=n-hexyloxy, R$_3$=H, p=2
R$_1$=t-butyl, R$_2$=R$_3$=n-hexyloxy, p=1
n is greater than 1

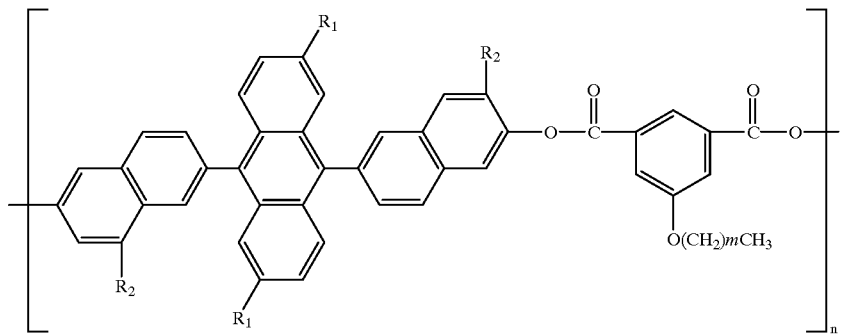

R₁=2-ethylhexyloxy, R₂=H, m=5
R₁=n-hexyl, R₂=H, m=17
R₁=t-butyl, R₂=n-hexyloxy, m=7
R₁=t-butyl, R₂=R₃=n-hexyloxy, m=9
n is greater than 1

R₁=t-butyl, R₂=n-hexyloxy, R₃=R₄=H
R₁=2-ethylhexyl, R₂=R₄=H, R₃=n-hexyloxy
R₁=2-ethylhexyloxy, R₂=R₃=n-hexyloxy, R₄=H
R₁=n-hexyl, R₂=R₃=n-hexyloxy, R₃=R₄=H
n is greater than 1

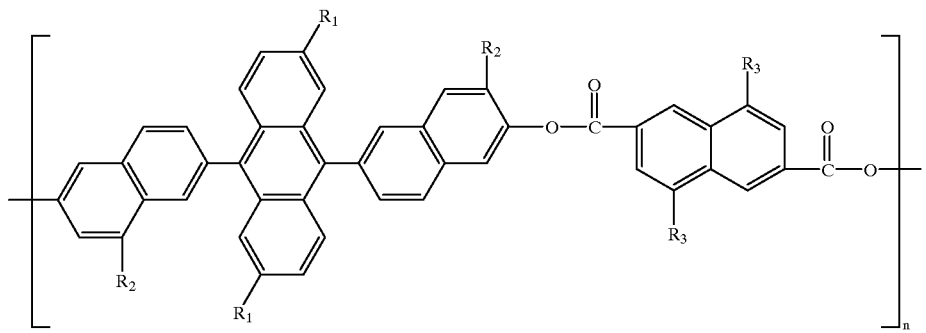

R₁=2-ethylhexyloxy, R₂=R₃=H
R₁=R₂=n-hexyl, R₃=H
R₁=t-butyl, R₂=R₃=n-hexyloxy
R₁=t-butyl, R₂=n-hexyloxy, R₃=H
n is greater than 1

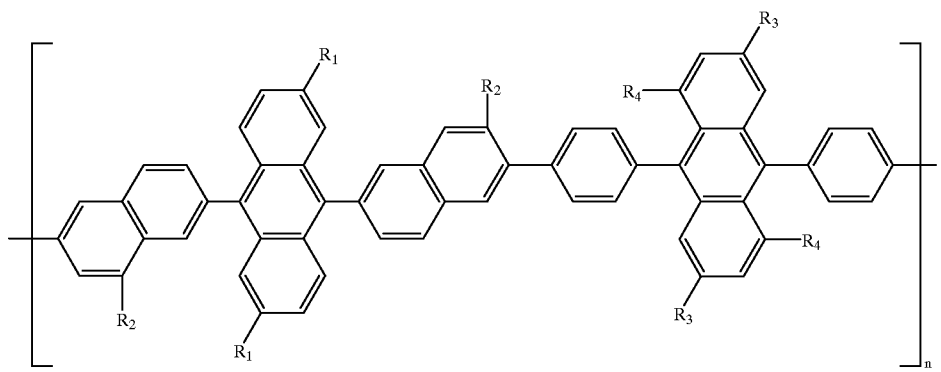

71

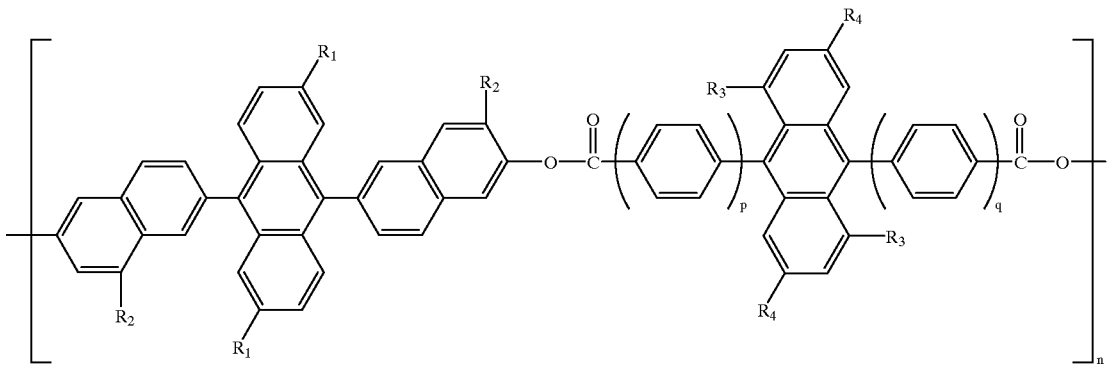

R₁=t-butyl, R₂=n-hexyloxy, R₃=R₄=H, p=q=1
R₁=2-ethylhexyl, R₂=R₄=H, R₃=n-hexyloxy, p=q=1
R₁=2-ethylhexyloxy, R₂=R₃=n-hexyloxy, R₄=H, p=q=2
R₁=n-hexyl, R₂=R₃=n-hexyloxy, R₄=H, p=q=2
R₁=2-ethylhexyloxy, R₂=R₃=H, R₄=n-hexyl, p=q=2
R₁=n-hexyl, R₂=R₄=n-hexyloxy, R₃=H, p=q=2
n is greater than 1

72

R₁=2-ethylhexyloxy, R₂=R₃=H
R₁=R₂=n-hexyl, R₃=H
R₁=t-butyl, R₂=R₃=n-hexyloxy
R₁=2-ethylhexyloxy, R₂=H, R₃=n-hexyloxy
n is greater than 1

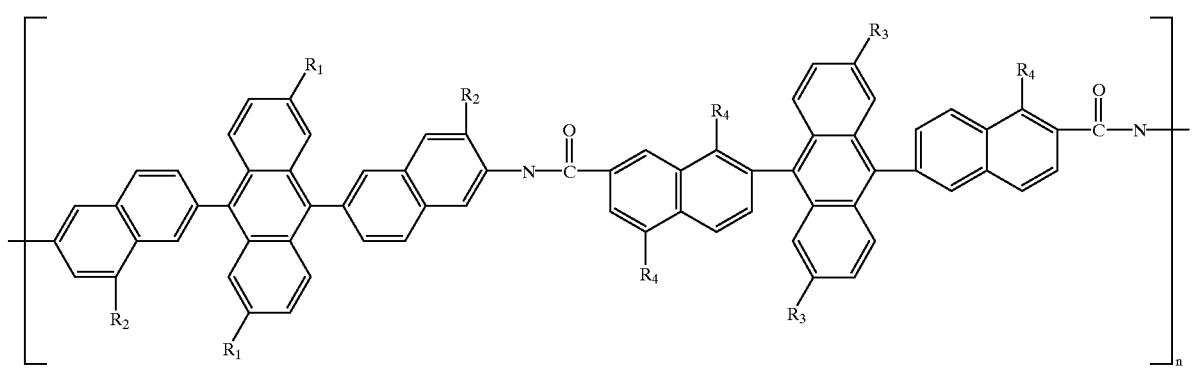

R₁=t-butyl, R₂=n-hexyloxy, R₃=R₄=H
R₁=2-ethylhexyl, R₂=R₄=H, R₃=n-hexyloxy
R₁=2-ethylhexyloxy, R₂=R₃=n-hexyloxy, R₄=H
R₁=n-hexyl, R₂=R₃=n-hexyloxy, R₃=R₄=H
n is greater than 1

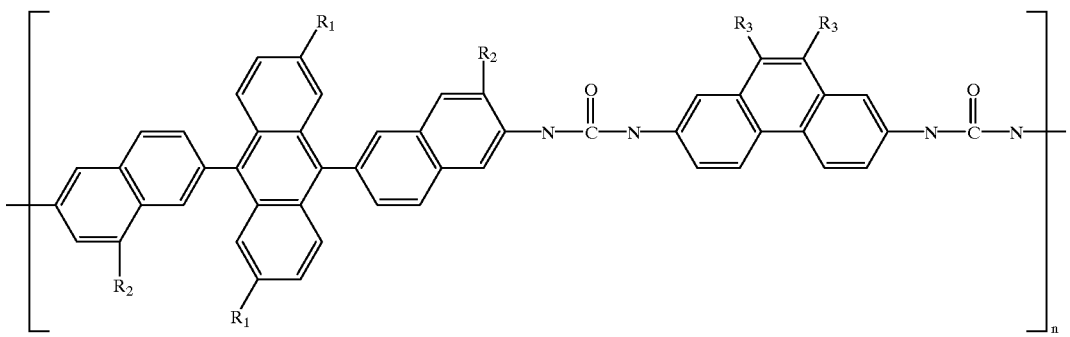

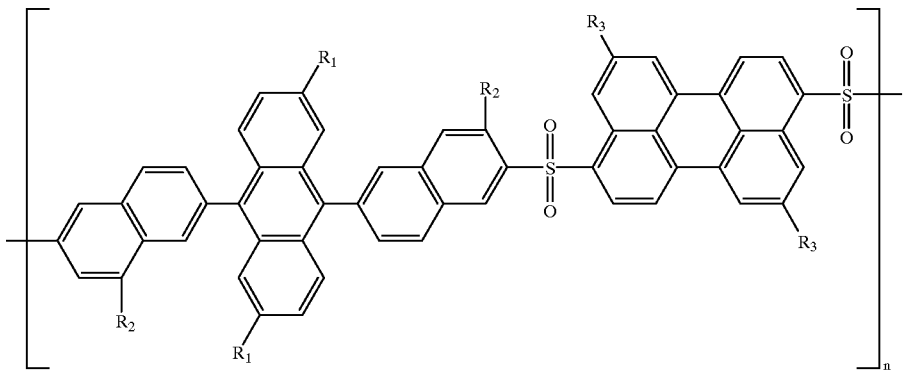
R₁=2-ethylhexyloxy, R₂=R₃=H
R₁=2-ethylhexyloxy, R₂=n-hexyl, R₃=H
R₁=t-butyl, R₂=R₃=n-hexyl
n is greater than 1
R₁=2-ethylhexyloxy, R₂=n-hexyl, R₃=H
R₁=R₂=R₃=n-hexyl
R₁=R₃=2-ethylhexyloxy, R₂=H
n is greater than 1
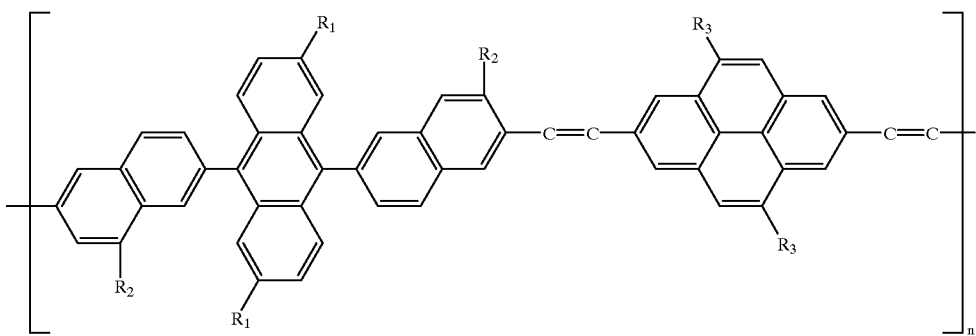
R₁=2-ethylhexyloxy, R₂=R₃=H
R₁=2-ethylhexyloxy, R₂=n-hexyl, R₃=H
R₁=t-butyl, R₂=R₃=n-hexyl
R₁=2-ethylhexyloxy, R₂=H, R₃=n-hexyl
n is greater than 1
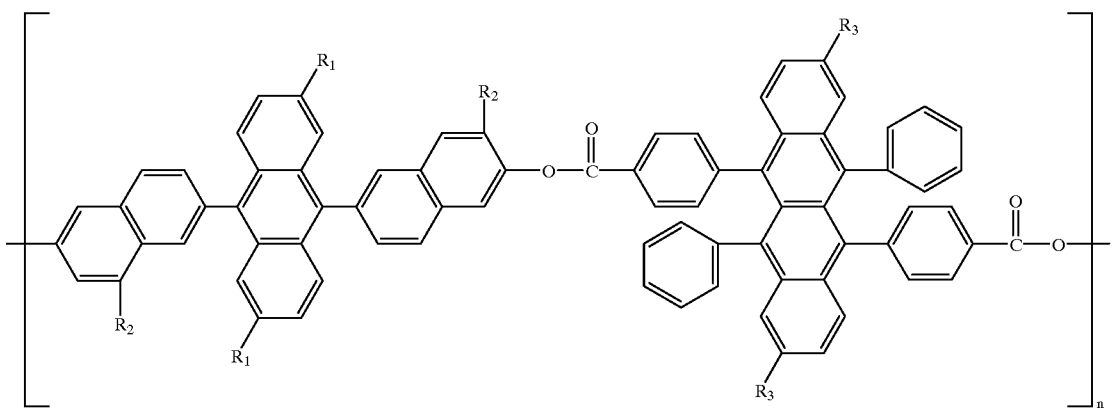

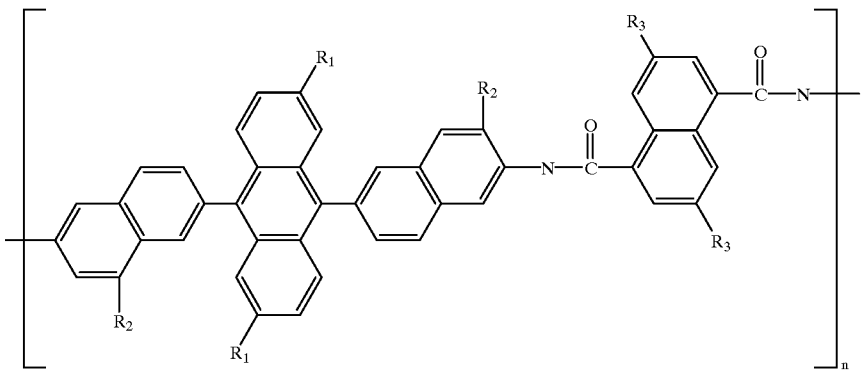

$R_1$=2-ethylhexyloxy, $R_2$=n-hexyl, $R_3$=H
$R_1$=$R_2$=$R_3$=n-hexyl
$R_1$=$R_3$=2-ethylhexyloxy, $R_2$=H
$R_1$=2-ethylhexyloxy, $R_2$=$R_3$=H
n is greater than 1.

10. An electroluminescent device comprises an anode, a cathode, and polymeric luminescent material disposed between the anode and cathode, the polymeric luminescent material including a 9,10-di-(2-naphthyl)anthracene-based polymer of the following formula:

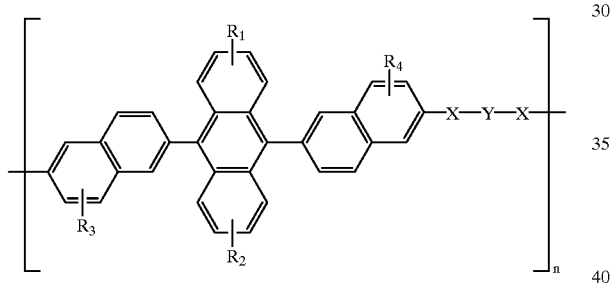

wherein:

$R_1$, $R_2$, $R_3$, and $R_4$ are each individually hydrogen, or alkyl, or alkoxy of from 1 to 24 carbon atoms; aryl or substituted aryl of from 6 to 28 carbon atoms; or heteroaryl or substituted heteroaryl of from 4 to 40 carbons; or F, Cl, or Br; or a cyano group; or a nitro group.

X is a linking group;
n is greater than 1; and
Y comprises the following formula

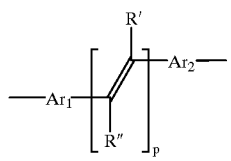

wherein:

$Ar_1$ and $Ar_2$ are substituted or unsubstituted aryl groups with 6 to 28 carbon atoms;
R' and R" are hydrogen, or alkyl group containing 1 to 12 carbon atoms, or Cl, Br, or F, or a cyano group; and
p is an integer from 1 to 3.

11. An electroluminescent device comprises an anode, a cathode, and polymeric luminescent material disposed between the anode and cathode, the polymeric luminescent material including a 9,10-di-(2-naphthyl)anthracene-based polymer having one of the following formulas:

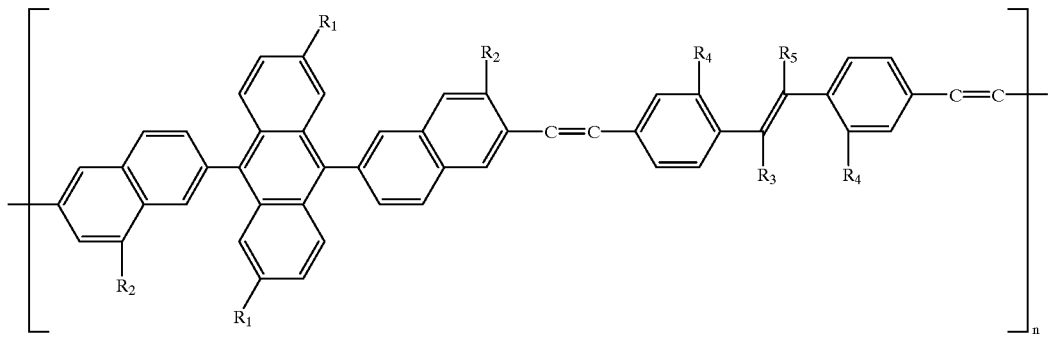

$R_1$=2-ethylhexyloxy, $R_2$=$R_3$=$R_4$=$R_5$=H
$R_1$=2-ethylhexyloxy, $R_2$=n-hexyl, $R_3$=$R_4$=$R_5$=H
$R_1$=t-butyl, $R_2$=n-hexyl, $R_3$=$R_5$=H, $R_4$=n-hexyloxy
$R_1$=2-ethylhexyloxy, $R_2$=$R_4$=$R_5$=H, $R_3$=CN
$R_1$=2-ethylhexyloxy, $R_2$=n-hexyl, $R_3$=CN, $R_4$=$R_5$=H;
n is greater than 1;

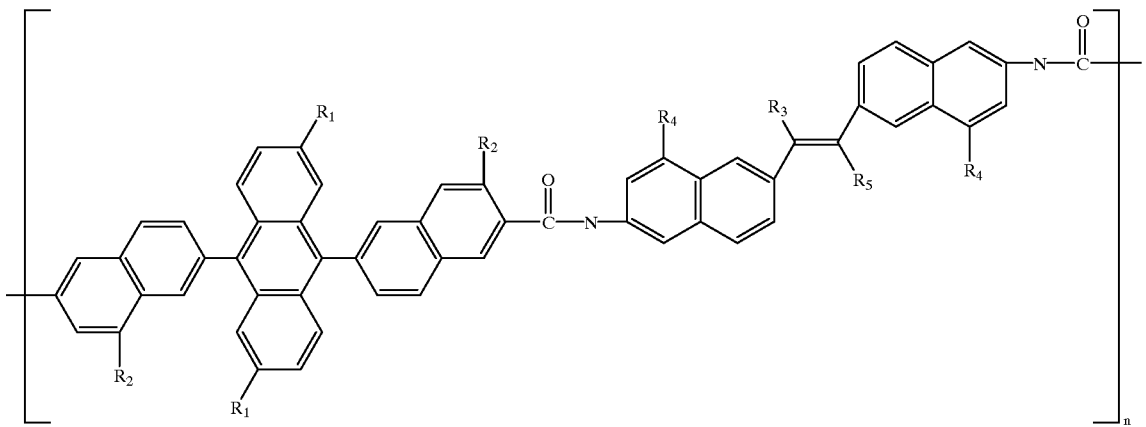

$R_1$=2-ethylhexyloxy, $R_2$=$R_3$=$R_4$=$R_5$=H
$R_1$=2-ethylhexyloxy, $R_2$=n-hexyl, $R_3$=$R_4$=$R_5$=H
$R_1$=t-butyl, $R_2$=n-hexyl, $R_3$=$R_5$=H, $R_4$=n-hexyloxy
$R_1$=2-ethylhexyloxy, $R_2$=$R_4$=$R_5$=H, $R_3$=CN
$R_1$=2-ethylhexyloxy, $R_2$=n-hexyl, $R_3$=CN, $R_4$=$R_5$=H;
n is greater than 1;

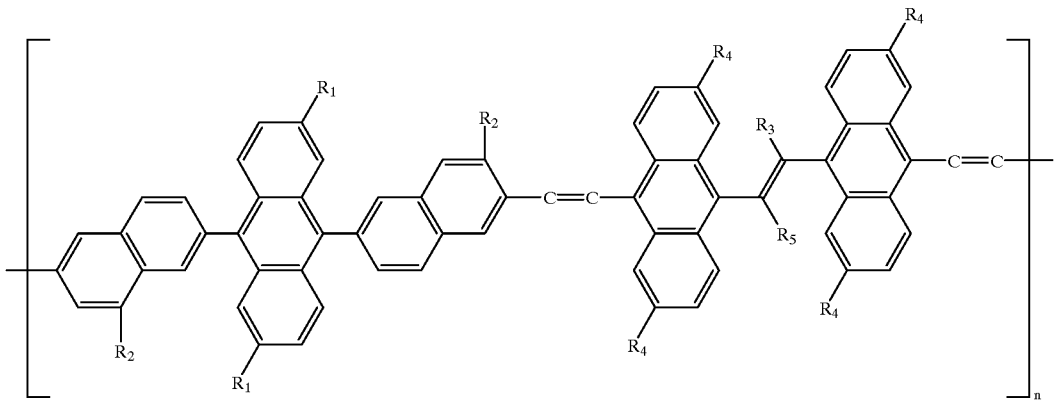

$R_1$=2-ethylhexyloxy, $R_2$=$R_3$=$R_4$=$R_5$=H
$R_1$=2-ethylhexyloxy, $R_2$=n-hexyl, $R_3$=$R_4$=$R_5$=H
$R_1$=t-butyl, $R_2$=n-hexyl, $R_3$=$R_5$=H, $R_4$=n-hexyloxy $R_1$=2-ethylhexyloxy, $R_2$=$R_4$=$R_5$=H, $R_3$=CN
$R_1$=2-ethylhexyloxy, $R_2$=n-hexyl, $R_3$=CN, $R_4$=$R_5$=H;
n is greater than 1;

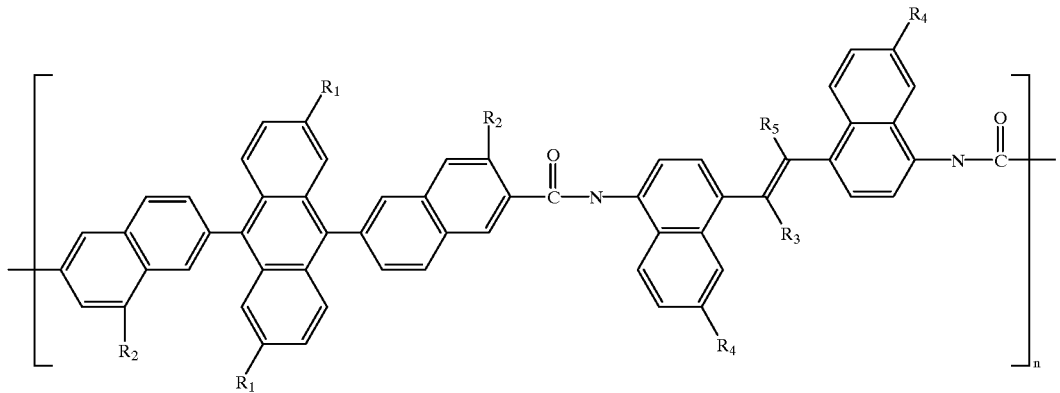

$R_1$=2-ethylhexyloxy, $R_2=R_3=R_4=R_5$=H
$R_1$=2-ethylhexyloxy, $R_2$=n-hexyl, $R_3=R_4=R_5$=H
$R_1$=t-butyl, $R_2$=n-hexyl, $R_3=R_5$=H, $R_4$=n-hexyloxy
$R_1$=2-ethylhexyloxy, $R_2=R_4=R_5$=H, $R_3$=CN
$R_1$=2-ethylhexyloxy, $R_2$=n-hexyl, $R_3$=CN, $R_4=R_5$=H;
n is greater than 1;

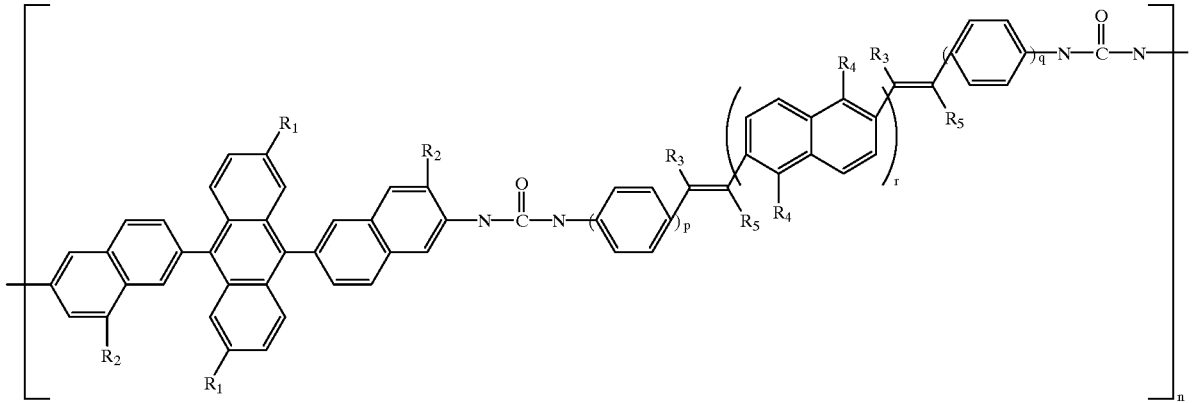

$R_1$=2-ethylhexyloxy, $R_2=R_3=R_4=R_5$=H, p=q=r=1
$R_1$=2-ethylhexyloxy, $R_2$=n-hexyl, $R_3=R_4=R_5$=H, p=q=r=1
$R_1$=t-butyl, $R_2$=n-hexyl, $R_3=R_5$=H, $R_4$=n-hexyloxy, p=q=2, r=1
$R_1$=2-ethylhexyloxy, $R_2=R_4=R_5$=H, $R_3$=CN, p=q=r=1
$R_1$=2-ethylhexyloxy, $R_2$=n-hexyl, $R_3$=CN, $R_4=R_5$=H, p=q=r=2;
n is greater than 1; or

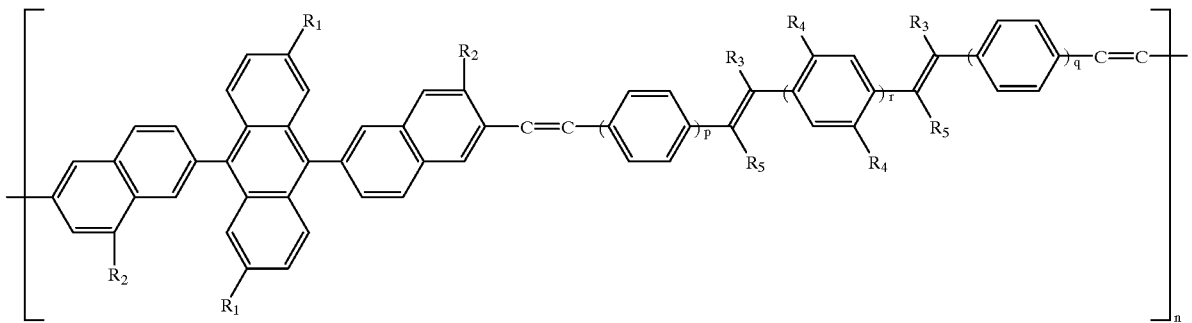

$R_1$=2-ethylhexyloxy, $R_2=R_3=R_4=R_5$=H, p=q=r=1
$R_1$=2-ethylhexyloxy, $R_2$=n-hexyl, $R_3=R_4=R_5$=H, p=q=r=1
$R_1$=t-butyl, $R_2$=n-hexyl, $R_3=R_5$=H, $R_4$=n-hexyloxy, p=q=2, r=1
$R_1$=2-ethylhexyloxy, $R_2=R_4=R_5$=H, $R_3$=CN, p=q=r=1
$R_1$=2-ethylhexyloxy, $R_2$=n-hexyl, $R_3$=CN, $R_4=R_5$=H, p=q=r=2
n is greater than 1.

12. An electroluminescent device comprises an anode, a cathode, and polymeric luminescent material disposed between the anode and cathode, the polymeric luminescent material including a 9,10-di-(2-naphthyl)anthracene-based polymer of the following formula:

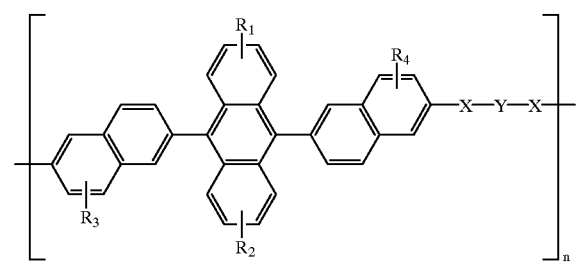

wherein:
  $R_1$, $R_2$, $R_3$, and $R_4$ are each individually hydrogen, or alkyl, or alkoxy of from 1 to 24 carbon atoms; aryl or substituted aryl of from 6 to 28 carbon atoms; or heteroaryl or substituted heteroaryl of from 4 to 40 carbons; or F, Cl, or Br; or a cyano group; or a nitro group.
  X is a linking group;
  n is greater than 1; and
  Y includes substituted or unsubstituted heteroaryl groups having from 4 to 40 carbon atoms and at least one or more of N, S, or O atoms.

13. An electroluminescent device comprises an anode, a cathode, and polymeric luminescent material disposed between the anode and cathode, the polymeric luminescent material including a 9,10-di-(2-naphthyl)anthracene-based polymer having one of the following formulas:

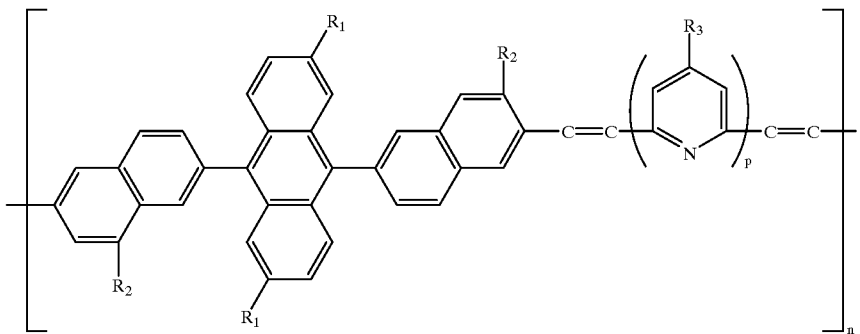

$R_1$=2-ethylhexyloxy, $R_2$=$R_3$=H, p=1
$R_1$=2-ethylhexyloxy, $R_2$=$R_3$=H, p=2
$R_1$=2-ethylhexyloxy, $R_2$=H, $R_3$=n-hexyl, p=1
$R_1$=t-butyl, $R_2$=n-hexyloxy, $R_3$=H, p=1
n is greater than 1;

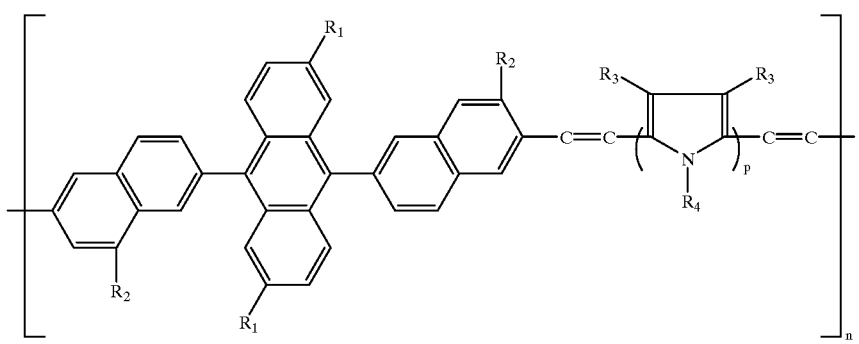

$R_1$=2-ethylhexyloxy, $R_2$=$R_3$=H, $R_4$=n-hexyl, p=1
$R_1$=t-butyl, $R_2$=n-hexyl, $R_3$=H, $R_4$=2-ethylhexyl, p=2
$R_1$=2-ethylhexyloxy, $R_2$=H, $R_3$=n-hexyl, $R_4$=2-ethylhexyl, p=2
$R_1$=2-ethylhexyloxy, $R_2$=$R_3$=n-hexyl, $R_4$=2-ethylhexyl, p=3
n is greater than 1;

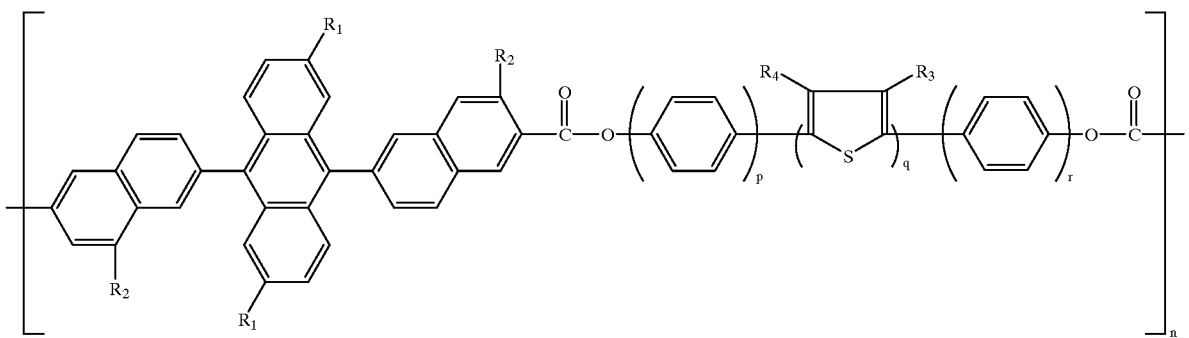

$R_1$=2-ethylhexyloxy, $R_2$=$R_3$=$R_4$=H, p=r=0, q=1
$R_1$=t-butyl, $R_2$=n-hexyl, $R_3$=$R_4$=2-ethylhexyl, p=r=1, q=2
$R_1$=$R_4$=2-ethylhexyloxy, $R_2$=$R_3$=H, p=r=q=1
$R_1$=$R_2$=2-ethylhexyloxy, $R_3$=$R_4$=H, p=r=1, q=2
$R_1$=t-butyl, $R_2$=$R_3$=2-ethylhexyloxy, $R_4$=H, p=r=1, q=2
n is greater than 1;

$R_1$=2-ethylhexyloxy, $R_2$=$R_3$=H
$R_1$=2-ethylhexyloxy, $R_2$=H, $R_3$=phenyl
$R_1$=t-butyl, $R_2$=$R_3$=n-hexyl
$R_1$=2-ethylhexyloxy, $R_2$=H, $R_3$=n-hexyloxy
$R_1$=2-ethylhexyloxy, $R_2$=n-hexyloxy, $R_3$=H
n is greater than 1;

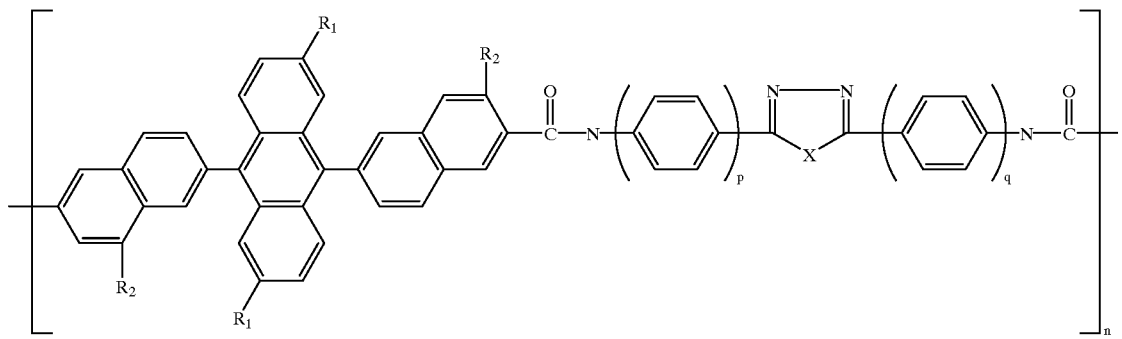

$R_1$=2-ethylhexyloxy, $R_2$=H, p=q=1, X=O
$R_1$=2-ethylhexyloxy, $R_2$=H, p=q=1, X=S
$R_1$=2-ethylhexyloxy, $R_2$=H, p=q=1, X=n-hexyl
$R_1$=2-ethylhexyloxy, $R_2$=n-hexyl, p=q=2, X=O
$R_1$=2-ethylhexyloxy, $R_2$=n-hexyl, p=q=2, X=S
$R_1$=2-ethylhexyloxy, $R_2$=n-hexyl, p=q=2, X=N-hexyl
n is greater than 1;

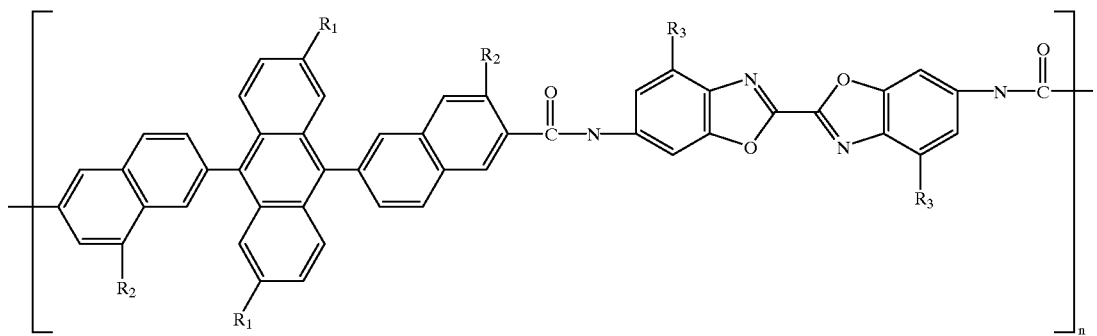

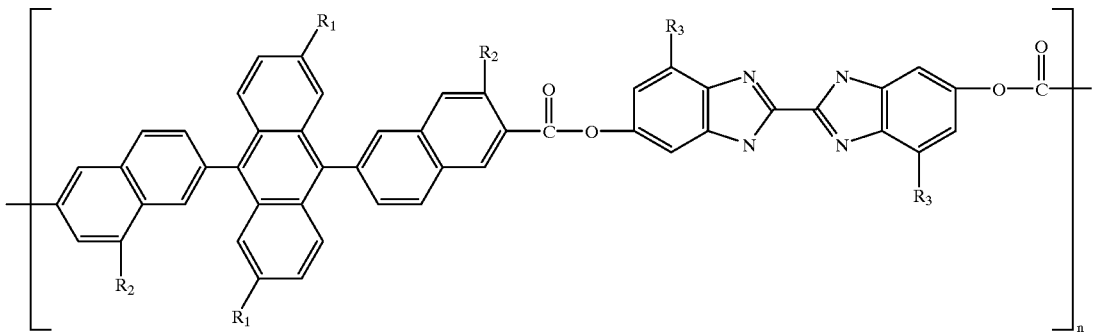

R₁=2-ethylhexyloxy, R₂=R₃=H
R₁=2-ethylhexyloxy, R₂=H, R₃=phenyl
R₁=t-butyl, R₂=R₃=n-hexyl
R₁=2-ethylhexyloxy, R₂=H, R₃=n-hexyloxy
R₁=2-ethylhexyloxy, R₂=n-hexyloxy, R₃=H
n is greater than 1;

R₁=2-ethylhexyloxy, R₂=R₃=H
R₁=2-ethylhexyloxy, R₂=H, R₃=phenyl
R₁=t-butyl, R₂=R₃=n-hexyl
R₁=2-ethylhexyloxy, R₂=H, R₃=n-hexyl
n is greater than 1; or

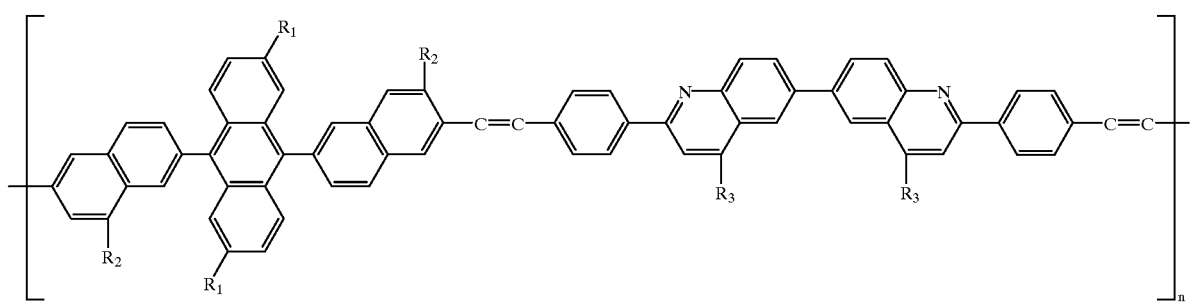

R₁=2-ethylhexyloxy, R₂=R₃=H
R₁=2-ethylhexyloxy, R₂=H, R₃=phenyl
R₁=t-butyl, R₂=R₃=n-hexyl
R₁=2-ethylhexyloxy, R₂=H, R₃=n-hexyl
n is greater than 1;

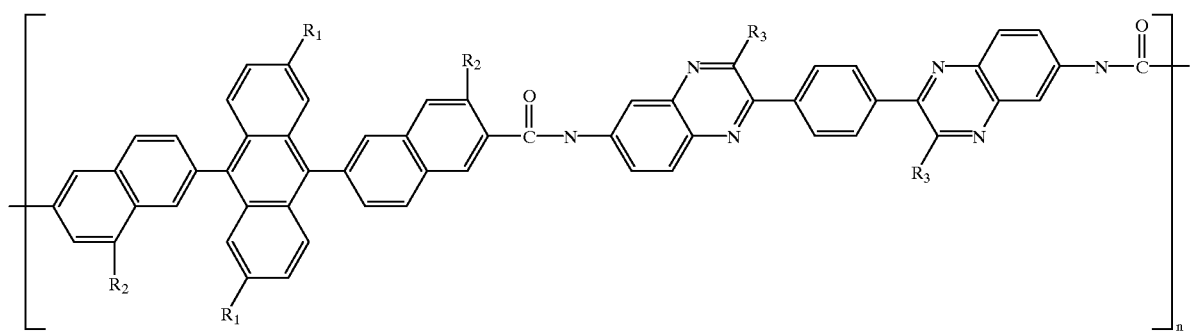

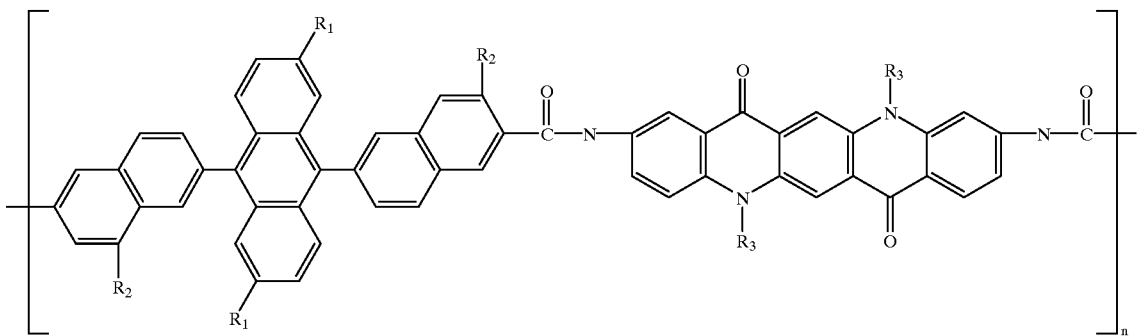

$R_1$=2-ethylhexyloxy, $R_2$=H, $R_3$=methyl
$R_1$=2-ethylhexyloxy, $R_2$=H, $R_3$=phenyl
$R_1$=t-butyl, $R_2$=$R_3$=n-hexyl
$R_1$=2-ethylhexyloxy, $R_2$=H, $R_3$=n-hexyl
n is greater than 1.

14. An electroluminescent device comprises an anode, a cathode, and polymeric luminescent material disposed between the anode and cathode, the polymeric luminescent material including a 9,10-di-(2-naphthyl)anthracene-based polymer of the following formula:

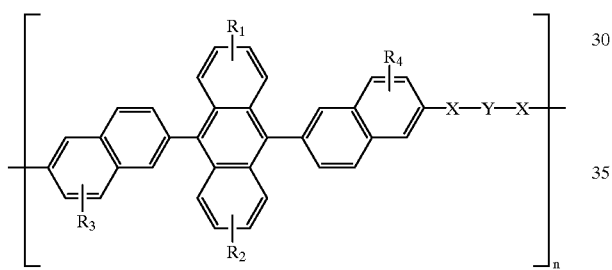

wherein:

$R_1$, $R_2$, $R_3$, and $R_4$ are each individually hydrogen, alkyl or alkoxy of from 1 to 24 carbon atoms; aryl or substituted aryl of from 6 to 28 carbon atoms; heteroaryl or substituted heteroaryl of from 4 to 40 carbons; F, Cl, or Br; a cyano group; or a nitro group.

X includes a linking group of one or more carbon-carbon, ether, thioether, ester anhydride, carbonate, sulfonyl, sulfinyl, amine, amide, or urea linkages;

n is greater than 1; and

Y includes one or more comonomer units that are a substituted or unsubstituted alkyl, aryl, heteroaryl, or a conjugated group.

15. The electroluminescent device of claim 14, wherein the linking group is a carbon-carbon linking group which comprises:

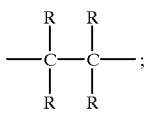

or

wherein R is hydrogen, or alkyl group containing 1 to 24 carbon atoms; aryl or substituted aryl of containing 6 to 28 carbon atoms; or heteroaryl or substituted heteroaryl containing 4 to 40 carbons; or F, Cl, or Br; or a cyano group.

16. The electroluminescent device of claim 14, wherein the linking groups is an ester linking group which comprises:

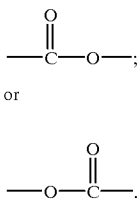

17. The electroluminescent device of claim 14, wherein the linking group is an anhydride linking group which comprises:

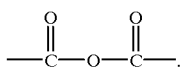

18. The electroluminescent device of claim 14, wherein the linking group is a carbonate linking group which comprises:

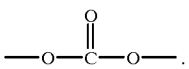

19. The electroluminescent device of claim 14, wherein the linking group is a sulfonyl or sulfinyl linking group which comprises:

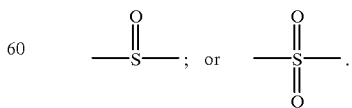

20. The electroluminescent device of claim 14, wherein the linking group is an amine linking group which comprises:

wherein R is hydrogen, or alkyl group containing 1 to 24 carbon atoms; aryl or substituted aryl of containing 6 to 28 carbon atoms; or heteroaryl or substituted heteroaryl containing 4 to 40 carbons.

21. The electroluminescent device of claim 14, wherein the linking group is an amide linking group which comprises:

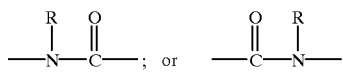

wherein R is hydrogen, or alkyl group containing 1 to 24 carbon atoms; aryl or substituted aryl of containing 6 to 28 carbon atoms; or heteroaryl or substituted heteroaryl containing 4 to 40 carbons.

22. The electroluminescent device of claim 14, wherein the linking group is a urea linking group which comprises:

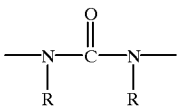

wherein R is hydrogen, or alkyl group containing 1 to 24 carbon atoms; aryl or substituted aryl of containing 6 to 28 carbon atoms; or heteroaryl or substituted heteroaryl containing 4 to 40 carbons.

23. The electroluminescent device of claim 14, wherein the linking group is an aryl linking group which comprises:

wherein Ar is an aryl or substituted aryl group of containing 6 to 28 carbon atoms; or heteroaryl or substituted heteroaryl containing 4 to 40 carbons; n is an integer of from 1 to 6.

* * * * *

UNITED STATES PATENT AND TRADEMARK OFFICE
CERTIFICATE OF CORRECTION

PATENT NO. : ,6,361,887 B1  
DATED : March 26, 2002  
INVENTOR(S) : Jianmin Shi et al.

Page 1 of 1

It is certified that error appears in the above-identified patent and that said Letters Patent is hereby corrected as shown below:

<u>Column 87, lines 55-67 through Column 88, lines 18-22,</u>
Should read as follows:
-- 15. The electroluminescent device of claim 14 wherein the linking group is a carbon-carbon linking group which comprises:

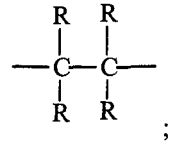

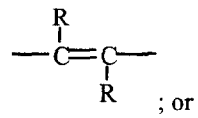
; or

wherein R is hydrogen, or alkyl group containing 1 to 24 carbon atoms; aryl or substituted aryl of containing 6 to 28 carbon atoms; or heteroaryl or substituted heteroaryl containing 4 to 40 carbons; or F, Cl, or Br; or a cyano group. --

Signed and Sealed this

First Day of October, 2002

*Attest:*

*Attesting Officer*

JAMES E. ROGAN
*Director of the United States Patent and Trademark Office*